(12) United States Patent
Kubota et al.

(10) Patent No.: US 10,078,243 B2
(45) Date of Patent: Sep. 18, 2018

(54) DISPLAY DEVICE

(71) Applicant: SEMICONDUCTOR ENERGY LABORATORY CO., LTD., Atsugi-shi, Kanagawa-ken (JP)

(72) Inventors: Daisuke Kubota, Kanagawa (JP); Masaru Nakano, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/605,396

(22) Filed: May 25, 2017

(65) Prior Publication Data
US 2017/0351141 A1 Dec. 7, 2017

(30) Foreign Application Priority Data

Jun. 3, 2016 (JP) .................................. 2016-111555
Sep. 30, 2016 (JP) .................................. 2016-193718

(51) Int. Cl.
*G02F 1/1339* (2006.01)
*G02F 1/1343* (2006.01)
(Continued)

(52) U.S. Cl.
CPC ...... *G02F 1/133553* (2013.01); *G02F 1/1334* (2013.01); *G02F 1/1368* (2013.01);
(Continued)

(58) Field of Classification Search
CPC ....... G02F 2001/13398; G02F 1/13394; G02F 1/13439; G02F 1/1333; G02F 1/133377;
(Continued)

(56) References Cited

U.S. PATENT DOCUMENTS 5,838,414 A * 11/1998 Lee ..................... G02F 1/13394
349/156
6,714,268 B2  3/2004 Wang et al.
(Continued)

FOREIGN PATENT DOCUMENTS

JP  2001-066593 A  3/2001
JP  2002-196702 A  7/2002
(Continued)

OTHER PUBLICATIONS

Shieh.H, "Trarisflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Jia Pan
(74) *Attorney, Agent, or Firm* — Nixon Peabody LLP; Jeffrey L. Costellia

(57) ABSTRACT

A display device that is suitable for high definition and a method for manufacturing thereof are provided. The display device includes a reflective liquid crystal element. A liquid crystal layer has a first portion overlapping with a reflective electrode that reflects visible light and blocks ultraviolet light, and a second portion overlapping with a region between two adjacent reflective electrodes. The first portion contains a monomer and liquid crystal and the second portion contains a polymer obtained by polymerization of the monomer. In the second portion, the polymer constitutes the framework of a columnar partition wall which bonds a pair of substrates to each other. The partition wall can be formed in a self-aligned manner by using the reflective electrode as a light-blocking mask at the irradiation with light. The polymer is positioned to fit a depression portion of an insulating layer over which the reflective electrode is provided.

14 Claims, 39 Drawing Sheets

(51) Int. Cl.
*G02F 1/1333* (2006.01)
*G02F 1/1334* (2006.01)
*G02F 1/1335* (2006.01)
*G02F 1/1337* (2006.01)
*G02F 1/1368* (2006.01)
*H01L 27/12* (2006.01)

(52) U.S. Cl.
CPC .... *G02F 1/13338* (2013.01); *G02F 1/133305* (2013.01); *G02F 1/133512* (2013.01); *G02F 1/133711* (2013.01); *G02F 1/133788* (2013.01); *G02F 1/134309* (2013.01); *H01L 27/124* (2013.01); *G02F 1/13394* (2013.01); *G02F 2001/13398* (2013.01); *G02F 2001/133715* (2013.01); *G02F 2001/133792* (2013.01)

(58) Field of Classification Search
CPC ............. G02F 1/1334; G02F 1/133553; G02F 1/13345; G02F 1/133512
See application file for complete search history.

(56) References Cited

U.S. PATENT DOCUMENTS

| | | | |
|---|---|---|---|
| 7,038,641 B2 | 5/2006 | Hirota et al. | |
| 7,084,936 B2 | 8/2006 | Kato | |
| 7,102,704 B2 | 9/2006 | Mitsui et al. | |
| 7,176,991 B2 | 2/2007 | Mitsui et al. | |
| 7,239,361 B2 | 7/2007 | Kato | |
| 7,248,235 B2 | 7/2007 | Fujii et al. | |
| 7,385,654 B2 | 6/2008 | Mitsui et al. | |
| 7,435,516 B2 | 10/2008 | Sheen et al. | |
| 7,674,650 B2 | 3/2010 | Akimoto et al. | |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,466,463 B2 | 6/2013 | Akimoto et al. | |
| 8,629,069 B2 | 1/2014 | Akimoto et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 9,099,562 B2 | 8/2015 | Akimoto et al. | |
| 2003/0201960 A1 | 10/2003 | Fujieda | |
| 2006/0072047 A1 | 4/2006 | Sekiguchi | |
| 2007/0109465 A1* | 5/2007 | Jung | G02F 1/133603 349/71 |
| 2008/0180618 A1 | 7/2008 | Fujieda | |
| 2010/0171905 A1 | 7/2010 | Huang et al. | |
| 2012/0075563 A1* | 3/2012 | Takeda | G02F 1/133377 349/139 |
| 2012/0327347 A1* | 12/2012 | Cho | G02F 1/1339 349/138 |
| 2015/0340513 A1 | 11/2015 | Akimoto et al. | |
| 2016/0042696 A1 | 2/2016 | Hirakata et al. | |
| 2016/0042702 A1 | 2/2016 | Hirakata et al. | |
| 2016/0283028 A1 | 9/2016 | Yamazaki et al. | |
| 2016/0291406 A1* | 10/2016 | Zuo | G02F 1/133345 |
| 2016/0299387 A1 | 10/2016 | Yamazaki et al. | |
| 2016/0313769 A1 | 10/2016 | Yoshitani et al. | |
| 2016/0341992 A1* | 11/2016 | Lee | G02F 1/133305 |
| 2017/0082887 A1 | 3/2017 | Kubota et al. | |

FOREIGN PATENT DOCUMENTS

| | | |
|---|---|---|
| JP | 2004-296162 A | 10/2004 |
| JP | 2007-096055 A | 4/2007 |
| JP | 2007-123861 A | 5/2007 |
| JP | 2007-232882 A | 9/2007 |
| JP | 2012-113215 A | 6/2012 |
| JP | 2013-037093 A | 2/2013 |
| JP | 2013-221965 A | 10/2013 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.

* cited by examiner

FIG. 4A
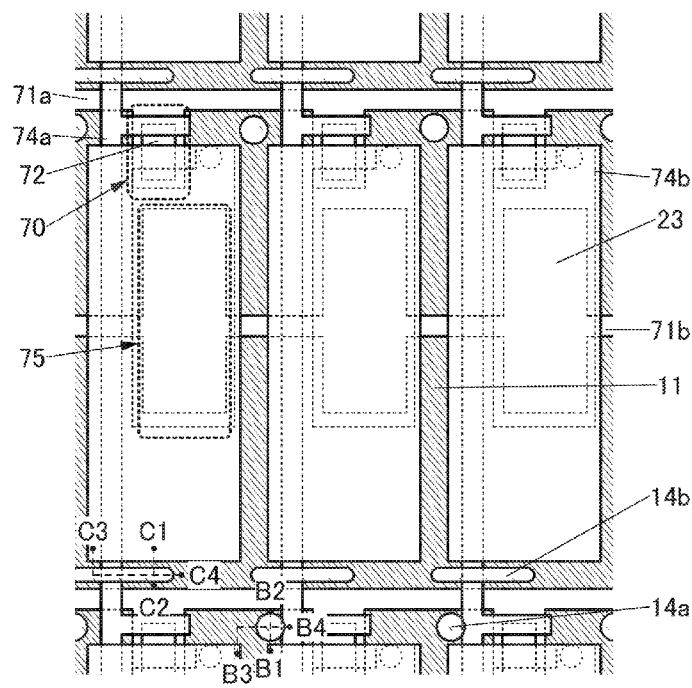
FIG. 4B1
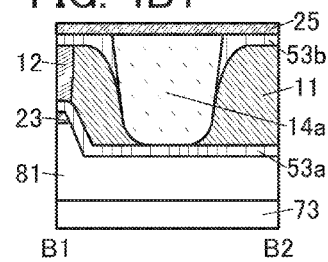
FIG. 4B2
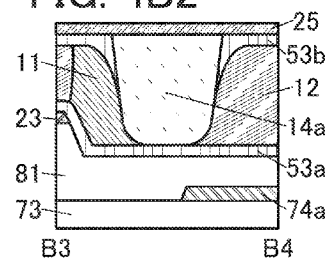
FIG. 4C1
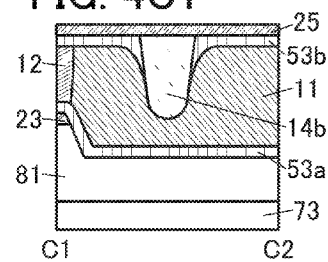
FIG. 4C2
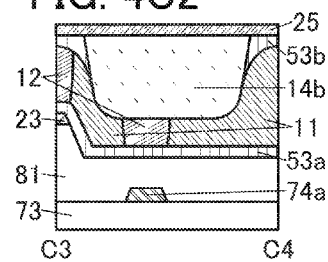

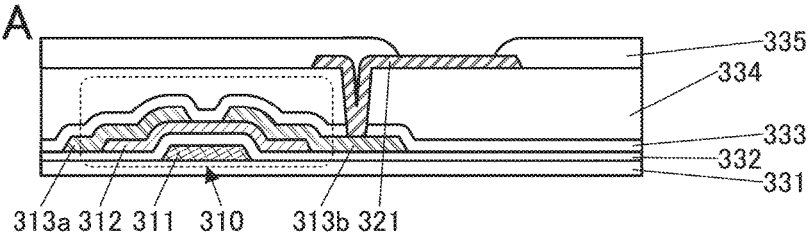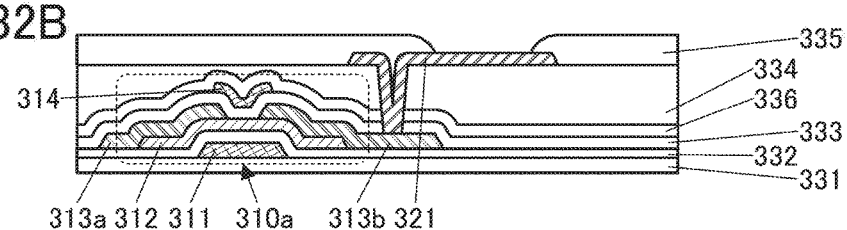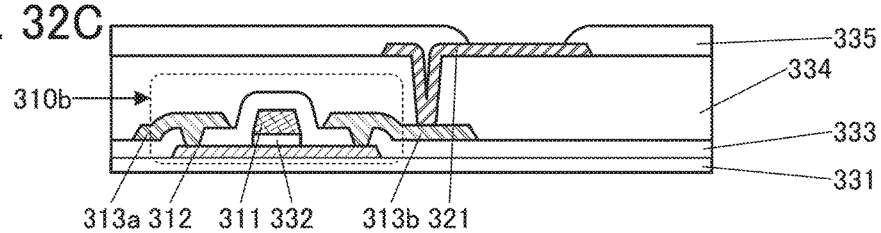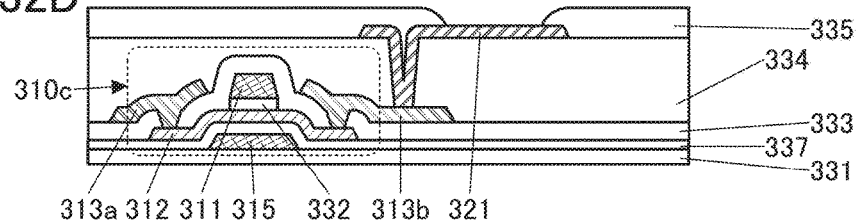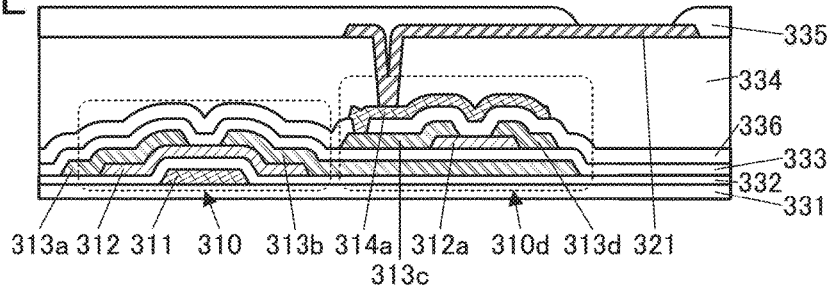

FIG. 33A
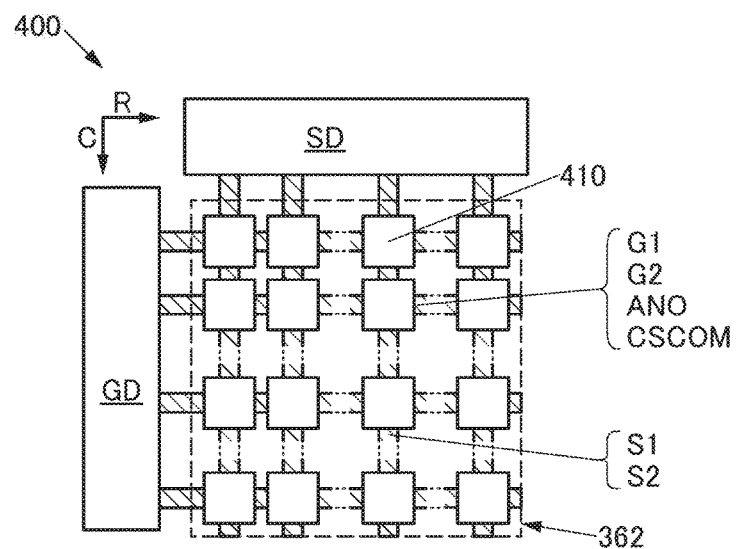
FIG. 33B1
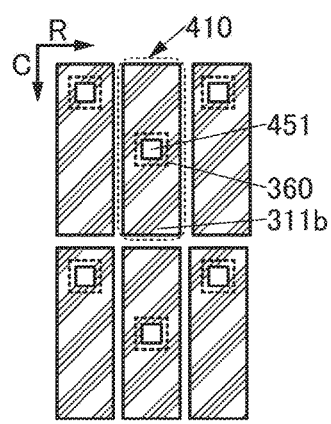
FIG. 33B2
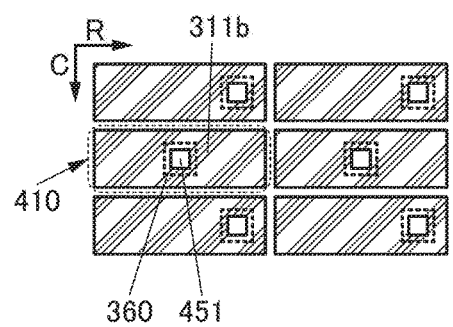

FIG. 38A
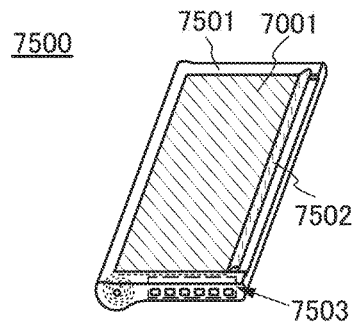
FIG. 38B
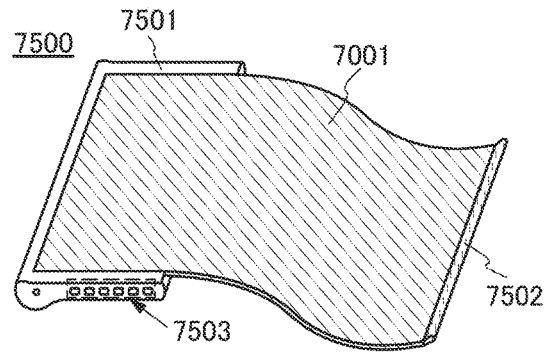
FIG. 38C
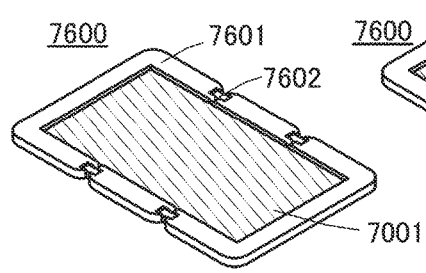
FIG. 38D
FIG. 38E
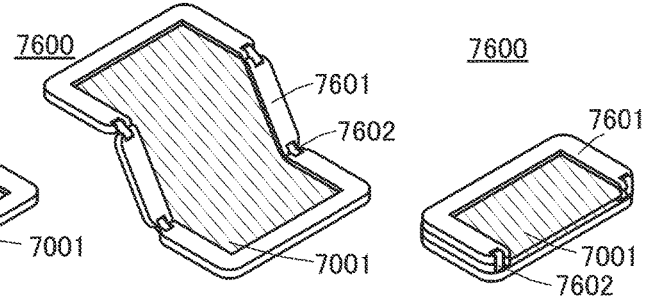
FIG. 38F
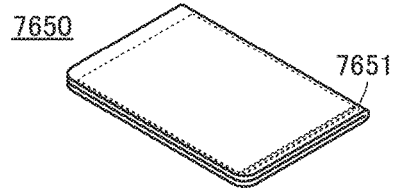
FIG. 38G
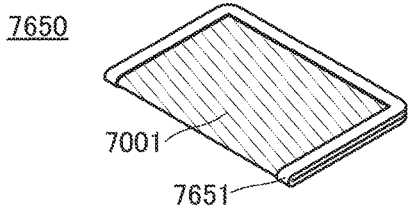
FIG. 38H
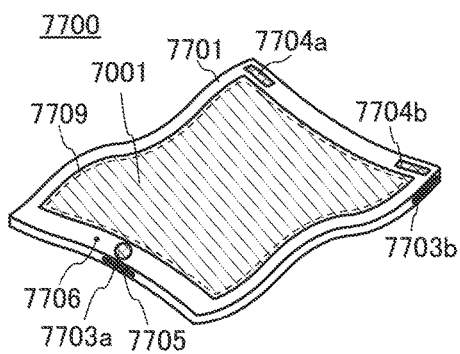
FIG. 38I
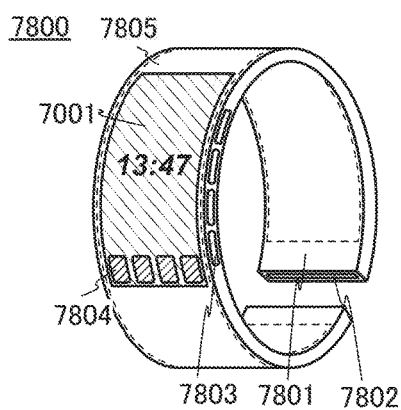

DISPLAY DEVICE

BACKGROUND OF THE INVENTION

1. Field of the Invention

One embodiment of the present invention relates to a display device. One embodiment of the present invention relates to a method for manufacturing a display device. In particular, one embodiment of the present invention relates to a display device including a liquid crystal element and a method for manufacturing the display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each one embodiment of a semiconductor device. An imaging device, an electro-optical device, a power generation device (including a thin film solar cell, an organic thin film solar cell, and the like), and an electronic device may each include a semiconductor device.

2. Description of the Related Art

As one of display devices, there is a liquid crystal display device provided with a liquid crystal element. For example, an active matrix liquid crystal display device, in which pixel electrodes are arranged in a matrix and transistors are used as switching elements connected to respective pixel electrodes, has attracted attention.

For example, an active matrix liquid crystal display device including transistors, in which a metal oxide is used for a channel formation region, as switching elements connected to respective pixel electrodes is already known (Patent Documents 1 and 2).

It is known that an active matrix liquid crystal display device is classified into two major types: transmissive type and reflective type.

In a transmissive liquid crystal display device, a backlight such as a cold cathode fluorescent lamp or a light-emitting diode (LED) is used, and optical modulation action of liquid crystal is utilized to select one of the two states: a state where light from the backlight passes through liquid crystal to be output to the outside of the liquid crystal display device and a state where light is not output to the outside of the liquid crystal display device, whereby a bright or dark image is displayed. Furthermore, those images are combined to display an image.

In a reflective liquid crystal display device, optical modulation action of liquid crystal is utilized to select one of the two states: a state where external light, that is, incident light is reflected on a pixel electrode to be output to the outside of the device and a state where incident light is not output to the outside of the device, whereby a bright or dark image is displayed. Furthermore, those displays are combined to display an image. Compared with the transmissive liquid crystal display device, the reflective liquid crystal display device has the advantage of low power consumption since the backlight is not used.

REFERENCE

Patent Documents

[Patent Document 1] Japanese Published Patent Application No. 2007-123861
[Patent Document 2] Japanese Published Patent Application No. 2007-096055

SUMMARY OF THE INVENTION

A display device is required to display clearer images, and accordingly, a high-definition display device is required.

In addition, in particular, a display device incorporated in a mobile phone, a smartphone, a tablet terminal, a smart watch, and the like, which are portable, is required to be reduced in thickness, be lightweight, operate with low power consumption, and the like.

An object of one embodiment of the present invention is to provide a display device that is suitable for high definition and a method for manufacturing the display device. Another object is to provide a display device that can operate with low power consumption. Another object is to provide a thin display device. Another object of one embodiment of the present invention is to provide a lightweight display device.

Another object of one embodiment of the present invention is to improve the display quality of a display device. Another object of one embodiment of the present invention is to display a high-quality video regardless of a usage environment.

Note that the descriptions of these objects do not disturb the existence of other objects. In one embodiment of the present invention, there is no need to achieve all the objects. Other objects can be derived from the description of the specification and the like.

One embodiment of the present invention is a display device including a first electrode, a liquid crystal layer, a light-blocking layer, and an insulating layer. The first electrode has a function of reflecting visible light and blocking ultraviolet light, and is over the insulating layer. The liquid crystal layer includes a first portion overlapping with the first electrode and a second portion surrounding part of the first portion. The second portion overlaps with the light-blocking layer. The first portion includes a monomer and liquid crystal and the second portion includes a polymer obtained by polymerization of the monomer.

One embodiment of the present invention is a display device including a first electrode, a second electrode, a liquid crystal layer, a light-blocking layer, and an insulating layer. The first electrode and the second electrode each have a function of reflecting visible light and blocking ultraviolet light. The first electrode and the second electrode are apart from each other and provided over the insulating layer. The insulating layer includes a depression portion and each of the first electrode and the second electrode is provided in a position not overlapping with the depression portion. The light-blocking layer includes a portion overlapping with a region between the first electrode and the second electrode and the depression portion. The liquid crystal layer includes a first portion and a second portion. The first portion overlaps with the first electrode. The second portion overlaps with the region between the first electrode and the second electrode, the depression portion, and the light-blocking layer. The first portion includes a monomer and liquid crystal and the second portion includes a polymer obtained by polymerization of the monomer.

In addition, the display device preferably includes a structure body that has an insulating property and is in contact with the polymer. The structure body preferably includes a portion overlapping with the light-blocking layer and the depression portion.

In addition, the display device preferably includes a third electrode overlapping with the first electrode with the liquid crystal layer located between the third electrode and the first electrode. The third electrode preferably has a function of transmitting visible light. In addition, the display device preferably includes a first alignment film covering the first electrode and a second alignment film covering the third electrode. The second portion of the liquid crystal layer is preferably provided in contact with the first alignment film and the second alignment film. Moreover, the structure body is preferably provided in contact with the first alignment film and/or the second alignment film.

In the above embodiment, the display device preferably includes a first substrate and a second substrate. In this case, it is preferable that the first electrode and the second electrode be positioned between the first substrate and the liquid crystal layer and the light-blocking layer be positioned between the second substrate and the liquid crystal layer. Moreover, the first substrate and the second substrate each preferably have flexibility.

In the above embodiment, the display device preferably includes a light-emitting element. In this case, the insulating layer is preferably positioned between the light-emitting element and the liquid crystal element, the light-emitting element preferably has a structure in which a fourth electrode transmitting visible light, a layer containing a light-emitting substance, and a fifth electrode are stacked from the insulating layer side, and the light-emitting element preferably has a function of emitting light to the insulating layer side. Here, a conductive film which is electrically connected to the first electrode and transmits visible light is preferably included.

In the above embodiment, the display device preferably includes a first transistor electrically connected to the first electrode and a second transistor electrically connected to the fourth electrode. Here, the first transistor and the second transistor are preferably provided on the same plane or different planes.

Another embodiment of the present invention is a method for manufacturing a display device, including the following steps: a first step of forming an insulating layer over a first substrate and forming over the insulating layer a first electrode and a second electrode each having a function of reflecting visible light and blocking ultraviolet light so as to be apart from each other; a second step of etching part of a portion of the insulating layer that does not overlap with the first electrode and the second electrode and forming a depression portion; a third step of forming a light-blocking layer over a second substrate; a fourth step of attaching the first substrate to the second substrate with a liquid crystal layer, which contains liquid crystal, a monomer, and a polymerization initiator, located between the first substrate and the second substrate; and a fifth step of emitting light from the first substrate side to polymerize the monomer in the liquid crystal layer in a region where the light is not blocked by the first electrode and the second electrode.

Another embodiment of the present invention is a method for manufacturing a display device, including the following steps: a first step of forming a first insulating layer over a first support substrate; a second step of forming over the first insulating layer a first electrode and a second electrode each having a function of reflecting visible light and blocking ultraviolet light so as to be apart from each other; a third step of etching part of a portion of the first insulating layer that does not overlap with the first electrode and the second electrode and forming a depression portion; a fourth step of forming a second insulating layer over a second support substrate; a fifth step of forming a light-blocking layer over the second insulating layer; a sixth step of attaching the first support substrate to the second support substrate with a liquid crystal layer, which contains liquid crystal, a monomer, and a polymerization initiator, located between the first support substrate and the second support substrate; a seventh step of emitting light from the first support substrate side to polymerize the monomer in the liquid crystal layer in a region where the light is not blocked by the first electrode and the second electrode; an eighth step of performing separation between the first support substrate and the first insulating layer and attaching a third substrate to the first insulating layer with a first adhesive layer located between the first insulating layer and the third substrate; and a ninth step of performing separation between the second support substrate and the second insulating layer and attaching a fourth substrate to the second insulating layer with a second adhesive layer located between the second insulating layer and the fourth substrate.

Another embodiment of the present invention is a method for manufacturing a display device, including the following steps: a first step of forming a first electrode and a second electrode each having a function of reflecting visible light and blocking ultraviolet light and a third insulating layer covering the first electrode and the second electrode over a third support substrate; a second step of forming an opening reaching the first electrode in the third insulating layer; a third step of forming a first conductive layer electrically connected to the first electrode and a fourth electrode transmitting visible light over the third insulating layer; a fourth step of forming a stack of a layer containing a light-emitting substance and a fifth electrode over the fourth electrode; a fifth step of attaching a first substrate to the fifth electrode to cover the fifth electrode with a third adhesive layer located between the fifth electrode and the first substrate; a sixth step of performing separation between the third support substrate and the fourth insulating layer to expose part of the first electrode and the second electrode; a seventh step of etching part of a portion of the fourth insulating layer that does not overlap with the first electrode and the second electrode and forming a depression portion; an eighth step of forming a light-blocking layer over a second substrate; a ninth step of attaching the first substrate to the second substrate with a liquid crystal layer, which contains liquid crystal, a monomer, and a polymerization initiator, located between the first substrate and the second substrate; and a tenth step of emitting light from the first substrate side to polymerize the monomer in the liquid crystal layer in a region where the light is not blocked by the first electrode and the second electrode.

Another embodiment of the present invention is a method for manufacturing a display device, including the following steps: a first step of forming a fourth electrode transmitting visible light and a fifth insulating layer covering the fourth electrode over a fourth support substrate; a second step of forming an opening reaching the fourth electrode in the fifth insulating layer; a third step of forming over the fifth insulating layer a second conductive layer electrically connected to the fourth electrode, and a first electrode and a second electrode each having a function of reflecting visible light and blocking ultraviolet light; a fourth step of etching part of a portion of the fifth insulating layer that does not overlap with the first electrode and the second electrode and forming a depression portion; a fifth step of forming a light-blocking layer over a second substrate; a sixth step of attaching the fourth support substrate to the second substrate with a liquid crystal layer, which contains liquid crystal, a monomer, and a polymerization initiator, located between the fourth support substrate and the second substrate; a seventh step of emitting light from the fourth support substrate side to polymerize the monomer in the liquid crystal layer in a region where the light is not blocked by the first electrode and the second electrode; an eighth step of performing separation between the fourth support substrate and the fifth insulating layer to expose part of the fourth electrode; and a ninth step of forming a layer containing a light-emitting substance and a fifth electrode in this order to cover the fourth electrode.

Another embodiment of the present invention is a method for manufacturing a display device, including the following steps: a first step of forming over a fifth support substrate a first electrode and a second electrode each having a function of reflecting visible light and blocking ultraviolet light and a sixth insulating layer covering the first electrode and the second electrode; a second step of performing separation between the fifth support substrate and the sixth insulating layer to expose part of the first electrode and the second electrode; a third step of etching part of a portion of the sixth insulating layer that does not overlap with the first electrode and the second electrode and forming a depression portion; a fourth step of forming a light-blocking layer over a second substrate; a fifth step of attaching the sixth insulating layer to the second substrate with a liquid crystal layer, which contains liquid crystal, a monomer, and a polymerization initiator, located between the sixth insulating layer and the second substrate; a sixth step of emitting light from the sixth insulating layer side to polymerize the monomer in the liquid crystal layer in a region where the light is not blocked by the first electrode and the second electrode; a seventh step of stacking a fourth electrode, a layer containing a light-emitting material, and a fifth electrode over the first substrate; and an eighth step of attaching the second substrate to the first substrate with a fourth adhesive layer located between the second substrate and the first substrate.

According to one embodiment of the present invention, a display device that is suitable for high definition and a method for manufacturing the display device can be provided. In addition, a display device that can operate with low power consumption can be provided. In addition, a thin display device can be provided. In addition, a lightweight display device can be provided.

Note that one embodiment of the present invention does not necessarily achieve all the effects listed above. Other effects can be derived from the description of the specification, the drawings, the claims, and the like.

BRIEF DESCRIPTION OF THE DRAWINGS

In the accompanying drawings:

FIGS. 4A, 4B1, 4B2, 4C1, and 4C2 illustrate a structural example of a display device of one embodiment;

FIGS. 32A to 32E illustrate structural examples of a transistor of one embodiment;

FIGS. 33A, 33B1, and 33B2 illustrate structural examples of a display device of one embodiment;

FIGS. 38A to 38I illustrate examples of electronic devices of one embodiment.

DETAILED DESCRIPTION OF THE INVENTION

Figure 1A:
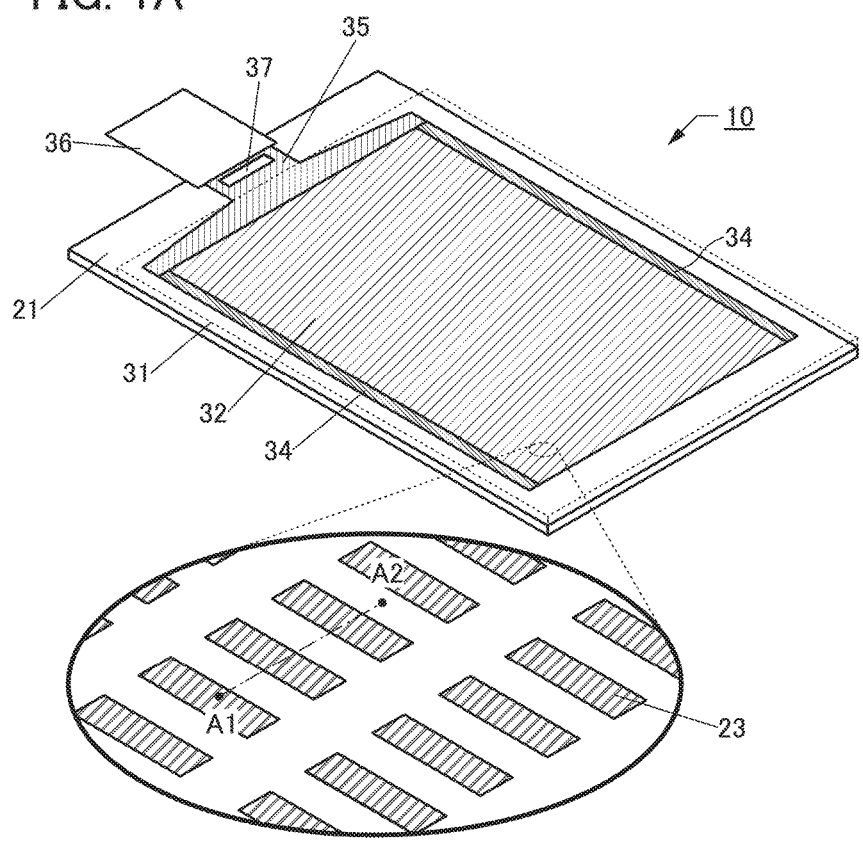
FIGS. 1A and 1B illustrate a structural example of a display device of one embodiment.

Embodiments will be described in detail with reference to the drawings. Note that the present invention is not limited to the description below, and it is easily understood by those skilled in the art that various changes and modifications can be made without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Further, the same hatching pattern is used for portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first" and "second" are used in order to avoid confusion among components and do not limit the number.

A transistor is a kind of semiconductor elements and can achieve amplification of current and voltage, switching operation for controlling conduction and non-conduction, and the like. A transistor in this specification includes an insulated-gate field effect transistor (IGFET) and a thin film transistor (TFT).

(Embodiment 1)

In this embodiment, structural examples of a display device of one embodiment of the present invention and methods for manufacturing the display device will be described.

The display device of one embodiment of the present invention includes a plurality of reflective liquid crystal elements. The liquid crystal element includes a pair of electrodes and a liquid crystal layer. For at least one of the pair of electrodes, a material which reflects visible light and blocks (reflects or absorbs) ultraviolet light can be used. The liquid crystal layer can be provided between a pair of substrates.

The liquid crystal layer has a first portion overlapping with the above-described electrode (hereinafter referred to as a reflective electrode in some cases), which reflects visible light and blocks ultraviolet light, and a second portion overlapping with a region between two adjacent reflective electrodes. The first portion contains monomers and liquid crystal and the second portion contains a polymer obtained by polymerization of the monomers. In the second portion, the polymer constitutes the main portion of a columnar partition wall which bonds the pair of substrates to each other. In addition, the second portion is preferably placed to overlap with a light-blocking layer which is provided to prevent color mixture between adjacent pixels. In the second portion, liquid crystal may be contained or the columnar partition wall may contain a polymer and liquid crystal.

The columnar partition wall containing a polymer, which is provided in the second portion of the liquid crystal layer, is placed between two adjacent liquid crystal elements and has a function of separating liquid crystal layers of the two liquid crystal elements. Thus, the columnar partition wall containing a polymer can also be referred to as a polymer wall. In the first portion of one liquid crystal element, liquid crystal surrounded by the partition wall and the pair of substrates can be contained. With the partition wall, the influence of the alignment state of the liquid crystal contained in the adjacent liquid crystal element is weakened; thus, a display device with the improved contrast and the like which can display a clearer image can be fabricated. Note that the liquid crystal of one liquid crystal element is not necessarily separated from the liquid crystal contained in the adjacent liquid crystal element completely, and at least one partition wall is provided between two adjacent liquid crystal elements.

When the display device of one embodiment of the present invention is fabricated, for the liquid crystal layer provided between the pair of substrates, a material containing liquid crystal, monomers, and a polymerization initiator is used. In addition, the reflective electrode is used as a light-blocking mask and a part of the liquid crystal layer is irradiated with light, whereby in a region of the liquid crystal layer not overlapping with the reflective electrode, the monomers are polymerized to become a polymer. In this manner, the partition wall containing a polymer positioned between adjacent reflective electrodes can be formed in a self-aligned manner without the light-blocking mask and the like.

In the display device of one embodiment of the present invention, the partition wall containing a polymer which bonds the pair of substrates to each other can be placed between adjacent pixels; thus, adhesion strength between the substrates is extremely high. In addition, the partition wall can serve as a gap spacer for keeping a distance between the pair of substrates. Thus, when external force is added (e.g., the display surface is pushed or the display device is folded), the display device is oscillated, and the like, the cell gap of the liquid crystal element is hardly changed; as a result, an interference fringe, a change in color, and the like due to the change of the cell gap hardly occurs.

By using the above-described method, a polymer can be formed in a self-aligned manner in a region in which light is not blocked by the reflective electrode, that is, a region which does not influence display using a reflective liquid crystal element. Thus, as compared with the case where a polymer is formed using a light-blocking mask and the like, partition walls with a small diameter can be arranged with high density. As a result, an extremely high-definition display device can be fabricated. For example, the method can be used for an extremely high-definition display device in which the resolution of the display portion is higher than or equal to 300 ppi, higher than or equal to 500 ppi, higher than or equal to 800 ppi, or higher than or equal to 1000 ppi and lower than or equal to 3000 ppi.

The reflective electrode is provided over an insulating layer. Here, a depression portion is preferably formed in the insulating layer in a region overlapping with a region between two adjacent reflective electrodes. That is, in a region not overlapping with the reflective electrode, the insulating layer includes a region whose top surface is lower than that of a region overlapping with the reflective electrode. It can also be said that the insulating layer includes a region whose top surface is closer to a substrate surface than that of the other region, for example.

Here, the above columnar partition wall is preferably provided in a position overlapping with the depression portion of the insulating layer. For example, the columnar partition wall is preferably provided so as to fit the depression portion of the insulating layer. Accordingly, the adhesion area of the columnar partition wall on the insulating layer side is increased, whereby the adhesion strength between the substrates can be enhanced.

On the first substrate side or the second substrate side, a projected structure body is preferably provided in contact with the columnar partition wall. The projected structure body can serve as a gap spacer for keeping a distance between the pair of substrates, for example. The columnar partition wall is provided in contact with the projected structure body, so that the adhesion area of the columnar partition wall is increased; thus, adhesion strength can be further increased by an anchor effect. In particular, when the projected structure body is positioned inside the columnar partition wall, the adhesion strength between the substrates can be increased more effectively.

In the case where the insulating layer includes the depression portion, the projected structure body is preferably provided in a position overlapping with the depression portion. When the columnar partition wall is provided in a region where both the depression portion of the insulating layer and the projected structure body are provided, a higher anchor effect is obtained, whereby the adhesion strength between the substrates can be more increased.

Another embodiment of the present invention is preferably a display device (display panel) that includes both a reflective display element and a light-emitting element and can display an image in a light-emission mode, in a reflective mode, and in a hybrid mode. Such a display panel can also be referred to as an emission and reflection hybrid display (emission/reflection hybrid display or ER-hybrid display).

In this specification and the like, hybrid display (hybrid mode) is a method for displaying a letter and/or an image using reflected light and self-emitted light together in one panel that complement the color tone or light intensity of each other. Alternatively, hybrid display is a method for displaying a letter and/or an image using light from a plurality of display elements in one pixel or one subpixel. Note that when a hybrid display performing hybrid display is locally observed, a pixel or a subpixel performing display using any one of the plurality of display elements and a pixel or a subpixel performing display using two or more of the plurality of display elements are included in some cases.

Note that in this specification and the like, hybrid display satisfies any one or a plurality of the above-described descriptions.

Furthermore, a hybrid display includes a plurality of display elements in one pixel or one subpixel. Note that as an example of the plurality of display elements, a reflective element that reflects light and a self-luminous element that emits light can be given. Note that the reflective element and the self-luminous element can be controlled independently. The hybrid display has a function of displaying a letter and/or an image using one or both of reflected light and self-emitted light in a display portion.

Structural examples and manufacturing method examples of a display device of one embodiment of the present invention are described below with reference to drawings.

Note that the expressions indicating directions such as "over" and "under" are basically used to correspond to the directions of drawings. However, in some cases, the direction indicating "over" or "under" in the specification does not correspond to the direction in the drawings for the purpose of simplicity or the like. For example, when a stacked order (formation order) of a stacked body or the like is described, even in the case where a surface on which the stacked body is provided (e.g., a formation surface, a support surface, an attachment surface, or a planarization surface) is positioned above the stacked body in the drawings, the direction and the opposite direction are referred to as "under" and "over", respectively, in some cases.

[Structural Example 1]

FIG. 1A is a schematic perspective view illustrating a display device 10 of one embodiment of the present invention. In the display device 10, a substrate 21 and a substrate 31 are attached to each other. In FIG. 1A, the substrate 31 is denoted by a dashed line.

The display device 10 includes a display portion 32, a circuit 34, a wiring 35, and the like. The substrate 21 is provided with a conductive layer 23 which is included in the circuit 34, the wiring 35, and the display portion 32 and serves as a pixel electrode. In FIG. 1A, an IC 37 and an FPC 36 are mounted on the substrate 21. Thus, the structure illustrated in FIG. 1A can be referred to as a display module.

As the circuit 34, for example, a circuit functioning as a scan line driver circuit can be used.

The wiring 35 has a function of supplying a signal or electric power to the display portion 32 or the circuit 34. The signal or power is input to the wiring 35 from the outside through the FPC 36 or from the IC 37.

FIG. 1A shows an example in which the IC 37 is provided on the substrate 21 by a chip on glass (COG) method or the like. As the IC 37, an IC functioning as a signal line driver circuit or the like can be used. Note that it is possible that the IC 37 is not provided when, for example, the display device 10 includes circuits serving as a signal line driver circuit and when the circuits serving as a signal line driver circuit are provided outside and a signal for driving the display device 10 is input through the FPC 36. Alternatively, the IC 37 may be mounted on the FPC 36 by a chip on film (COF) method or the like.

FIG. 1A is an enlarged view of part of the display portion 32. The conductive layers 23 included in a plurality of display elements are arranged in a matrix in the display portion 32. The conductive layer 23 functions as a pixel electrode, for example. Here, the conductive layer 23 has a function of reflecting visible light and blocking ultraviolet light.

Figure 2:
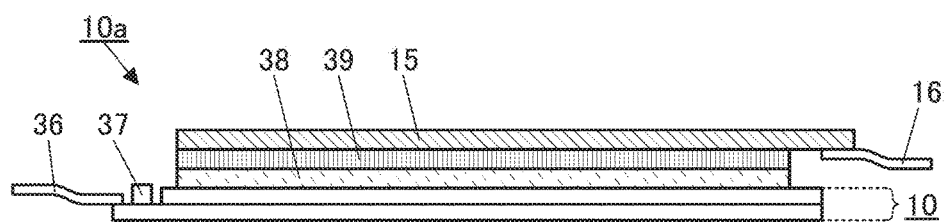
FIG. 2 illustrates a structural example of a touch panel of one embodiment.

FIG. 2 illustrates an example of a touch panel 10a including the display device 10.

A touch sensor panel 15 is provided on a display surface side of the touch panel 10a. A diffusion plate 38 and a polarizing plate 39 are provided from the display device 10 side between the display device 10 and the touch sensor panel 15.

For the diffusion plate 38, a film having a function of diffusing visible light is favorably used. Examples of the film include a film on which a hemispherical lens or a micro lens array is formed, a film provided with an uneven structure, and a light diffusing film. For example, a light extraction structure can be formed by attaching such a film to the display device 10 with an adhesive or the like having substantially the same refractive index as the substrate 31 or the film.

As the polarizing plate 39, for example, a linearly polarizing plate or a circularly polarizing plate may be used. In particular, a circularly polarizing plate can be favorably used when the display portion 32 includes a reflective liquid crystal element. An example of a circularly polarizing plate is a stack including a linear polarizing plate and a quarter-wave retardation plate. Reflection of external light can be effectively suppressed with a circularly polarizing plate.

The touch sensor panel 15 has a function of sensing the touch or proximity of an object such as a finger or a stylus. In addition, the touch sensor panel 15 may have a function of outputting the positional information of the object. FIG. 2 illustrates an example in which the touch sensor panel 15 is provided with an FPC 16. Note that the touch sensor panel 15 or the FPC 16 may be provided with an IC or the like which has a function of controlling the operation of the touch sensor panel 15, calculating the positional information or the like based on a signal from the touch sensor panel 15, or the like.

As a sensing element (also referred to as a sensor element) included in the touch sensor panel 15, various sensors capable of sensing the touch or proximity of an object such as a finger or a stylus on or to the surface of the touch sensor panel 15 can be used.

For example, a variety of types such as a capacitive type, a resistive type, a surface acoustic wave type, an infrared type, an optical type, and a pressure-sensitive type can be used for the sensor.

Examples of the capacitive touch sensor include a surface capacitive touch sensor and a projected capacitive touch sensor. Examples of the projected capacitive sensor include a self-capacitive sensor and a mutual capacitive sensor. The use of a mutual capacitive type sensor is preferable because multiple points can be sensed simultaneously.

FIG. 2 shows a structure in which the display device 10 and the touch sensor panel 15 are fabricated separately and then attached to each other; however, the present invention is not limited thereto. For example, a so-called on-cell touch panel or in-cell touch panel in which an electrode and the like included in a sensor element are provided on either or both of the substrate 21 and the substrate 31 of the display device 10 may be used.

For the touch sensor panel 15, an anti-reflection film is preferably used. Alternatively, an anti-reflection film is preferably attached over the display surface of the touch sensor panel 15. Accordingly, reflection of external light at the surface of the touch panel 10a is suppressed, whereby visibility can be improved.

In addition to the above film, a functional film such as an anti-reflection film, a polarizing film, a retardation film, a light diffusing film, or a condensing film, or a functional film including a film such as an antistatic film preventing the attachment of dust, a water repellent film suppressing the attachment of stain, a hard coat film suppressing generation of a scratch in use, or a film having a property of self-healing of a scratch may be provided on the display surface side of the display device 10.

[Cross-Sectional Structural Example 1-1]

Figure 1B:
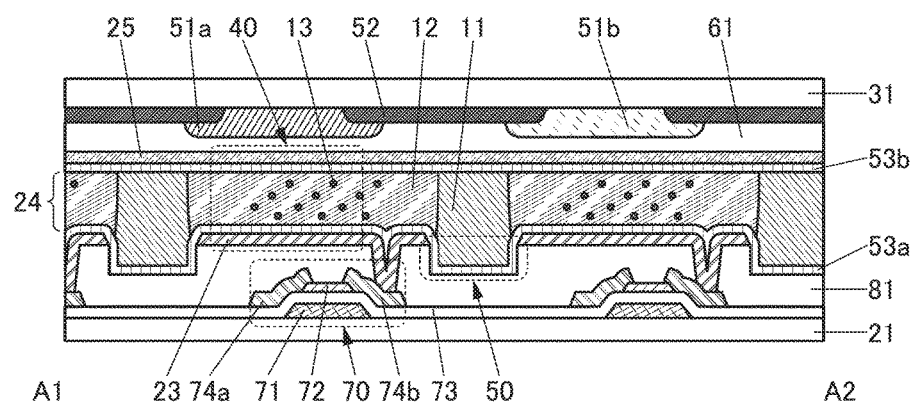

FIG. 1B shows an example of a cross section taken along the cutting-plane line A1-A2 in FIG. 1A. A cross section of a region including adjacent two pixels (subpixels) is shown in FIG. 1B. Here, an example where a reflective liquid crystal element 40 is used as a display element is shown. In FIG. 1B, the substrate 31 side functions as a display surface side.

In the display device 10, a liquid crystal layer 24 is provided between the substrate 21 and the substrate 31. The liquid crystal element 40 includes the conductive layer 23 provided on the substrate 21 side, a conductive layer 25 provided on the substrate 31 side, and the liquid crystal layer 24 provided therebetween. Here, the conductive layer 25 has a function of transmitting visible light. The conductive layer 25 serves as a common electrode or the like.

A transistor 70 electrically connected to the conductive layer 23 is provided over the substrate 21. On the other hand, on the substrate 21 side of the substrate 31, a coloring layer 51a, a coloring layer 51b, a light-blocking layer 52, an insulating layer 61, the conductive layer 25, and the like are provided. In addition, an alignment film 53a is provided between the conductive layer 23 and the liquid crystal layer 24 and an alignment film 53b is provided between the conductive layer 25 and the liquid crystal layer 24. Note that the alignment films 53a and 53b are not necessarily provided.

The transistor 70 includes a conductive layer 71 serving as a gate, a semiconductor layer 72, an insulating layer 73 serving as a gate insulating layer, a conductive layer 74a serving as one of a source and a drain, a conductive layer 74b serving as the other of the source and the drain, and the like.

An insulating layer 81 is provided to cover the transistor 70. The conductive layer 23 is provided over the insulating layer 81. The conductive layer 23 is electrically connected to the conductive layer 74b through an opening in the insulating layer 81. The transistor 70 and the conductive layer 23 are placed in each pixel (subpixel).

The insulating layer 81 includes a depression portion 50. The depression portion 50 is provided in a portion not overlapping with the conductive layer 23. In other words, the insulating layer 81 includes a portion that does not overlap with the conductive layer 23 and has a smaller thickness than a portion overlapping with the conductive layer 23. The alignment film 53a is provided to cover the depression portion 50 of the insulating layer 81. A top surface of the alignment film 53a has a recessed shape along the shape of the depression portion 50.

FIG. 1B illustrates an example in which the alignment film 53a is provided to cover side surfaces and a top surface of the depression portion 50. In the case where coverage of the alignment film 53a is poor, a portion of the alignment film 53a that is in contact with the side surfaces of the depression portion 50 might be thinner than the other portion (e.g., a portion overlapping with the conductive layer 23), or might fail to cover the side surfaces of the depression portion 50 and might split.

The coloring layers 51a and 51b are placed to overlap with different conductive layers 23. In addition, the light-blocking layer 52 has a portion overlapping with a region between the two adjacent conductive layers 23. As illustrated in FIG. 1B, it is preferable that part of the light-blocking layer 52 be placed to overlap with an end portion of the conductive layer 23.

The liquid crystal layer 24 includes liquid crystal 12 and a monomer 13 in a region overlapping with the conductive layer 23. In addition, the liquid crystal layer 24 includes a partition wall 11 in a region overlapping with a region between the two adjacent conductive layers 23. The partition wall 11 and the light-blocking layer 52 preferably include portions overlapping with each other.

The monomer 13 is a material which becomes a polymer by polymerization. Furthermore, the partition wall 11 includes a polymer obtained by polymerization of the monomers 13. In the partition wall 11, a material which is the same as that of the liquid crystal 12 may be contained.

As the monomer 13, a polymerizable monomer can be used. For example, a photopolymerizable (photocurable) monomer which is polymerized by light and a thermopolymerizable (thermosetting) monomer which is polymerized by heat can be used. In particular, a photopolymerizable material is preferably used. The liquid crystal layer 24 may include, in addition to the monomer 13, an oligomer whose polymerization degree is greater than or equal to 2 and less than or equal to 100, for example. At this time, the oligomer is preferably a photopolymerizable oligomer or a thermopolymerizable oligomer.

As the monomer 13, a monofunctional monomer such as acrylate or methacrylate, a polyfunctional monomer such as diacrylate, triacrylate, dimethacrylate, or trimethacrylate, or the like can be used. Alternatively, a mixture of two kinds or more of the monofunctional monomer and the polyfunctional monomer may be used. Alternatively, as the monomer 13, a liquid-crystalline material, a non-liquid-crystalline material, or a mixture thereof can be used.

The liquid crystal layer 24 may contain a remaining polymerization initiator in a region overlapping with the conductive layer 23. The polymerization initiator changes to a substance which is to be a trigger for polymerization of monomers due to external stimuli such as light and heat, for example. As the polymerization initiator, a radical polymerization initiator which generates radicals by light such as ultraviolet light or heating can be used, for example. The amount of polymerization initiator may be minimal as compared with liquid crystal and monomers, and for example, the polymerization initiator may be mixed so that the weight ratio of the polymerization initiator to the total weight of a composition in which liquid crystal, monomers, polymerization initiator, and the like are mixed is lower than or equal to 1 wt %. Moreover, the polymerization initiator can be selected as appropriate in accordance with the material of the monomer 13. In accordance with the material of the monomer 13, a cation polymerization initiator, an anion polymerization initiator, or the like may be used instead of the radical polymerization initiator.

As the material of the monomer 13, a material with which polymerization is started by a polymerization initiator to be used. In particular, for the monomer 13 and the polymerization initiator, the combination of materials with which polymerization is started and proceeds by ultraviolet light is preferably used.

The liquid crystal layer 24 may include a chiral material, in addition to the liquid crystal 12, the monomer 13, the polymerization initiator, and the like.

The partition wall 11 includes a polymer obtained by polymerization of the monomers 13. For example, when acrylate is used for the monomers 13, the partition wall 11 contains polyacrylate.

The partition wall 11 may contain not only a polymer but also a substance included in the liquid crystal layer 24 (e.g., the liquid crystal 12, the monomers 13 which are not polymerized, the polymerization initiator which does not react and remains, and the chiral material).

Furthermore, the degree of polymerization of the polymer changes in accordance with the formation condition of the polymer or the material of the monomer 13. In addition, the volume density of the partition wall 11 also changes in accordance with the formation condition of the polymer or the material of the monomer 13, or the like. For example, the volume density of the partition wall 11 can be higher than or equal to 70% and lower than or equal to 100%, preferably higher than or equal to 80% and lower than or equal to 100%, further preferably higher than or equal to 90% and lower than or equal to 100%.

The partition wall 11 preferably bonds the substrate 21 to the substrate 31. Specifically, the partition wall 11 has a function of bonding a layer which is provided on the substrate 21 side and in contact with the liquid crystal layer 24 to a layer which is provided on the substrate 31 side and in contact with the liquid crystal layer 24. In FIG. 1B, the partition wall 11 bonds part of the alignment film 53a to part of the alignment film 53b. In the case where the alignment films 53a and 53b are not provided, the partition wall 11 bonds part of the insulating layer 81 to part of the conductive layer 25.

The partition wall 11 is provided to overlap with the depression portion 50 of the insulating layer 81. More specifically, the partition wall 11 is provided in contact with parts of the alignment film 53a that cover the top surface and the side surfaces of the depression portion 50. Accordingly, the contact area between the partition wall 11 and the alignment film 53a is increased, so that the adhesion strength between the partition wall 11 and the alignment film 53a can be increased by an anchor effect. The partition wall 11 is preferably provided so as to fill the depression portion 50 because adhesion strength can be increased more effectively.

Note that in the case where the alignment film 53a fails to cover the side surfaces of the depression portion 50 of the insulating layer 81 and splits or the alignment film 53a is not provided, there may be a portion where the partition wall 11 and the insulating layer 81 are in contact with each other.

In the display device 10 of one embodiment of the present invention, the adhesion strength between the substrate 21 and the substrate 31 is increased by the partition wall 11; thus, the display device 10 is unlikely to be broken and has high reliability. Moreover, the partition wall 11 is provided so that at least part thereof overlaps with the depression portion 50 provided in the insulating layer 81 and adhesion strength is further increased by an anchor effect. Furthermore, in the display device 10, by the partition wall 11, the physical strength against external force is increased and the change of the cell gap due to external force is suppressed.

The positional relationship between the partition wall 11 and the depression portion 50 and the shape of the partition wall 11 and the depression portion 50 are not limited to those illustrated in FIG. 1B.

Figure 3A:
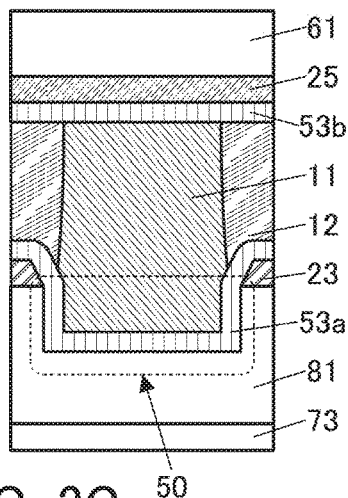
FIGS. 3A to 3F illustrate structural examples of a display device of one embodiment.

FIG. 3A is an enlarged schematic cross-sectional view of the partition wall 11 and the vicinity thereof in FIG. 1B.

Figure 3B:
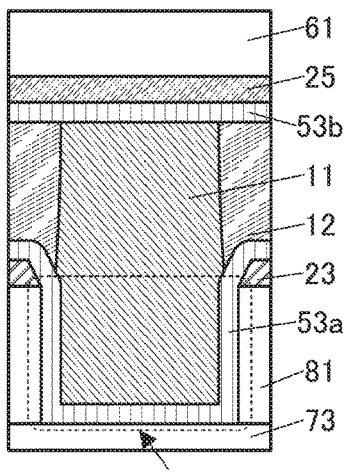

FIG. 3B illustrates an example in which the insulating layer 81 is not provided in a portion not overlapping with the conductive layer 23. Specifically, the alignment film 53a is provided in contact with side surfaces of the insulating layer 81 and a top surface of the insulating layer 73. With this structure, the contact area between the partition wall 11 and a layer in contact with the partition wall 11 is further increased; thus, adhesion strength can be further increased.

Figure 3C:
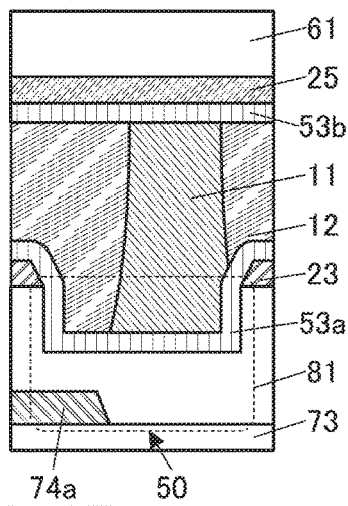

FIG. 3C illustrates an example in which part of the conductive layer 74a is provided to extend to a position overlapping with the depression portion 50. The partition wall 11 is provided in a region overlapping with neither the conductive layer 23 nor the conductive layer 74a.

Figure 3D:
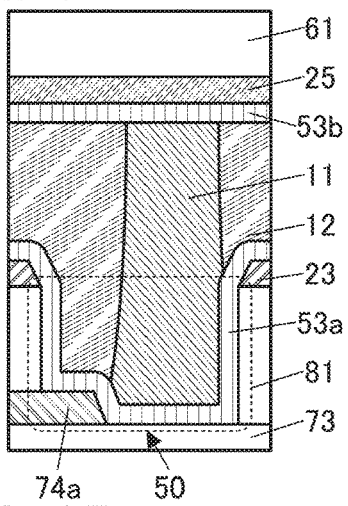

FIG. 3D illustrates an example in which the insulating layer 81 is not provided in a portion not overlapping with the conductive layer 23 in FIG. 3C. The alignment film 53a is provided in contact with part of the conductive layer 74a and part of the insulating layer 73.

Figure 3E:
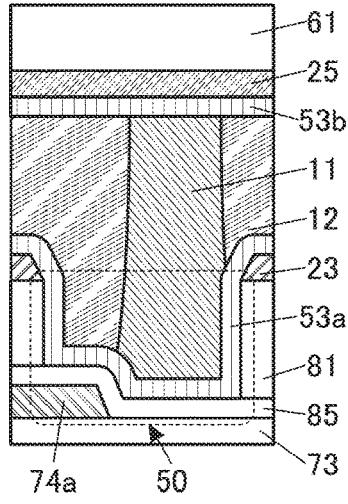

FIG. 3E illustrates an example in which an insulating layer 85 covering the conductive layer 74a is added to FIG. 3D. The conductive layer 74a can be protected by the insulating layer 85. In addition, defects such as an electrical short circuit due to the exposure of the conductive layer 74a can be suppressed.

Figure 3F:
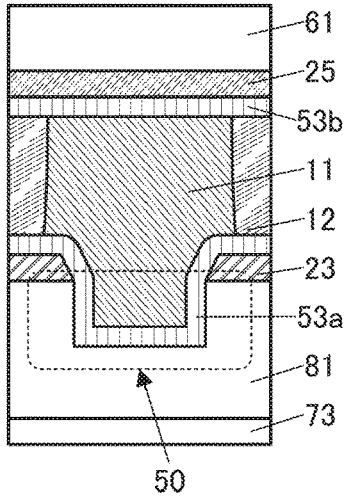

The partition wall 11 is formed in a self-aligned manner by light irradiation; therefore, when the light is ideal parallel light, the partition wall 11 is basically not formed in a portion overlapping with a light-blocking member. However, in some cases, the partition wall 11 is formed also in the portion overlapping with the light-blocking member owing to scattering of light, directivity of a light source, or the like. FIG. 3F illustrates an example in which the partition wall 11 is provided to cover part of the conductive layer 23 in FIG. 3A.

Although the thickness of the alignment film 53a is uniform in FIGS. 3A to 3F, actually, the alignment film 53a may have a reduced thickness or may split in the vicinity of the side surface of the depression portion 50. Moreover, although FIGS. 3A to 3F illustrate examples in which the side surface of the depression portion 50 of the insulating layer 81 is substantially perpendicular to the film-plane direction, actually, the insulating layer 81 may not be perpendicular depending on the processing method or conditions of the insulating layer 81. For example, the insulating layer 81 may have a shape in which the bottom portion is larger or smaller than the top portion in a plan view, or a shape in which part of a side surface curves inward or outward in a cross-sectional view.

The above is the description of Cross-sectional structural example 1-1.

[Layout Example of Pixel]

FIG. 4A shows an example of a layout of a pixel seen from the display surface side. Here, conductive layers provided on the substrate 21 side, the partition wall 11, a structure body 14a, a structure body 14b, and the like are illustrated. In addition, some components such as an insulating layer are not illustrated.

A pixel illustrated in FIG. 4A includes the transistor 70 and a capacitor 75. The transistor 70 includes a conductive layer 71a, the semiconductor layer 72, the insulating layer 73 (not illustrated), the conductive layer 74a, the conductive layer 74b, and the like. The capacitor 75 has a structure where the conductive layer 74b and a conductive layer 71b are stacked with the insulating layer 73 (not illustrated) provided therebetween. In addition, the pixel includes the conductive layer 23 which is electrically connected to the conductive layer 74b and serves as a pixel electrode. The conductive layer 23 reflects visible light and blocks ultraviolet light.

Here, part of the conductive layer 74a serves as a signal line, part of the conductive layer 71b serves as a capacitor line, and part of the conductive layer 71a serves as a scan line.

In FIG. 4A, a region where the partition wall 11 is provided is hatched. The partition wall 11 is formed in a portion where the above-described conductive layers are not provided.

As illustrated in FIG. 4A, since a wiring and the like are provided between the two adjacent conductive layers 23, the partition wall 11 is not formed in a portion overlapping with the wiring. Thus, the partition wall 11 does not surround the conductive layer 23 completely, and is formed in island shapes along part of the outline of the conductive layer 23. Depending on the irradiation condition of light which is emitted when the partition wall 11 is formed or due to the scattering of the light, the partition wall 11 is formed to overlap with part of the conductive layer 23 or part of the wiring in some cases.

Note that the structure of the pixel illustrated in FIG. 4A is an example, and the manufacturing method of the display device of one embodiment of the present invention can be used for pixels with a variety of structures. Although a simple structure where the pixel includes one transistor and one capacitor is shown as an example here, the structure of the pixel is not limited thereto, and the pixel may include two or more transistors and two or more capacitors.

FIG. 4A illustrates an example in which the structure body 14a and the structure body 14b are provided. The structure body 14a and the structure body 14b are provided in a region where the conductive layer 23 is not provided, and are partially in contact with the partition wall 11.

In this example, the top surface shape of the structure body 14a is substantially circularly symmetric. Meanwhile, the top surface shape of the structure body 14b is long in the lateral direction. As described later, when the structure body 14a and the structure body 14b are formed to have different widths, the heights of the structure body 14a and the structure body 14b can be made different in a self-aligned manner.

FIGS. 4B1 and 4B2 each illustrate an example of a cross section of a region including the structure body 14a. FIGS. 4B1 and 4B2 correspond to the cutting-plane line B1-B2 in FIG. 4A and the cutting-plane line B3-B4 in FIG. 4A, respectively. The cutting-plane line B1-B2 and the cutting-plane line B3-B4 intersect with each other in a portion overlapping with the structure body 14a.

The structure body 14a is formed on the conductive layer 25 side and part of the structure body 14a is covered with the alignment film 53b. A top (a bottom in FIGS. 4B1 and 4B2) of the structure body 14a is provided in contact with the alignment film 53b. The structure body 14a is provided so that part of side surfaces thereof is covered with the partition wall 11. As illustrated in FIG. 4B2, the partition wall 11 is not formed in a region overlapping with the conductive layer 74a having a light-blocking property; therefore, part of the structure body 14a may be in contact with the liquid crystal 12.

FIGS. 4C1 and 4C2 illustrate an example of cross sections of a region including the structure body 14b. FIGS. 4C1 and 4C2 correspond to the cutting-plane line C1-C2 in FIG. 4A and the cutting-plane line C3-C4 in FIG. 4A, respectively. FIG. 4C1 corresponds to the cross section in the minor-axis direction of the structure body 14b and FIG. 4C2 corresponds to the cross section in the major-axis direction of the structure body 14b.

As the structure body 14a, the structure body 14b is formed on the conductive layer 25 side and part of the structure body 14b is covered with the alignment film 53b. The structure body 14b includes a portion that overlaps with the conductive layer 74a and is in contact with the liquid crystal 12.

The structure body 14b has a narrower width in the minor axis direction than the structure body 14a and has a lower height than the structure body 14a. Therefore, a top of the structure body 14b is covered with the partition wall 11 without being in contact with the alignment film 53a.

Although the shape of the structure body 14a is circularly symmetric in this example, the shape may be a polygon including a quadrangle, a polygon with rounded corners, or the like. Although the shape of the structure body 14b is horizontally long in this example, the shape only needs to include a portion having a narrower width (smaller diameter) than the structure body 14a and may be a circle and a polygon.

The above is the description of the layout example of the pixel.

Other structural examples and other manufacturing method examples of the display device of one embodiment of the present invention are described below. Note that description of the portions already described is omitted and different portions are described.

[Cross-Sectional Structural Example 1-2]

Figure 5:
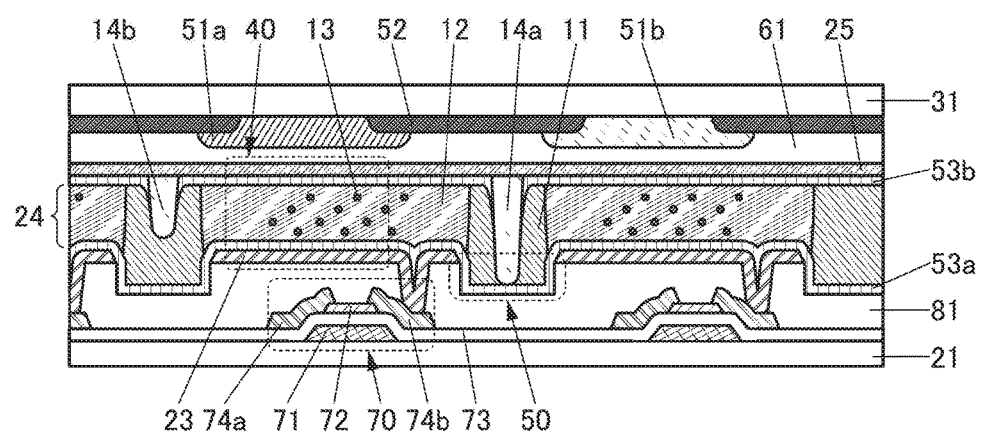
FIG. 5 illustrates a structural example of a display device of one embodiment.

FIG. 5 is a schematic cross-sectional view of a display device described below as an example. The structure illustrated in FIG. 5 is different from that in FIG. 1B mainly in including the structure body 14a and the structure body 14b.

The structure body 14a and the structure body 14b are provided between the conductive layer 25 and the alignment film 53b. The alignment film 53b is provided to cover the structure body 14a and the structure body 14b. Each of the structure body 14a and the structure body 14b is positioned between the two adjacent conductive layers 23. In addition, the structure body 14a and the structure body 14b each have a portion overlapping with the light-blocking layer 52 and the depression portion 50 of the insulating layer 81. The partition wall 11 is provided to surround the structure body 14a and the structure body 14b.

When the substrate 21 and the substrate 31 are attached to each other, the structure body 14 serves as a spacer for preventing the substrates 21 and 31 from getting unnecessarily close to each other and adjusting the cell gap of the liquid crystal element 40.

Since the partition wall 11 is provided to surround the structure body 14a and the structure body 14b, adhesion strength is more increased than that in the example shown in FIG. 1B.

[Cross-Sectional Structural Example 1-3]

Figure 6A:
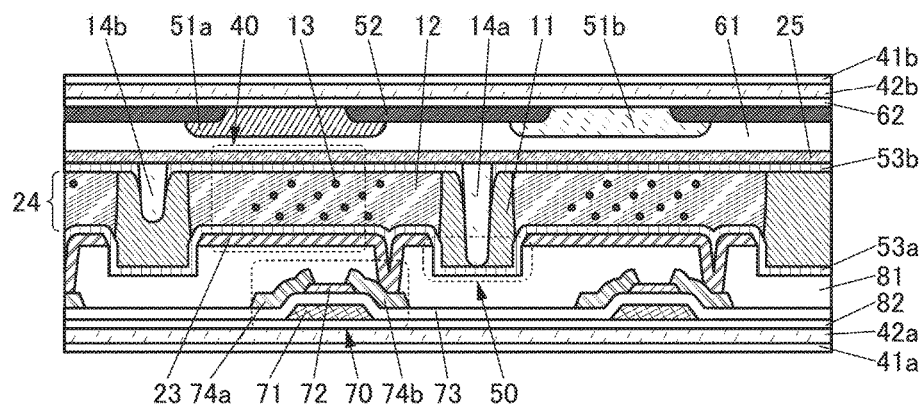
FIGS. 6A to 6C illustrate structural examples of a display device of one embodiment.

FIG. 6A is a schematic cross-sectional view of a display device described below as an example. The structure illustrated in FIG. 6A is different from that in FIG. 5 mainly in including a substrate 41a, an adhesive layer 42a, and an insulating layer 82 instead of the substrate 21 and including a substrate 41b, an adhesive layer 42b, and an insulating layer 62 instead of the substrate 31.

The insulating layer 82 has a surface which is provided with the transistor 70 and the like. The substrate 41a is attached to one surface of the insulating layer 82 with the adhesive layer 42a. On the other surface side of the insulating layer 82, the transistor 70, the conductive layer 23, and the like are provided.

The insulating layer 62 has a surface which is provided with the light-blocking layer 52, the coloring layer 51a, the coloring layer 51b, and the like. The substrate 41b is attached to one surface of the insulating layer 62 with the adhesive layer 42b. On the other surface side of the insulating layer 62, the coloring layer 51a, the coloring layer 51b, the light-blocking layer 52, the insulating layer 61, the structure body 14a, the structure body 14b, the conductive layer 25, the alignment film 53b, and the like are provided.

For the substrate 41a and the substrate 41b, a thin and lightweight material can be used. Favorably, a flexible material can be used for the substrate 41b. Moreover, when a flexible material is used for both the substrates 41b and 41a, a flexible display device can be fabricated.

For example, for the substrate 41a and the substrate 41b, a thin sheet-like material with a thickness greater than or equal to 1 μm and less than or equal to 300 μm, preferably greater than or equal to 3 μm and less than or equal to 200 μm, further preferably greater than or equal to 5 μm and less than or equal to 150 μm, and further preferably greater than or equal to 10 μm and less than or equal to 100 μm can be used.

[Cross-Sectional Structural Example 1-4]

Figure 6B:
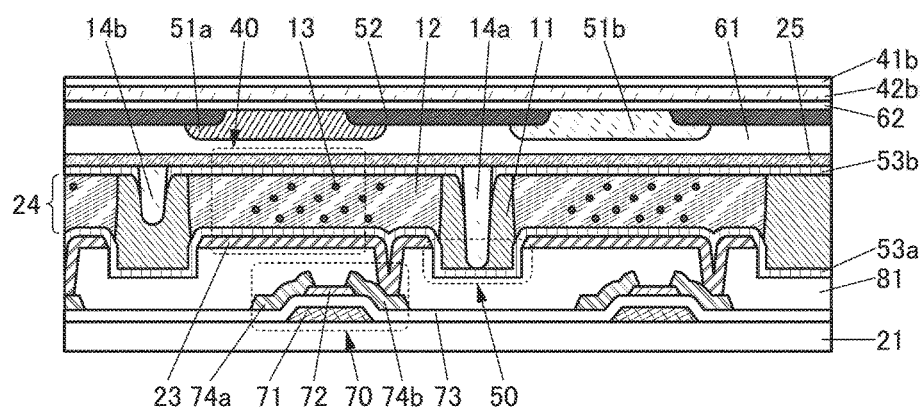

FIG. 6B is a schematic cross-sectional view of a display device described below as an example. The structure illustrated in FIG. 6B is different from that in FIG. 6A in including the substrate 21 instead of the substrate 41a, the adhesive layer 42a, and the insulating layer 82.

The structure illustrated in FIG. 6B includes the substrate 41b with a small thickness on the display surface side and the substrate 21 having higher rigidity than the substrate 41b on the opposite side. Thus, a display device with a smaller thickness than that in the structure illustrated in FIG. 5 can be achieved. Moreover, since the thickness of the substrate 41b which is on the display surface side is small, a display device having excellent optical characteristics such as display contrast, color reproducibility, and viewing angle dependence as compared with the case where a relatively thick glass substrate (for example, with a thickness greater than 0.3 mm) or the like is used can be fabricated.

[Cross-Sectional Structural Example 1-5]

Figure 6C:
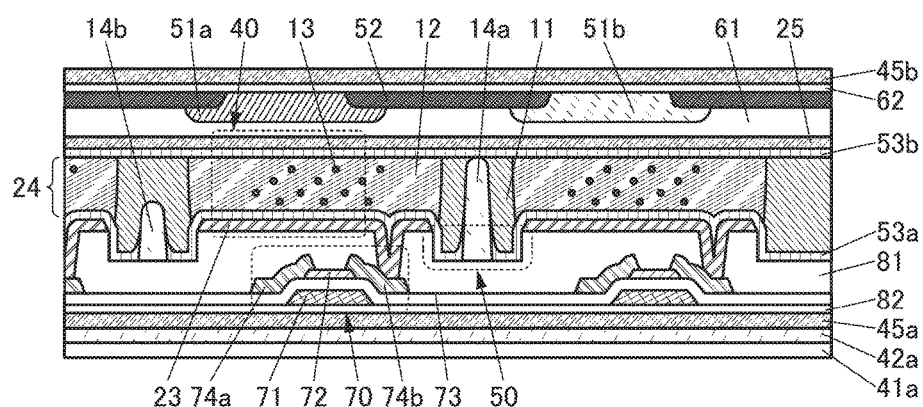

FIG. 6C is a schematic cross-sectional view of a display device described below as an example. The structure illustrated in FIG. 6C is different from that in FIG. 5 mainly in that the substrate 41a, the adhesive layer 42a, and a resin layer 45a are provided instead of the substrate 21, a resin layer 45b and the insulating layer 62 are provided instead of the substrate 31, and the structure body 14a and the structure body 14b are provided in contact with the insulating layer 81.

The resin layer 45a is an insulating layer which supports the transistor 70 and the like. For the resin layer 45a, a polyimide resin, an acrylic resin, an epoxy resin, a polyamide resin, a polyimide-amide resin, a siloxane resin, a benzocyclobutene-based resin, a phenol resin, or the like can be used. In particular, a polyimide resin is preferable because of its high heat resistance and low thermal expansion coefficient.

The thickness of the resin layer 45a is, for example, greater than or equal to 0.01 μm and less than or equal to 200 μm, preferably greater than or equal to 0.1 μm and less than or equal to 100 μm. With such a structure, a bendable display device having flexibility can be fabricated.

The substrate 41a is attached to one surface of the resin layer 45a with the adhesive layer 42a. On the other surface side of the resin layer 45a, the insulating layer 82 is provided.

For the resin layer 45b, a resin material having a light-transmitting property can be used. A film-like or sheet-like material with a thickness greater than or equal to 1 μm and less than or equal to 200 μm can be preferably used.

The manufacturing step can be simplified by providing the coloring layer 51a, the coloring layer 51b, the light-blocking layer 52, the insulating layer 61, the conductive layer 25, the alignment film 53b, and the like directly over the resin layer 45b, as described above.

The insulating layer 62 is provided on one surface side of the resin layer 45b. Note that the insulating layer 62 is not necessarily provided.

Each of the structure body 14a and the structure body 14b is provided in the depression portion 50 and in contact with a top surface of the insulating layer 81. The alignment film 53a is provided to cover at least part of side surfaces of the structure body 14a and the structure body 14b.

With such a structure, the structure on the resin layer 45b side can be simplified. For example, the coloring layer 51a and the coloring layer 51b having island shapes, the light-blocking layer 52 having an opening, or the like can be formed by a printing method. In that case, the structure on the resin layer 45b side can be manufactured by a roll-to-roll method inexpensively.

The above is the description of Structural example 1.

[Structural Example 2]

As an example of the display device of one embodiment of the present invention, a display device (display panel) that includes both a reflective liquid crystal element and a light-emitting element and can display an image in a light-emission mode, in a reflective mode, and in a hybrid mode will be described below. Such a display panel can also be referred to as an emission and reflection hybrid display (emission/reflection hybrid display or ER-hybrid display).

One example of such a display panel is a structure in which a liquid crystal element including an electrode that reflects visible light and a light-emitting element are stacked. In this structure, it is preferable that the electrode that reflects visible light have an opening and the opening overlap with the light-emitting element. This enables driving in the light-emission mode by which light is emitted from the light-emitting element through the opening. Note that a light-emitting region of the light-emitting element may be provided in a region not overlapping with the electrode that reflects visible light and light may be emitted from the light-emitting element through a gap between the electrodes that reflect visible light. As compared with the case where the liquid crystal element and the light-emitting element are arranged side by side, in the case where the liquid crystal element and the light-emitting element are stacked, the size of a pixel including both the liquid crystal element and the light-emitting element can be reduced; thus, a higher-definition display device can be fabricated.

Such a display panel can be driven with extremely low power consumption by displaying an image in the reflective mode in a place with bright external light such as an outdoor space. At night or in a place with weak external light such an indoor space, the display panel can display an image with an optimal luminance by displaying the image in the light-emission mode. Moreover, with a mode using both emission and reflection of light (also referred to as the hybrid mode), the display panel can display an image with less power consumption and a higher contrast than a conventional display panel even in a place with insufficient external light. In the reflective mode and the hybrid mode, display reflecting a change of ambient light can be performed, which gives a more natural feeling to users.

[Cross-Sectional Structural Example 2-1]

Figure 7A:
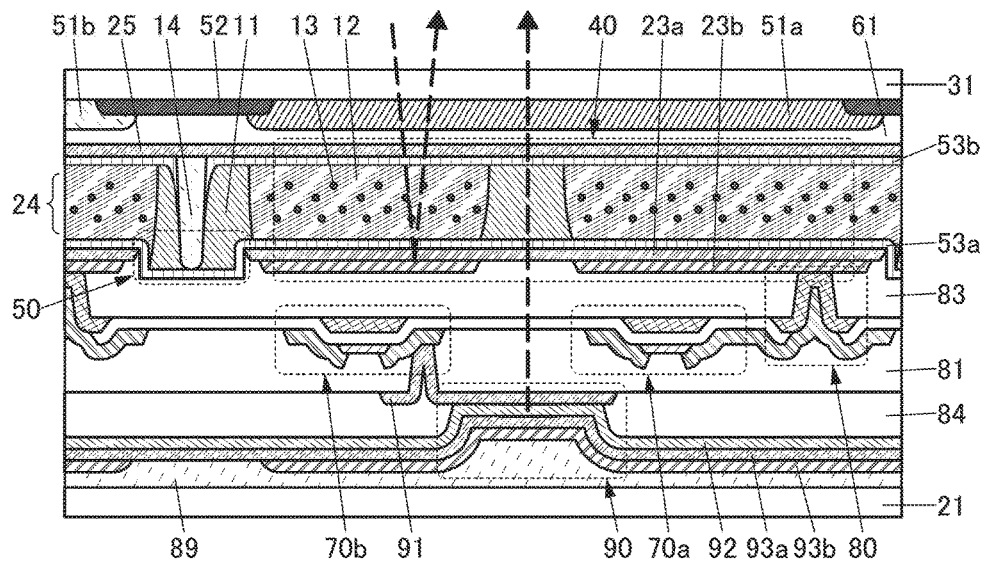
FIGS. 7A and 7B illustrate structural examples of a display device of one embodiment.

FIG. 7A is a schematic cross-sectional view of a display device described below as an example. In a structure in FIG. 7A, the liquid crystal element 40 and a light-emitting element 90 overlap with each other with an insulating layer 83 provided therebetween. In the structure in FIG. 7A, the substrate 31 side corresponds to the display surface side.

The display device includes a transistor 70a and a transistor 70b which are formed on one surface of the insulating layer 83. The transistor 70a is electrically connected to the liquid crystal element 40 and the transistor 70b is electrically connected to the light-emitting element 90.

A conductive layer 91 is provided on the substrate 21 side of the insulating layer 81, which covers the transistors 70a and 70b, and an insulating layer 84 is provided to cover an end portion of the conductive layer 91. The conductive layer 91 and one of a source and a drain of the transistor 70b are electrically connected to each other through an opening provided in the insulating layer 81. The insulating layer 84 serves as a planarization layer. An EL layer 92, a conductive layer 93a, and a conductive layer 93b are provided on the substrate 21 side of the insulating layer 84. The conductive layer 91, the EL layer 92, the conductive layer 93a, and the conductive layer 93b form the light-emitting element 90.

The conductive layer 91 and the conductive layer 93a each have a function of transmitting visible light. The conductive layer 93b has a function of reflecting visible light. Thus, the light-emitting element 90 is a bottom-emission light-emitting element which emits light to the conductive layer 91 side.

A stack of a conductive layer 23a and a conductive layer 23b is provided on the substrate 31 side of the insulating layer 83. In addition, the alignment film 53a is provided between the conductive layer 23a and the liquid crystal layer 24. For the structures of the liquid crystal layer 24 and a portion between the liquid crystal layer 24 and the substrate 31, Structural example 1 can be referred to; thus, the description of the structures is omitted.

In addition, the display device includes a connection portion 80 where conductive layers provided on both sides of the insulating layer 83 are electrically connected to each other. In FIG. 7A, a terminal portion includes an opening provided in the insulating layer 83 and a conductive layer which is positioned in the opening and provided by processing the same conductive film as a gate of the transistor 70a and the like. One of a source and a drain of the transistor 70a and the conductive layer 23b are electrically connected to each other through the connection portion 80.

The conductive layer 23a has a function of transmitting visible light. The conductive layer 23b has a function of reflecting visible light. Thus, the liquid crystal element 40 functions as a reflective liquid crystal element.

In the conductive layer 23b which reflects visible light, an opening is provided in a region overlapping with the light-emitting element 90. Light from the light-emitting element 90 is emitted to the substrate 31 side through the opening.

The display device in FIG. 7A includes the transistor 70a electrically connected to the liquid crystal element 40 and the transistor 70b electrically connected to the light-emitting element 90; thus, the liquid crystal element 40 and the light-emitting element 90 can be separately controlled. In addition, the transistors 70a and 70b can be formed on the same plane and through the same process; thus, the process can be simplified and the transistors can be manufactured with a high yield.

In addition, as illustrated in FIG. 7A, an opening is provided in the conductive layer 93b that reflects visible light in a region overlapping with the partition wall 11. The conductive layer 93a has a function of transmitting ultraviolet light. When light irradiation for forming the partition wall 11 is performed, the light can be emitted to the liquid crystal layer 24 through the opening.

The depression portion 50 is formed in the insulating layer 83 between the two conductive layers 23a. In the plurality of partition walls 11, part of the partition wall 11 formed between the two conductive layers 23a is provided to overlap with the depression portion 50.

On the substrate 21 side of the conductive layer 25, the structure body 14 is provided in a position overlapping with the depression portion 50. The structure body 14 is provided to overlap with the partition wall 11.

[Modification Example 1]

Figure 7B:
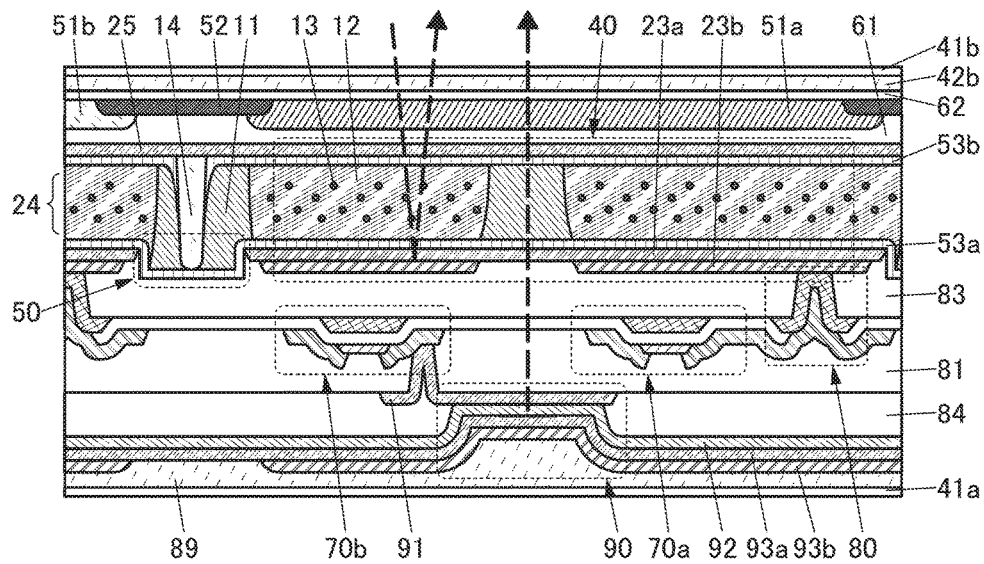

FIG. 7B shows a structural example partly different from that in FIG. 7A. Specifically, the insulating layer 62, the adhesive layer 42b, and the substrate 41b are provided instead of the substrate 31 and the substrate 41a is provided instead of the substrate 21.

With such a structure, a bendable display device can be fabricated.

[Cross-Sectional Structural Example 2-2]

Figure 8A:
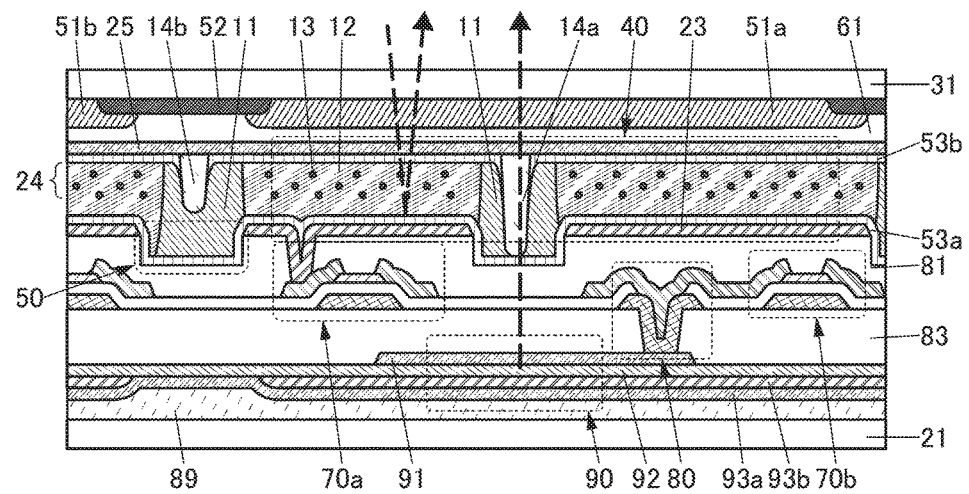
FIGS. 8A and 8B illustrate structural examples of a display device of one embodiment.

FIG. 8A is a schematic cross-sectional view of a display device described below as an example. The structure in FIG. 8A is different from that in FIG. 7A mainly in providing the transistors 70a and 70b closer to the substrate 31 than the insulating layer 83. FIG. 8A illustrates an example including two structure bodies having different heights (the structure body 14a and the structure body 14b).

One of a source and a drain of the transistor 70a is electrically connected to the conductive layer 23 provided over the insulating layer 81 through an opening provided in the insulating layer 81. In addition, the alignment film 53a is provided over the conductive layer 23.

The transistor 70b is electrically connected to the conductive layer 91 through the connection portion 80. The EL layer 92, the conductive layer 93b, and the conductive layer 93a are stacked to cover the conductive layer 91.

Here, a surface of the conductive layer 91 on the substrate 21 side is substantially aligned with a surface of the insulating layer 83 on the substrate 21 side, and a difference in level at their boundary is extremely small. Thus, an insulating layer covering the end portion of the conductive layer 91 (the insulating layer 84), which is shown in FIG. 7A and the like, is not necessarily provided. Note that the insulating layer 84 may be provided.

In addition, here, the conductive layer 93a transmitting visible light is provided closer to the substrate 21 than the conductive layer 93b reflecting visible light. For example, the conductive layer 93a containing a metal oxide is provided to cover the surface of the conductive layer 93b containing a metal or an alloy, whereby oxidation of the conductive layer 93b can be inhibited and a highly reliable display device can be fabricated.

Moreover, as illustrated in FIG. 8A, the partition wall 11 may be provided not only in a region overlapping with the light-blocking layer 52 and the like but also in a region overlapping with the light-emitting element 90. At that time, light emitted from the light-emitting element 90 goes through the opening provided in the conductive layer 23, the partition wall 11, the coloring layer 51a, and the like and is emitted to the outside from the substrate 31 side.

[Modification Example 2]

Figure 8B:
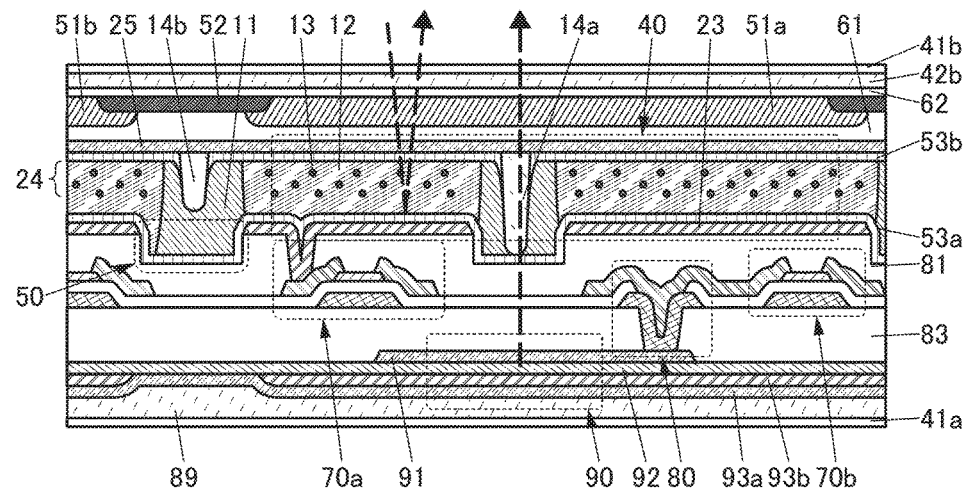

FIG. 8B shows a structural example partly different from that in FIG. 8A. Specifically, the insulating layer 62, the adhesive layer 42b, and the substrate 41b are provided instead of the substrate 31 and the substrate 41a is provided instead of the substrate 21.

With such a structure, a bendable display device can be fabricated.

[Cross-Sectional Structural Example 2-3]

Figure 9A:
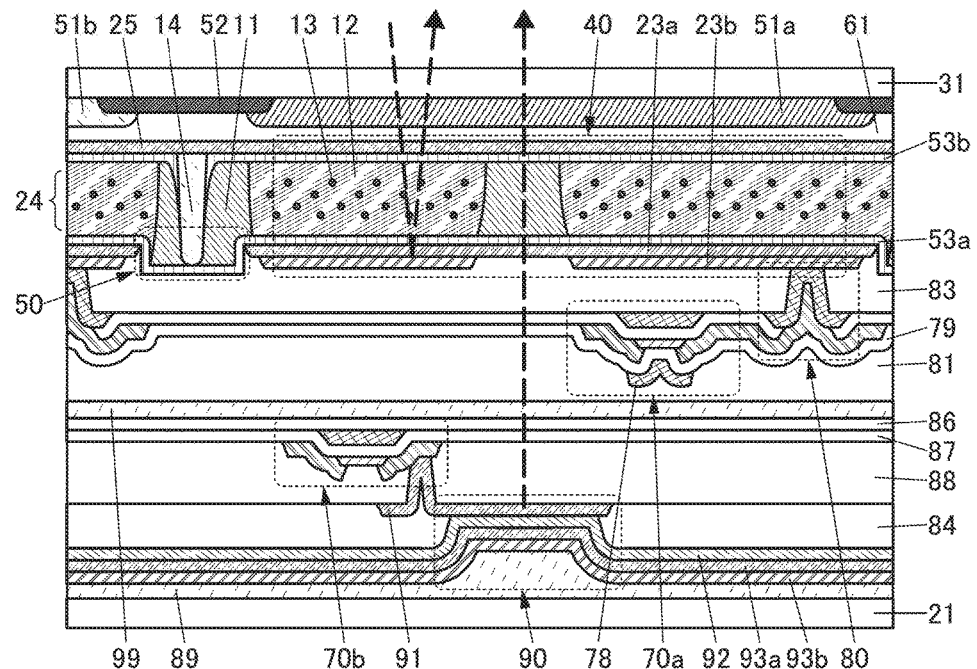
FIGS. 9A and 9B illustrate structural examples of a display device of one embodiment.

FIG. 9A is a schematic cross-sectional view of a display device described below as an example. The structure in FIG. 9A is different from that in FIG. 7A mainly in that the transistor 70a and the transistor 70b are provided over different insulating layers and an adhesive layer 99 is provided between the transistor 70a and the transistor 70b.

The transistor 70b is provided on one surface side of an insulating layer 86. The other surface of the insulating layer 86 is attached to the insulating layer 81 covering the transistor 70a, through the adhesive layer 99.

An insulating layer 87 and an insulating layer 88 are provided on one surface side of the insulating layer 86. The insulating layer 87 partly functions as a gate insulating layer of the transistor 70b. The insulating layer 88 is provided to cover the transistor 70b. The insulating layer 84 is provided to cover the insulating layer 88.

In addition, here, the transistor 70a includes a conductive layer 78 serving as a second gate and an insulating layer 79 serving as a second gate insulating layer. For the conductive layer 78, a conductive material blocking visible light is preferably used.

Although the substrate 21 and the substrate 31 are included in this example, those can be replaced with flexible substrates. For example, as illustrated in FIG. 7B, the substrate 21 can be replaced with the flexible substrate 41a. Moreover, the substrate 31 can be replaced with the insulating layer 62, the adhesive layer 42b, and the substrate 41b. This achieves a bendable display device.

[Cross-Sectional Structural Example 2-4]

Figure 9B:
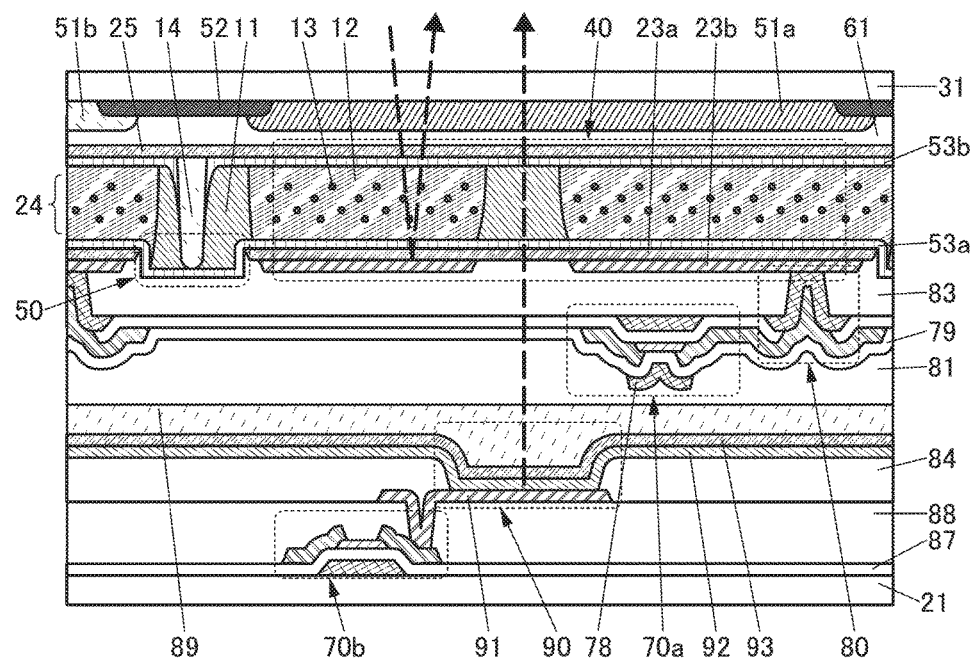

FIG. 9B is a schematic cross-sectional view of a display device described below as an example. The structure in FIG. 9B is different from that in FIG. 9A mainly in that the light-emitting element 90 is a top-emission light-emitting element, the components from the insulating layer 87 to the light-emitting element 90 are stacked in the reverse order, and the adhesive layer 99 is not included.

The substrates 21 and 31 are attached to each other with an adhesive layer 89. The adhesive layer 89 is provided to cover the light-emitting element 90 and has a function of sealing the light-emitting element 90.

The above is the description of Structural example 2.

[Manufacturing Method Example 1]
[Manufacturing Method Example 1-1]

Next, an example of a method for manufacturing the display device 10 illustrated in FIG. 1B will be described. FIGS. 10A to 10E and FIGS. 11A to 11C are schematic cross-sectional views each illustrating a stage of the steps in the method for manufacturing the display device 10.

Note that the thin films included in the display device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As an example of the thermal CVD method, a metal organic chemical vapor deposition (MOCVD) method may be used.

Alternatively, the thin films included in the display device (i.e., the insulating film, the semiconductor film, the conductive film, and the like) can be formed by a method such as spin coating, dipping, spray coating, ink-jetting, dispensing, screen printing, or offset printing, or with a tool (equipment) such as a doctor knife, a slit coater, a roll coater, a curtain coater, or a knife coater.

When the thin films included in the display device are processed, a photolithography method or the like can be used. Alternatively, island-shaped thin films may be formed by a film formation method using a blocking mask. Alternatively, the thin films may be processed by a nano-imprinting method, a sandblasting method, a lift-off method, or the like. As the photolithography method, there are a method in which a resist mask is formed over a thin film to be processed, the thin film is processed by etching or the like, and the resist mask is removed and a method in which a photosensitive thin film is formed, and the photosensitive thin film is exposed to light and developed to be processed in a desirable shape.

As light for exposure in a photolithography method, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used.

Instead of the light for the exposure, an electron beam can be used. It is preferable to use extreme ultra-violet light (EUV), X-rays, or an electron beam because extremely minute processing can be performed. Note that in the case of performing exposure by scanning of a beam such as an electron beam, a photomask is not needed.

For etching of the thin film, dry etching, wet etching, a sandblast method, or the like can be used.

[Formation of Transistor 70]

First, the conductive layer 71 is formed over the substrate 21. The conductive layer 71 can be formed in the following manner: a conductive film is formed, a resist mask is formed, the conductive film is etched, and the resist mask is removed.

Next, the insulating layer 73 is formed.

Then, the semiconductor layer 72 is formed. The semiconductor layer 72 can be formed in the following manner: a resist mask is formed after a semiconductor film is formed, the semiconductor film is etched, and the resist mask is removed.

Then, the conductive layer 74a and the conductive layer 74b are formed. The conductive layers 74a and 74b can be formed by a method similar to that of the conductive layer 71.

Through the above steps, the transistor 70 can be formed.

[Formation of Insulating Layer 81]

Figure 10A:
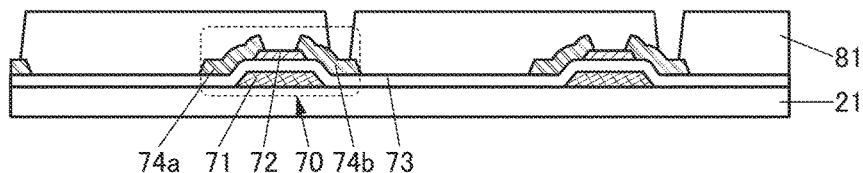
FIGS. 10A to 10E illustrate a method for manufacturing a display device of one embodiment.

Next, the insulating layer 81 is formed (FIG. 10A). When a photosensitive material is used for the insulating layer 81, an opening can be formed by a photolithography method or the like. An opening may be formed in such a manner that a resist mask is formed by a photolithography method or the like after the formation of the insulating layer 81 and part of the insulating layer 81 is etched. It is preferable to use an organic insulating material for the insulating layer 81 since flatness of the top surface thereof can be enhanced.

The insulating layer 81 may have a stacked-layer structure of an inorganic insulating film and an organic insulating film.

[Formation of Conductive Layer 23 and Depression Portion 50]

Figure 10B:
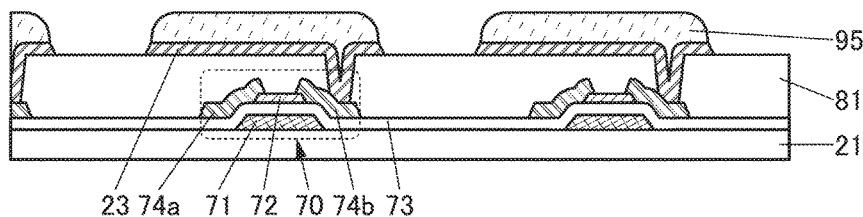

Next, a conductive film to be the conductive layer 23 is formed over the insulating layer 81. Then, a resist mask 95 is formed over the conductive layer 23. After that, a portion of the conductive film which is not covered with the resist mask 95 is etched, whereby the conductive layer 23 is formed (FIG. 10B).

Figure 10C:
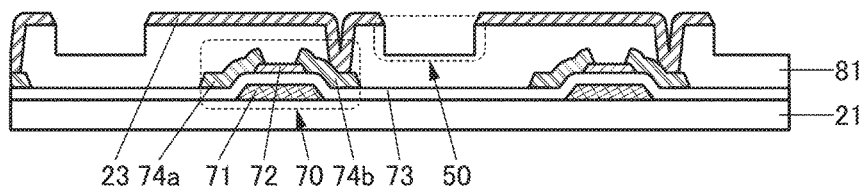

Then, the depression portion 50 is formed in the insulating layer 81 (FIG. 10C). The depression portion 50 can be formed by etching part of a top portion of the insulating layer 81 with the use of the resist mask 95 as an etching mask.

The depression portion 50 is preferably formed by a dry etching method. In particular, in the case where an organic insulating material is used for the insulating layer 81, plasma treatment (ashing treatment) in an oxygen-containing atmosphere is preferably performed. When the insulating layer 81 is processed by the ashing treatment, the etching selectivity of the insulating layer 81 to the conductive layer 23 can be high, whereby the conductive layer 23 can be prevented from being etched.

Note that when the depression portion 50 is formed, the resist mask 95 may be used as a mask or the resist mask 95 may be removed and the conductive layer 23 may be used as a hard mask.

[Formation of Alignment Film 53a]

Figure 10D:
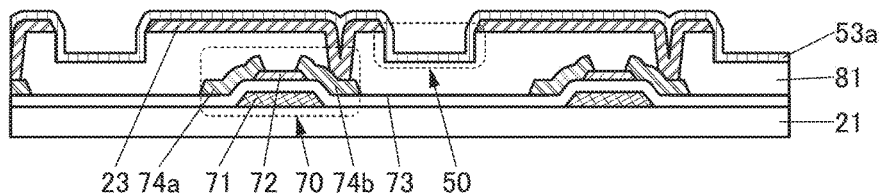

Then, the alignment film 53a is formed (FIG. 10D). A thin film to be the alignment film 53a is formed and then rubbing treatment is performed, whereby the alignment film 53a can be formed.

[Formation of Light-Blocking Layer 52, Coloring Layer 51a, and Coloring Layer 51b]

Next, the light-blocking layer 52 is formed over the substrate 31. The light-blocking layer 52 may be formed by a method similar to those of the conductive layer 71 and the like in which a conductive film is processed or by a method similar to those of the insulating layer 81 and the like in which a metal material or a resin material including a pigment or a dye is used.

Then, the coloring layer 51a, the coloring layer 51b, and the like are formed. The coloring layers 51a and 51b can be formed by a method similar to those of the insulating layer 81 and the like.

Note that the coloring layers 51a and 51b may be formed before the light-blocking layer 52 is formed. At this time, part of the light-blocking layer 52 preferably covers end portions of the coloring layers 51a and 51b.

[Formation of Insulating Layer 61, Conductive Layer 25, and Alignment Film 53b]

Then, the insulating layer 61 is formed to cover the light-blocking layer 52, the coloring layers 51a and 51b, and the like. The insulating layer 61 has a function as an overcoat preventing impurities contained in the coloring layer 51a and the like from diffusing into the liquid crystal layer 24. In addition, the insulating layer 61 may have a function as a planarization layer covering the steps of the surfaces of the light-blocking layer 52, the coloring layers 51a and 51b, and the like. Note that the insulating layer 61 is not necessarily provided.

Then, the conductive layer 25 is formed over the insulating layer 61. The conductive layer 25 can be formed by a method similar to those of the conductive layer 71 and the like. Alternatively, the island-shaped conductive layer 25 may be formed by a film formation method using a blocking mask.

Figure 10E:
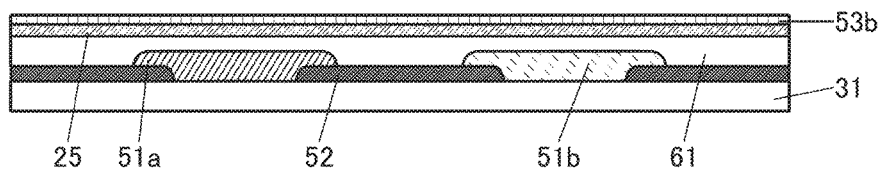

Then, the alignment film 53b is formed over the conductive layer 25 (FIG. 10E). The alignment film 53b can be formed by a method similar to that of the alignment film 53a.

Note that the above-described steps of forming the substrate 21 side and the above-described steps of forming the substrate 31 side can be separately performed.

[Attachment of Substrates 21 and 31]

Next, an adhesive layer for bonding the substrates 21 and 31 is formed on either or both of the substrate 21 and the substrate 31. The adhesive layer is formed to surround a region in which a pixel is positioned. The adhesive layer can be formed by a screen printing method, a dispensing method, or the like. For the adhesive layer, a thermosetting resin, an ultraviolet curable resin, or the like can be used. Alternatively, a resin which is cured when heated after pre-cured by ultraviolet light or the like may be used. Alternatively, a thermosetting and ultraviolet curable resin or the like may be used.

Next, a composition to be the liquid crystal layer 24 is dropped in a region surrounded by the adhesive layer by a dispensing method or the like. Specifically, a composition including the liquid crystal 12, the monomer 13, and the polymerization initiator is dropped. Furthermore, the composition may include a chiral material and the like.

Then, the substrate 21 and the substrate 31 are attached so that the composition to be the liquid crystal layer 24 is interposed therebetween, and the adhesive layer is cured. The attachment is preferably performed in a reduced-pressure atmosphere because air bubbles and the like can be prevented from entering between the substrate 21 and the substrate 31.

Note that the composition to be the liquid crystal layer 24 may be injected in a reduced-pressure atmosphere through a space provided in the adhesive layer after the substrates 21 and 31 are attached to each other. In addition, after the composition to be the liquid crystal layer 24 is dropped, a particulate gap spacer may be positioned in a region where the pixel is provided or outside the region, or a composition containing the gap spacer may be dropped.

Figure 11A:
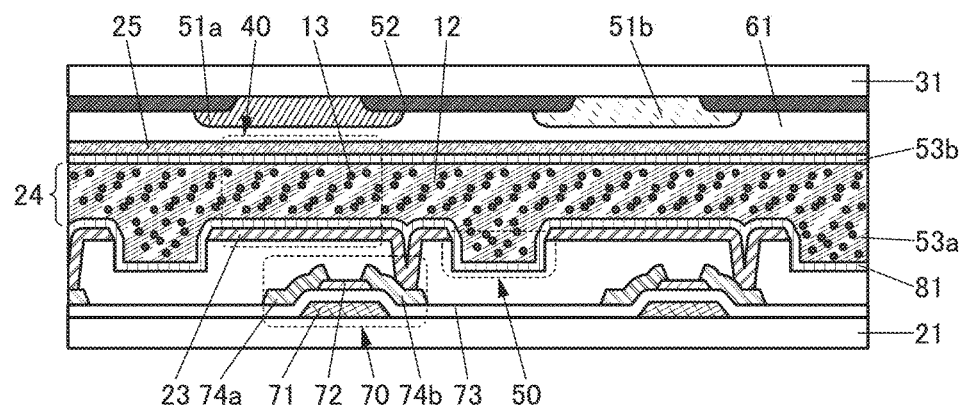
FIGS. 11A to 11C illustrate a method for manufacturing a display device of one embodiment.

At this time, the liquid crystal element 40 including the conductive layer 23, the conductive layer 25, and the liquid crystal 12 is formed (FIG. 11A). Note that at this time, the partition wall 11 is not formed yet and the concentration of the monomers 13 included in the liquid crystal layer 24 is high.

Figure 11B:
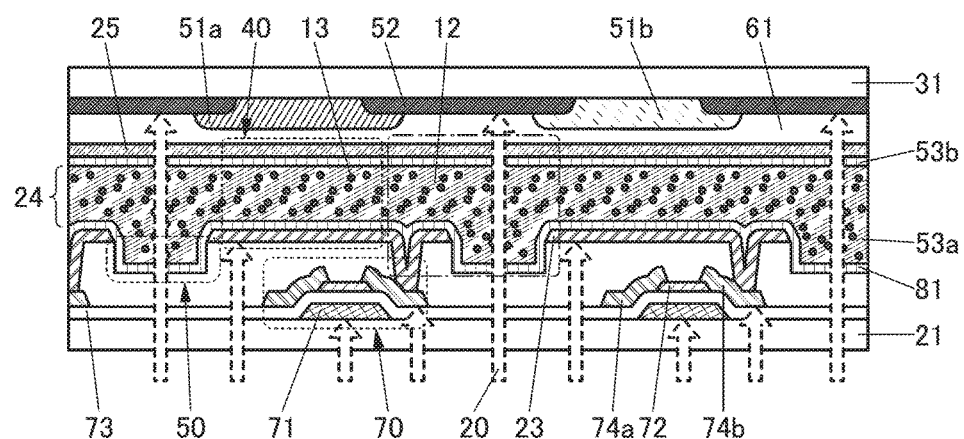

Next, light 20 is emitted from the substrate 21 side (FIG. 11B).

As the light 20, light with a wavelength and intensity with which the polymerization initiator reacts can be used. For example, as the light 20, ultraviolet light with a wavelength of 100 nm to 400 nm can be used. Light with a wavelength of 200 nm to 400 nm is preferably used because absorption due to the air can be suppressed. Typically, light with a wavelength of 254 nm, light with a wavelength of 365 nm, light with a wavelength of 385 nm, and the like are preferable. The light 20 can be generated using a light source such as a high-pressure mercury lamp, a low-pressure mercury lamp, a metal halide lamp, a xenon lamp, or an LED. Not only a lamp and an LED, but also a laser such as an excimer laser may be used as a light source.

As the light 20, light which is as close to parallel light as possible is preferably used so that the light is perpendicularly incident on the surface of the substrate 21. In particular, in the case where a plurality of light sources are used because the substrate 21 is large, for example, the light might be incident in an oblique direction. In that case, a slit or the like for making the light from the light source close to parallel light is preferably provided between the light source and the substrate 21.

As illustrated in FIG. 11B, in a region where the conductive layer 23 is not provided, the light 20 is emitted to the liquid crystal layer 24. On the other hand, in a region where the conductive layer 23 is provided, the light 20 is blocked by the conductive layer 23 and does not reach the liquid crystal layer 24. In addition, the light 20 is blocked by not only the conductive layer 23 but also the conductive layer 71, the conductive layer 74a, the conductive layer 74b, and the like.

Here, the transistor 70 has a bottom-gate structure in which the conductive layer 71 serving as a gate is positioned on the substrate 21 side. Thus, the light 20 is blocked by the conductive layer 71 and is not emitted to the semiconductor layer 72, so that a change in electrical characteristics of the transistor 70 can be prevented. In the case where the transistor 70 has a top-gate structure, it is preferable that a member which blocks the light 20 be provided under the semiconductor layer 72 or a conductive layer serving as a second gate be provided under the semiconductor layer 72.

Figure 12:
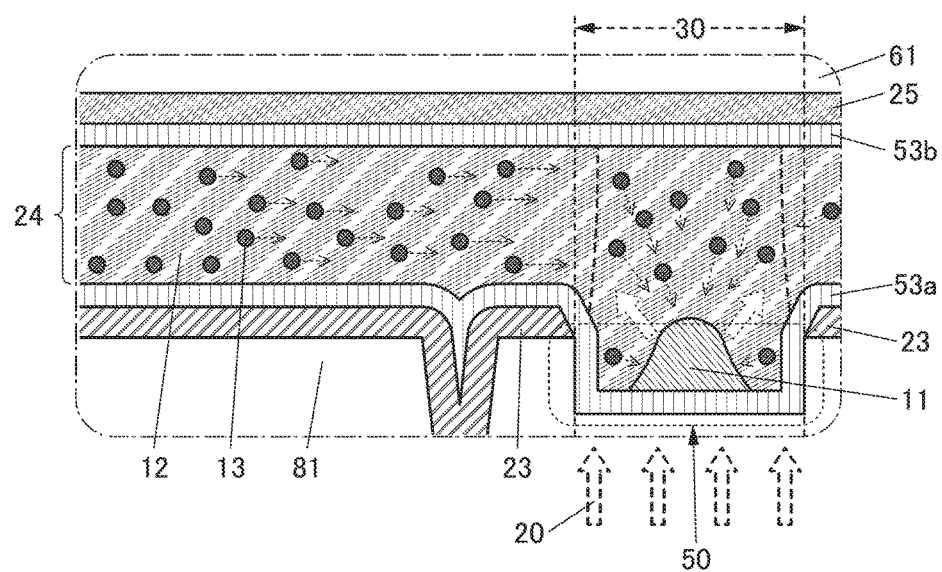
FIG. 12 illustrates a method for manufacturing a display device of one embodiment.

FIG. 12 is an enlarged view of a region denoted by dashed-dotted line in FIG. 11B. FIG. 12 is a conceptual diagram of a process in which the light 20 starts to be emitted and the polymerization of the monomers 13 proceeds.

A region to which the light 20 is emitted without being blocked by the conductive layer 23 and the like is referred to as an irradiation region 30. In the irradiation region 30, when the light 20 is emitted, radicals are generated by the polymerization initiator in the liquid crystal layer 24, and thus the monomers 13 start to be polymerized. As the polymerization proceeds, the partition wall 11 containing a polymer grows as illustrated in FIG. 12.

Here, in accordance with the polymerization of the monomers 13, the concentration of the monomers 13 included in the liquid crystal layer 24 in and in the vicinity of the irradiation region 30 is lowered and there may be concentration distribution where the concentration of the monomers 13 increases as the distance from the irradiation region 30 increases. The monomers 13 are diffused from where the concentration of the monomers 13 is higher to where the concentration of the monomers 13 is lower to uniform the concentration distribution in some cases. In that case, some of the monomers 13 are diffused in the liquid crystal layer 24 toward the irradiation region 30 as illustrated in FIG. 12. Thus, the concentration of the monomers 13 in the liquid crystal layer 24 in a region overlapping with the conductive layer 23 after the irradiation with the light 20 is lower than that before the irradiation. In the case where the concentration of the monomers 13 included in the liquid crystal layer 24 before the irradiation with the light 20 is sufficiently low or the monomers 13 are easily diffused into the liquid crystal layer 24, the concentration of the monomers 13 after the irradiation with the light 20 is too low to be detected in some cases.

The optimal concentration of the monomers 13 in the liquid crystal layer 24 before the irradiation with the light 20 can be determined in accordance with the area of the irradiation region 30 with the light 20. For example, when the area proportion of the irradiation region 30 to a region where pixels are arranged (also referred to as a display region) is $\alpha$ % ($\alpha > 0$), the weight concentration of the monomers 13 in the liquid crystal layer 24 is preferably set within a range from ($\alpha-x$) wt % to ($\alpha+x$) wt %. Alternatively, the volume concentration of the monomers 13 in the liquid crystal layer 24 is preferably set within a range from ($\alpha-x$) % to ($\alpha+x$) %. Here, $x=0.5\alpha$ is satisfied, $x=0.3\alpha$ is preferably satisfied, and $x=0.2\alpha$ is further preferably satisfied. As a result, the concentration of the monomers 13 in the liquid crystal layer 24 in a portion functioning as the liquid crystal element 40 after the irradiation with the light 20 can be reduced.

When the polymerization of the monomers 13 proceeds, in the irradiation region 30, the partition wall 11 in contact with both the alignment film 53a and the alignment film 53b is formed. The partition wall 11 has a function of bonding the alignment film 53a to the alignment film 53b.

As illustrated in FIG. 12, the depression portion 50 of the insulating layer 81 is positioned between the conductive layers 23, so that the light 20 passes through the depression portion 50. Therefore, the partition wall 11 grows in a region overlapping with the depression portion 50. Accordingly, after the irradiation with the light 20, the partition wall 11 can grow to have a shape that fits or fills the depression portion 50, whereby adhesion strength can be extremely high.

Although the partition wall 11 grows from the alignment film 53a side to the alignment film 53b side in FIG. 12, FIG. 12 is only a conceptual diagram and the process of growth of the partition wall 11 can have a variety of types. For example, the partition wall 11 grows while millions of small polymers formed in the liquid crystal layer 24 are connected, in some cases. Alternatively, the intensity of the light 20 is so high that reaches the alignment film 53b with a sufficient intensity or the light 20 is reflected by the light-blocking layer 52 and emitted to the liquid crystal layer 24 again, the polymer may grow from not only the alignment film 53a side but also the alignment film 53b side. The polymer and the polymer which grows from the alignment film 53a side are connected to and combined with each other to form the partition wall 11 in some cases. Which process of growth the partition wall 11 is formed through can be roughly determined from the cross-sectional shape or the like of the partition wall 11.

Figure 11C:
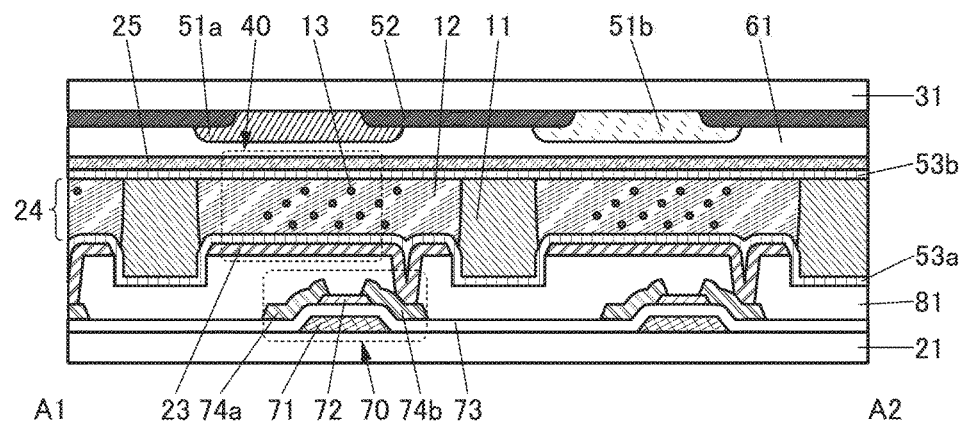

Through the above steps, the display device 10 can be manufactured (FIG. 11C). FIG. 11C and FIG. 1B are the same.

In the above-described manufacturing method, depending on the irradiation condition of the light 20 or due to the scattering of the light 20, the partition wall 11 is formed also in a region overlapping with a region located inward from the outline of the conductive layer 23, in some cases. Similarly, part of the partition wall 11 may be provided to overlap with a region overlapping with the members which block the light 20, such as the conductive layer 74a, the conductive layer 74b, and the conductive layer 71.

Here, in a region overlapping with the conductive layer 23, there may be concentration distribution where the concentration of the monomers 13 decreases as the distance from the partition wall 11 decreases and the concentration of the monomers 13 increases as the distance from the partition wall 11 increases.

Furthermore, in a region overlapping with the conductive layer 23, the polymerization initiator which does not react remains in some cases. In that case, when both the monomers 13 and the polymerization initiator remain in the liquid crystal layer 24, the polymerization reaction of the monomers 13 might occur because of ultraviolet light contained in external light, or the like. However, in the display device 10, the coloring layer 51a and the like are provided closer to the display surface side than the liquid crystal layer 24; thus, the ultraviolet light contained in external light can be prevented from reaching the liquid crystal layer 24. Therefore, even when the monomers 13 and the polymerization initiator remain, the polymerization reaction does not occur in the usage environment, and a highly reliable display device can be fabricated.

The above is the description of Manufacturing method example 1-1 of the display device.

[Manufacturing Method Example 1-2]

A manufacturing method example of the display device shown in Cross-sectional structural example 1-2 is described below with reference to FIGS. 13A to 13C.

First, as in Manufacturing method example 1-1, layers and a film from the conductive layer 71 to the alignment film 53a are sequentially formed over the substrate 21.

In addition, layers from the light-blocking layer 52 to the conductive layer 25 are sequentially formed over the substrate 31.

Next, the structure body 14a and the structure body 14b are formed over the conductive layer 25. First, an insulating film to be the structure body 14a and the structure body 14b is formed. For the insulating film, a photosensitive resin is preferably used. The insulating film can be formed by a spin coating method, for example.

Next, the insulating film is exposed to light through a photomask, and then developed and baked, whereby the structure body 14a and the structure body 14b can be formed.

Here, for the insulating film, a positive photosensitive material, a portion of which not irradiated with light remains after development, is preferably used. Moreover, a photomask with which the width of the structure body 14b is narrower than that of the structure body 14a is preferably used. Accordingly, in a region to be the structure body 14b, part of light used for exposure tends to be emitted even to a portion blocked from light. As a result, the structure body 14b which is lower than the structure body 14a can be formed in a self-aligned manner.

In order to form the structure body 14a and the structure body 14b having different heights, an exposure technique using a half-tone mask or a multi-tone mask such as a gray-tone mask or a multiple exposure technique using two or more photomasks may be used instead of the above-described method.

Figure 13A:
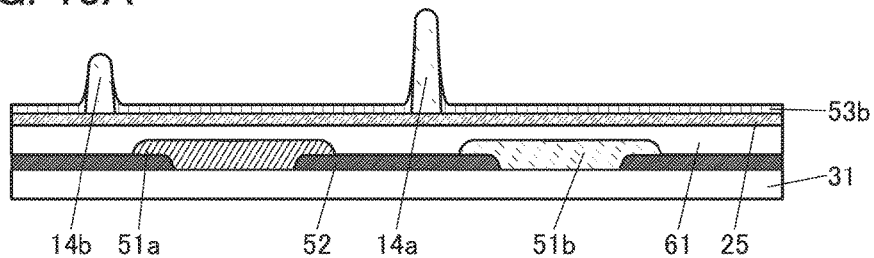
FIGS. 13A to 13C illustrate a method for manufacturing a display device of one embodiment.

Then, the alignment film 53b is formed to cover the structure body 14a and the structure body 14b and the conductive layer 25 (FIG. 13A).

Then, the substrate 21 and the substrate 31 are attached to each other as in Manufacturing method example 1-1.

Figure 13B:
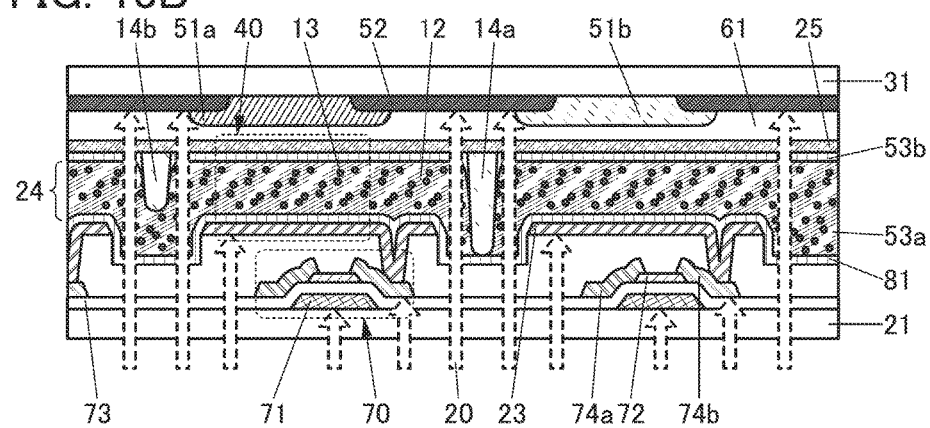

Then, the light 20 is emitted from the substrate 21 side (FIG. 13B).

The light 20 is emitted to a region which is not blocked by the conductive layer 23 and the like. Here, since the structure body 14a and the structure body 14b are provided in a position not overlapping with the conductive layer 23, the light 20 is emitted to a region including the side surfaces of the structure body 14a and the structure body 14b. Thus, the partition wall 11 is formed to surround the structure body 14a and the structure body 14b.

When the monomers 13 are polymerized to form the polymer, the polymer may grow from a surface which is in contact with the liquid crystal layer 24 in which the monomers 13 are dispersed. Here, since the structure body 14a and the structure body 14b are provided between the alignment film 53b and the conductive layer 25, the contact area between the alignment film 53b and the liquid crystal layer 24 in a region which is irradiated with the light 20 is large compared with the case where the structure body 14a and the structure body 14b are not provided. As a result, compared with the case where the structure body 14a and the structure body 14b are not provided, the polymer is easily formed; thus, the formed partition wall 11 easily becomes the polymer with high density and high strength.

Figure 13C:
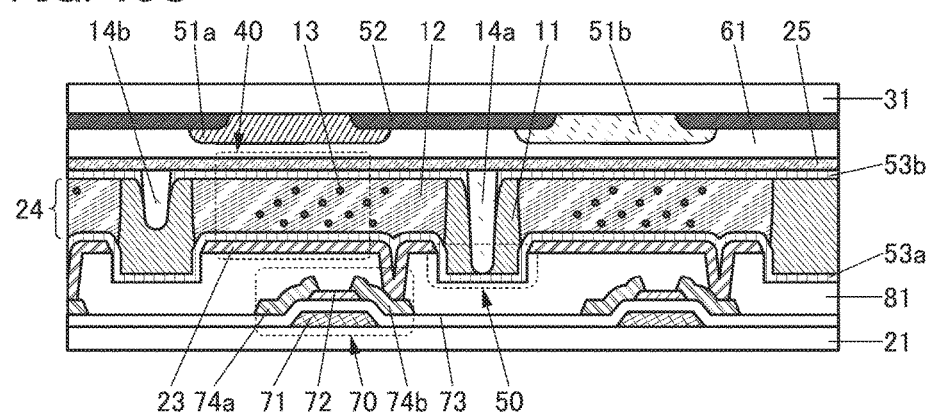

Through the above steps, the display device can be manufactured (FIG. 13C). FIG. 13C and FIG. 5 are the same.

In the structure illustrated in FIG. 13C and the like, the distance between the substrate 21 and the substrate 31 can be kept with the partition wall 11 and the structure body 14a and the structure body 14b positioned inward from the partition wall 11. Thus, in the display device, the physical strength against external force is increased and the change of the cell gap due to external force is suppressed.

The above is the description of Manufacturing method example 1-2.

[Manufacturing Method Example 1-3]

A manufacturing method example of the display device shown in Cross-sectional structural example 1-3 is described below with reference to FIGS. 14A to 14C and FIGS. 15A to 15C.

First, a separation layer 43a and the insulating layer 82 are formed in this order over a support substrate 44a.

As the support substrate 44a, a substrate having rigidity high enough to be easily transferred in a device or between devices can be used. In addition, a substrate which is resistant to heat in the manufacturing process is used. For example, a glass substrate with a thickness greater than or equal to 0.3 mm and less than or equal to 1 mm can be used.

As materials used for the separation layer 43a and the insulating layer 82, materials with which separation is performed at an interface between the separation layer 43a and the insulating layer 82 or in the separation layer 43a can be selected.

For example, it is possible to use a stack of a layer containing a high-melting-point metal material, such as tungsten, and a layer containing an oxide of the metal material as the separation layer 43a, and a stack of layers of inorganic insulating materials, such as silicon nitride, silicon oxide, silicon oxynitride, and silicon nitride oxide, as the insulating layer 82. Note that in this specification, oxynitride contains more oxygen than nitrogen, and nitride oxide contains more nitrogen than oxygen. A high-melting-point metal material is preferably used for the separation layer 43a because in the process after that, treatment at high temperature can be performed and there are more materials and formation methods to choose from.

When a stack of a tungsten layer and a tungsten oxide layer is used as the separation layer 43a, separation can be performed at an interface between the tungsten layer and the tungsten oxide layer, in the tungsten oxide layer, or at an interface between the tungsten oxide layer and the insulating layer 82.

The structures of the separation layer 43a and a layer thereover to be separated are not limited thereto, and any of a variety of materials can be selected.

Then, as in Manufacturing method example 1-1, layers and a film from the conductive layer 71 to the alignment film 53a are sequentially formed over the insulating layer 82.

Figure 14A:
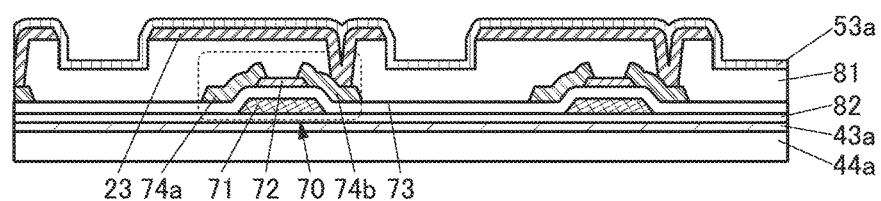
FIGS. 14A to 14C illustrate a method for manufacturing a display device of one embodiment.

FIG. 14A illustrates a schematic cross-sectional view at this stage.

Next, a separation layer 43b and the insulating layer 62 are formed in this order over a support substrate 44b.

For the support substrate 44b, a material similar to that used for the support substrate 44a can be used. The separation layer 43b can be formed by a method similar to that of the separation layer 43a. The insulating layer 62 can be formed by a method similar to that of the insulating layer 82.

Then, over the insulating layer 62, the light-blocking layer 52, the coloring layers 51a and 51b, the insulating layer 61, the conductive layer 25, the structure body 14a, the structure body 14b, and the alignment film 53b are formed by a method similar to that described above.

Figure 14B:
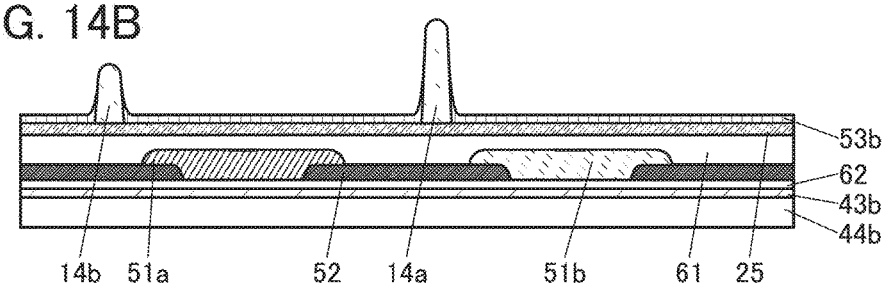

FIG. 14B illustrates a schematic cross-sectional view at this stage.

Then, the support substrate 44a and the support substrate 44b are attached to each other. The attachment can be performed by a method similar to that described above.

Figure 14C:
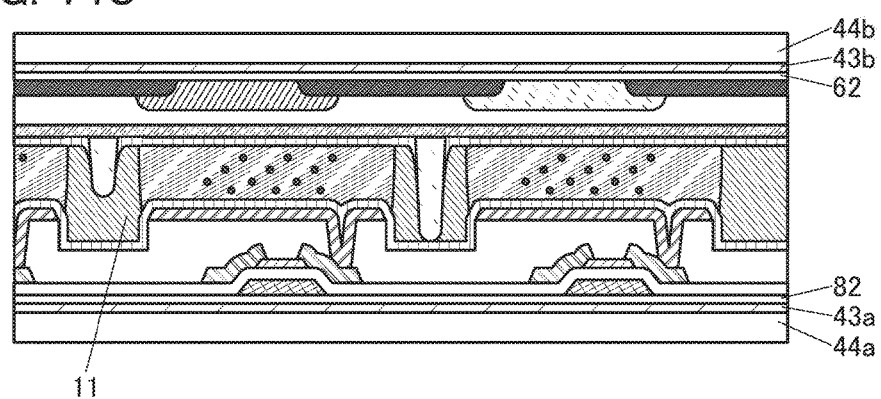

Next, the light 20 (not illustrated) is emitted from the support substrate 44a side to form the partition wall 11 (FIG. 14C).

Here, the light 20 needs to be emitted to reach the liquid crystal layer 24 through the separation layer 43a. For example, when a material containing a metal is used for the separation layer 43a, the light 20 is blocked and does not reach the liquid crystal layer 24 sufficiently in some cases. Thus, when a material containing a metal is used for the separation layer 43a, it is important to use a film thin enough to transmit the light 20 as the separation layer 43a and to set an appropriate irradiation condition of the light 20 in consideration of reflection and absorption by the separation layer 43a.

For example, when a stack of a tungsten film and a tungsten oxide film is used as the separation layer 43a, the thickness of the tungsten film is set to be greater than or equal to 1 nm and less than or equal to 50 nm, preferably greater than or equal to 1 nm and less than or equal to 30 nm, further preferably greater than or equal to 1 nm and less than or equal to 20 nm. As a result, the partition wall 11 can be formed without any special irradiation apparatus.

In addition, it is preferable that the output and the irradiation time of the irradiation apparatus be adjusted and the light 20 be emitted under a condition where the energy of light reaching the liquid crystal layer 24 is higher than or equal to 0.1 $J/cm^2$ and lower than or equal to 100 $J/cm^2$, preferably higher than or equal to 1 $J/cm^2$ and lower than or equal to 50 $J/cm^2$.

Figure 15A:
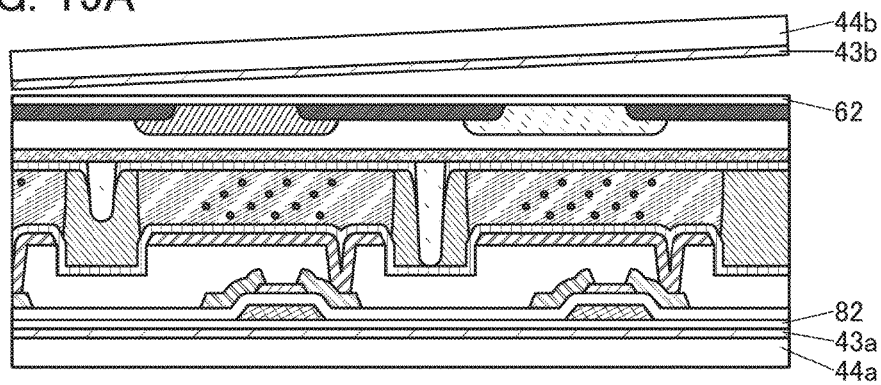
FIGS. 15A to 15C illustrate a method for manufacturing a display device of one embodiment.

Next, separation is performed between the insulating layer 62 and the separation layer 43b, whereby the support substrate 44b and the separation layer 43b are removed (FIG. 15A).

In this manner, the partition wall 11 is preferably formed before the separation is performed. Here, a plurality of partition walls 11, which bonds the substrate 21 to the insulating layer 62, are provided between adjacent pixels; thus, the adhesion strength between the substrate 21 and the insulating layer 62 is increased. Thus, the separation in the liquid crystal layer 24 is suppressed in the step of performing the separation, so that the support substrate 44b can be separated with a higher yield.

As the method for separating the support substrate 44b from the insulating layer 62, applying mechanical force, etching the separation layer, and making a liquid permeate the separation interface by dripping the liquid or soaking the support substrate 44b in the liquid are given as examples. Alternatively, separation may be performed by heating or cooling the support substrate 44b by utilizing a difference in thermal expansion coefficient of two layers which form the separation interface.

In addition, treatment for exposing part of the separation interface may be performed before the separation is performed. For example, with lasers or a sharp tool, part of the insulating layer 62 on the separation layer 43b is removed. Thus, a portion in which the insulating layer 62 is removed is used as a trigger to perform the separation.

After the separation, part of the separation layer 43b remains on the surface of the insulating layer 62 in some cases. In that case, the remaining separation layer 43b may be removed by washing, etching, wiping, or the like. When the remaining separation layer 43b has a high visible-light-transmitting property and does not affect the visibility, the remaining separation layer 43b is not necessarily removed. In that case, a layer containing an element that is contained in the separation layer 43b remains between the insulating layer 62 and the adhesive layer 42b, which is described later.

Then, the insulating layer 62 and the substrate 41b are attached to each other with the adhesive layer 42b. For the adhesive layer 42b, a thermosetting resin, an ultraviolet curable resin, or the like can be used.

Figure 15B:
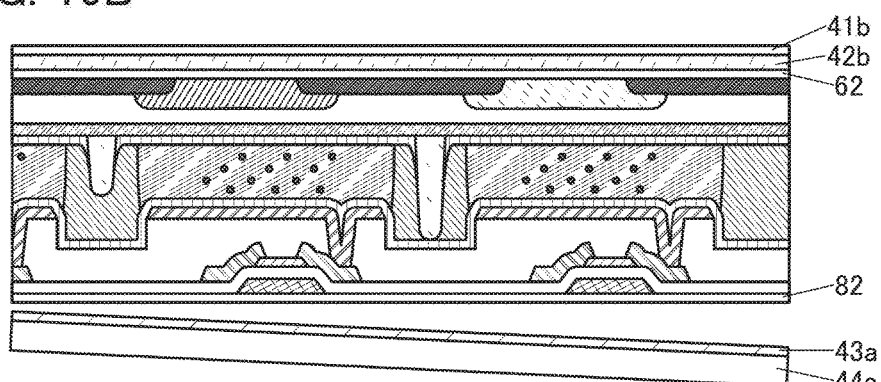

Next, separation is performed between the insulating layer 82 and the separation layer 43a by a method similar to that described above, whereby the support substrate 44a and the separation layer 43a are removed (FIG. 15B).

Then, the insulating layer 82 and the substrate 41a are attached to each other with the adhesive layer 42a. For the adhesive layer 42a, a material similar to that for the adhesive layer 42b can be used.

Figure 15C:
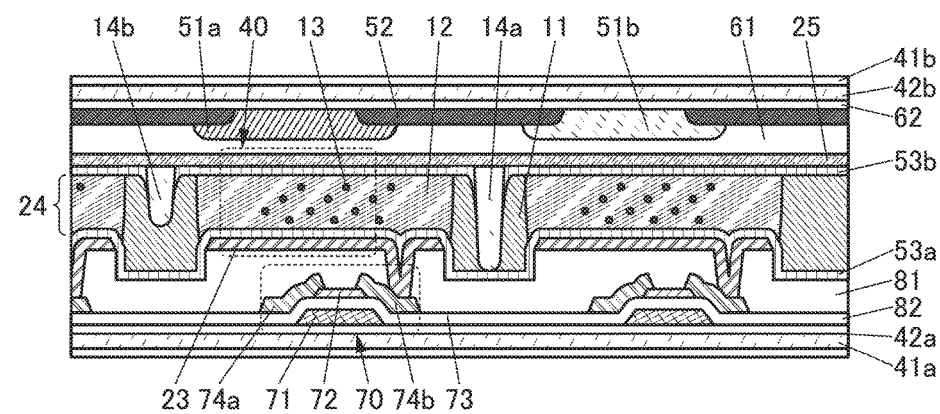

Through the above steps, the display device can be manufactured (FIG. 15C). FIG. 15C and FIG. 6A are the same.

Here, the process of removing the support substrate 44b and the separation layer 43b and attaching the substrate 41b are performed before the process of removing the support substrate 44a and the separation layer 43a and attaching the substrate 41a; however, the process of removing the support substrate 44a and the separation layer 43a and attaching the substrate 41a may be performed before the process of removing the support substrate 44b and the separation layer 43b and attaching the substrate 41b. Alternatively, these processes may be performed concurrently.

In the manufacturing method of the display device of one embodiment of the present invention, the relatively thick support substrate 44a is used when the transistor 70 and the conductive layer 23 are formed; thus, the display device is easily transferred and can be manufactured with a high yield. In addition, as compared with a method in which the transistor 70 and the like are formed directly over the thin substrate 41a, a high-temperature process can be performed to form the transistor 70 and insulating layers around the transistor 70. As a result, the impurities in and in the vicinity of the transistor 70 are reduced; thus, the transistor 70 can have very high reliability.

In the manufacturing method of the display device of one embodiment of the present invention, the relatively thick support substrate 44b is used when the coloring layer 51a, the light-blocking layer 52, and the like are formed; thus, the display device is easily transferred and can be manufactured with a high yield. In addition, with the support substrate 44b, a high temperature can be applied when the coloring layer 51a, the light-blocking layer 52, and the like are formed; thus, a highly reliable display device in which the concentration of impurities is reduced can be obtained. In addition, as compared with a method in which the coloring layer 51a, the light-blocking layer 52, and the like are formed directly over the thin substrate 41b, the above method can reduce an influence of expansion and contraction of the support substrate 44b due to heat can be reduced. In addition, the support substrate 44a and the support substrate 44b can be attached to each other with high positioning accuracy because the support substrate 44a and the support substrate 44b have rigidity. Thus, misalignment between the liquid crystal element 40 and the coloring layer 51a and the like can be prevented, and an extremely high-definition display device can be fabricated.

Furthermore, the support substrate 44b is separated and the substrate 41b with a thickness smaller than that of at least the support substrate 44b is attached thereto, whereby a thin and lightweight display device can be fabricated. In addition, the thin substrate 41b can be attached after the coloring layer 51a, the light-blocking layer 52, and the like are formed; thus, a material which has poor heat resistance can be used for the substrate 41b, and the range of choices of materials extends and any of a variety of materials can be used. Moreover, since the thickness of the substrate 41b which is on the display surface side is small, a display device having excellent optical characteristics such as display contrast, color reproducibility, and viewing angle dependence as compared with the case where a relatively thick glass substrate (for example, with a thickness greater than 0.3 mm) or the like is used can be fabricated.

The above is the description of Manufacturing method example 1-3.

[Manufacturing Method Example 1-4]

The display device illustrated as an example in FIG. 6B can be manufactured by replacing the process on the support substrate 44a side (the manufacturing steps of the separation layer 43a to the alignment film 53a) in Manufacturing method example 1-3 with the process similar to that in Manufacturing method example 1-1.

The above is the description of Manufacturing method example 1-4.

[MANUFACTURING METHOD EXAMPLE 1-5]

A manufacturing method example of the display device shown in Cross-sectional structural example 1-5 and FIG. 6C is described below.

Figure 16A:
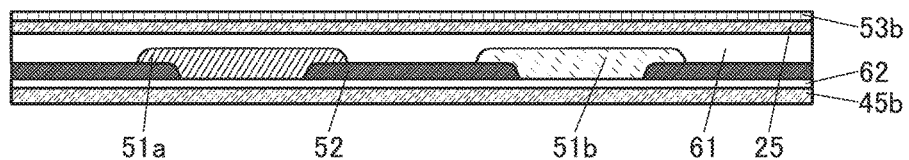
FIGS. 16A to 16C illustrate a method for manufacturing a display device of one embodiment.

First, the insulating layer 62, the light-blocking layer 52, the coloring layer 51a, the coloring layer 51b, the insulating layer 61, the conductive layer 25, and the alignment film 53b are formed over the resin layer 45b (FIG. 16A).

Then, a support substrate 44d is prepared. As the support substrate 44d, a material similar to that used for the above-described support substrates 44a and the like can be used.

Next, the resin layer 45a is formed over the support substrate 44d.

In order to form the resin layer 45a, first, a material to be the resin layer 45a is applied on the support substrate 44d. The application can be performed by a method such as spin coating, dipping, spray coating, ink-jetting, dispensing, screen printing, or offset printing, or with a tool (equipment) such as a doctor knife, a slit coater, a roll coater, a curtain coater, or a knife coater, for example.

The material contains a polymerizable monomer exhibiting a thermosetting property (also referred to as a thermopolymerization property) in which case polymerization proceeds by heat. The material may be a photosensitive material. In addition, the material preferably contains a solvent for adjusting the viscosity.

The material preferably contains a polymerizable monomer that becomes a polyimide resin, an acrylic resin, an epoxy resin, a polyamide resin, a polyimide amide resin, a siloxane resin, a benzocyclobutene-based resin, or a phenol resin after polymerization. That is, the formed resin layer 45a contains any of these resin materials. In particular, it is preferable that the material include a polymerizable monomer containing an imide bond and then a resin typified by a polyimide resin be used for the resin layer 45a because heat resistance and weather resistance can be improved.

Then, the support substrate 44d is heated to polymerize the applied material, whereby the resin layer 45a is formed. At this time, the solvent in the material is removed by the heating. The temperature at this heating is preferably higher than the highest temperature in the process for forming the transistor 70 and the like to be performed later. The heating is performed at a temperature of, for example, higher than or equal to 200° C. and lower than or equal to 700° C., higher than or equal to 300° C. and lower than or equal to 600° C., preferably higher than or equal to 350° C. and lower than or equal to 550° C., more preferably higher than or equal to 400° C. and lower than or equal to 500° C., and is typically 450° C. For the formation of the resin layer 45a, heating at such a temperature is performed in a state where the surface of the resin layer 45a is exposed, so that a gas that can be released from the resin layer 45a can be removed. Thus, release of the gas in the process for forming the transistor 70 and the like can be suppressed.

The thermal expansion coefficient of the resin layer 45a is preferably greater than or equal to 0.1 ppm/° C. and less than or equal to 20 ppm/° C., and more preferably greater than or equal to 0.1 ppm/° C. and less than or equal to 10 ppm/° C. The lower the thermal expansion coefficient of the resin layer 45a is, the more the breakage of the transistor or the like by stress caused by expansion or contraction due to heating can be suppressed.

The insulating layer 82 is formed over the resin layer 45a. Then, as in above-described Manufacturing method example 1-1, layers and a film from the conductive layer 71 to the conductive layer 23 are sequentially formed over the insulating layer 82.

Next, the structure body 14a and the structure body 14b are formed over the insulating layer 81. Here, at least part of each of the structure body 14a and the structure body 14b is preferably formed to overlap with the depression portion 50.

Then, the alignment film 53b is formed to cover the conductive layer 23, the insulating layer 81, the structure body 14a, the structure body 14b, and the like.

Figure 16B:
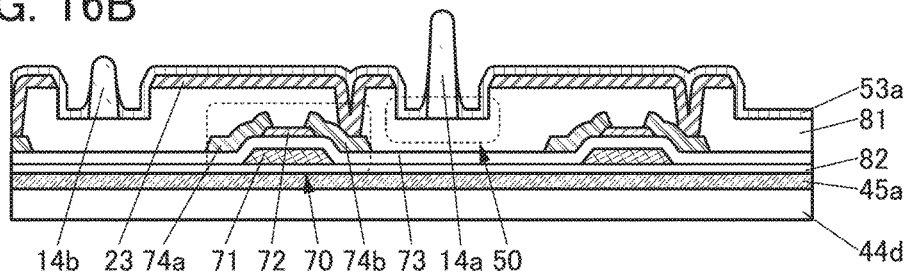

FIG. 16B illustrates a schematic cross-sectional view at this stage.

Subsequently, the support substrate 44d and the resin layer 45b are attached to each other. The attachment can be performed by a method similar to that described above.

Figure 16C:
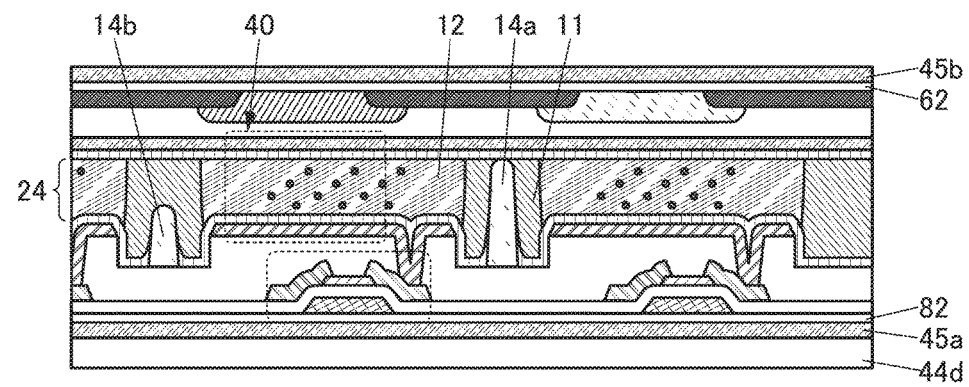

Next, the light 20 (not illustrated) is emitted from the support substrate 44d side to form the partition wall 11 (FIG. 16C).

Figure 17A:
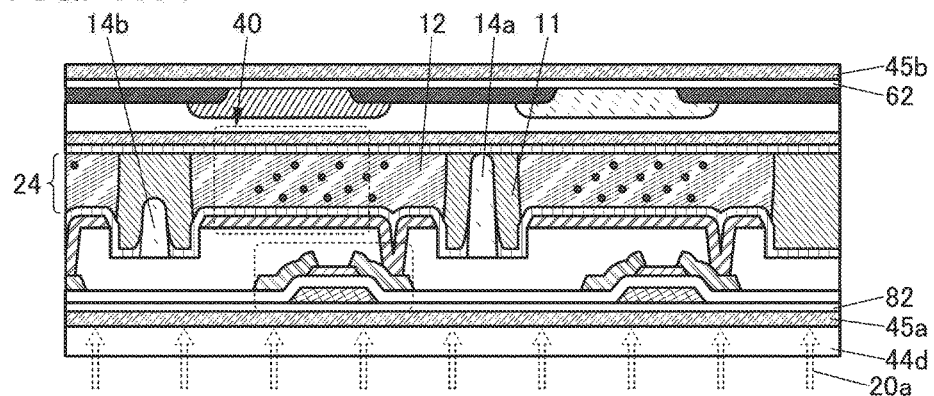
FIGS. 17A to 17C illustrate a method for manufacturing a display device of one embodiment.

Next, light 20a is emitted from the support substrate 44d side (FIG. 17A). By the irradiation with the light 20a, the vicinity of the surface of the resin layer 45a on the support substrate 44d side or part of the inside of the resin layer 45a is improved and the adhesion between the support substrate 44d and the resin layer 45a is reduced.

Laser light is favorably used for the light 20a. For example, it is preferable to perform the irradiation by scanning using linear laser light. By the method, the process time of the case of using the large support substrate 44d can be shortened. Note that a flash lamp or the like may be used as long as light whose energy is as high as that of laser light can be emitted.

Here, the light 20a used for reducing the adhesion of the resin layer 45a and the light 20 used for forming the partition wall 11 preferably have different wavelengths. In particular, the light 20 used for forming the partition wall 11 preferably has a wavelength which is hardly absorbed by the resin layer 45a. Specifically, the light 20a preferably has a shorter wavelength than the light 20.

Light with a wavelength longer than or equal to 350 nm is preferably used as the light 20 used for forming the partition wall 11, and light with a wavelength shorter than 350 nm is preferably used as the light 20a used for reducing the adhesion of the resin layer 45a, for example. Examples of the light 20 may include a solid-state UV laser (also referred to as a semiconductor UV laser), such as a UV laser with a wavelength of 355 nm (which is the third harmonic of an Nd:YAG laser), 365 nm, 375 nm, or 380 nm. As the light 20a, an excimer laser with a wavelength of 308 nm can be favorably used. The excimer laser is preferable because of its high productivity. Moreover, the excimer laser is preferable because the excimer laser can be used also for laser crystallization of LTPS, so that the existing LTPS production line device can be used and newly capital investment is not necessary.

As a laser, a CW (continuous wave) laser or a pulsed laser may be used. As the pulsed laser, a short time pulsed laser such as a nanosecond laser, a picosecond laser, or a femtosecond laser, or a longer time pulsed laser (for example, shorter than or equal to several hundreds of hertz) can be used.

In the case where a linear laser light is used as the light 20a, the light 20a is scanned and a region to be peeled is entirely irradiated with the light 20a by relatively moving the support substrate 44d and a light source. At this step, when irradiation is performed on the entire surface where the resin layer 45a is provided, the resin layer 45a can be peeled entirely and it is not necessary to cut the periphery portion of the support substrate 44d by scribing or the like in a subsequent separation step. Alternatively, it is preferable that the peripheral portion of the region where the resin layer 45a is provided have a region not irradiated with the light 20a because the adhesion of the region remains strong and separation of the resin layer 45a and the support substrate 44d can be suppressed at the irradiation with the light 20a.

Figure 17B:
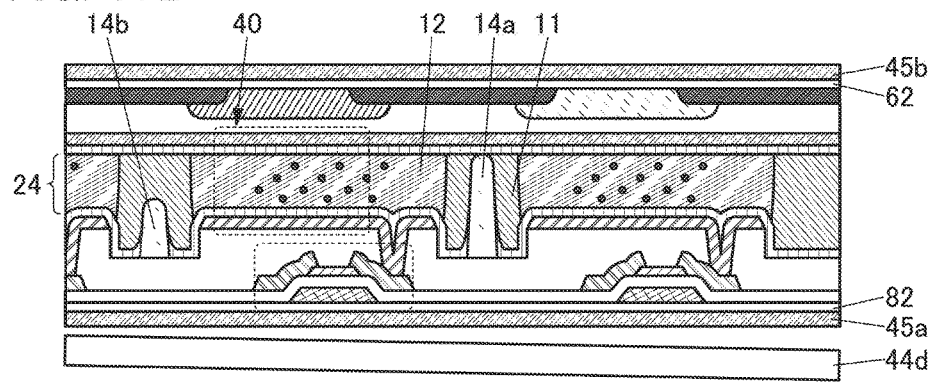

Next, the support substrate 44d and the resin layer 45a are separated from each other (FIG. 17B).

Separation can be performed by applying pulling force in the perpendicular direction to the support substrate 44d while the resin layer 45b is fixed to a stage. For example, the support substrate 44d can be separated by adsorbing part of a top surface of the support substrate 44d and pulling it upward. The stage may have any structure as long as the resin layer 45b can be fixed. For example, the stage may have an adsorption mechanism capable of vacuum adsorption, electrostatic adsorption, or the like or a mechanism physically fastening the resin layer 45b. Alternatively, separation may be performed by applying pulling force in the perpendicular direction to the resin layer 45b while the support substrate 44d is fixed to the stage.

Alternatively, separation may be performed by pressing a drum-shaped member with an adhesive surface against the top surface of the support substrate 44d or the resin layer 45b and rotating the member. At this time, the stage may be moved in the peeling direction.

Subsequently, the resin layer 45a and the substrate 41a are attached to each other with the adhesive layer 42a. Note that in the case where the resin layer 45a has a sufficient thickness and sufficient mechanical strength, the substrate 41a is not necessarily attached.

Figure 17C:
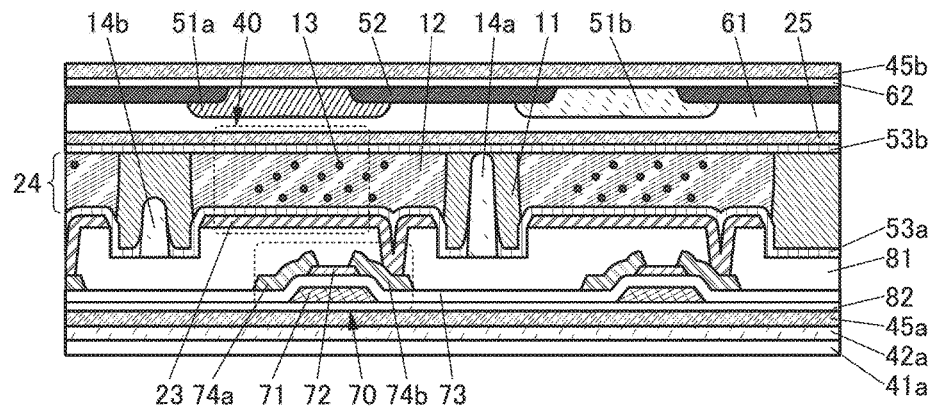

Through the above steps, the display device can be manufactured (FIG. 17C). FIG. 17C and FIG. 6C are the same.

The above is the description of Manufacturing method example 1.

[Manufacturing Method Example 2]
[Manufacturing Method Example 2-1]

A manufacturing method example of the display device illustrated in FIG. 7A is described below with reference to FIGS. 18A to 18D and FIGS. 19A and 19B.

First, a separation layer 43c is formed over a support substrate 44c. As the support substrate 44c, a substrate similar to the above-described support substrates 44a and 44b can be used. The separation layer 43c can be formed by a method similar to those of the above-described separation layers 43a and 43b.

Next, the conductive layer 23a is formed over the separation layer 43c. For the conductive layer 23a, an oxide conductive material is preferably used. When an oxide conductive material is used for the conductive layer 23a, separation can be suitably performed at an interface between the conductive layer 23a and the separation layer 43c. For the conductive layer 23a, a metal oxide, an oxide semiconductor material having low resistance, or the like can be used.

In the case where the oxide semiconductor material is used for the conductive layer 23a, oxygen vacancies are generated in the oxide semiconductor material by plasma treatment, heat treatment, or the like, whereby a carrier density may be increased. Alternatively, the carrier density may be increased by introducing impurities such as a rare gas of argon or the like, in addition to hydrogen and nitrogen, in the oxide semiconductor material. Alternatively, a material to which oxygen is easily diffused is used for the conductive layer 23b formed over the conductive layer 23a, whereby oxygen in the oxide semiconductor may be reduced. Note that two or more methods described above may be employed.

Then, the conductive layer 23b is formed over the conductive layer 23a. The conductive layer 23b can have a single-layer structure or a stacked-layer structure that contains a metal or an alloy material. In the case where the conductive layer 23b has a stacked-layer structure, a material having high reflectivity is preferably used for a layer in contact with the conductive layer 23a.

At that time, the conductive layer 23b is preferably processed to be positioned inward from the outline of the pattern of the conductive layer 23a so as not to be in contact with the separation layer 43c. When the conductive layer 23b and the separation layer 43c are in contact with each other, failure in separation may occur at the portion.

Next, the insulating layer 83 is formed to cover the separation layer 43c, the conductive layer 23a, and the conductive layer 23b. Then, an opening reaching the conductive layer 23b is formed in part of the insulating layer 83.

Figure 18A:
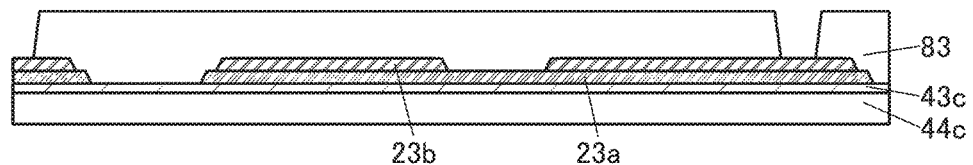
FIGS. 18A to 18D illustrate a method for manufacturing a display device of one embodiment.

FIG. 18A illustrates a schematic cross-sectional view at this stage.

Next, the transistors 70a and 70b are formed over the insulating layer 83. The transistors 70a and 70b can be formed by a method similar to that of Structural example 1.

In the step of forming gates of the transistors 70a and 70b, when a conductive film is formed and processed, the conductive layer electrically connected to the conductive layer 23b through the opening provided in the insulating layer 83 is formed at the same time. Thus, the connection portion 80 can be formed.

To electrically connect one of the source and the drain of the transistor 70a to the connection portion 80, an opening is formed in an insulating layer serving as a gate insulating layer of the transistor 70a and the like.

Then, the insulating layer 81 is formed to cover the transistors 70a and 70b. At this time, in the insulating layer 81, an opening reaching one of the source and the drain of the transistor 70b is formed. After that, the conductive layer 91 is formed over the insulating layer 81.

Figure 18B:
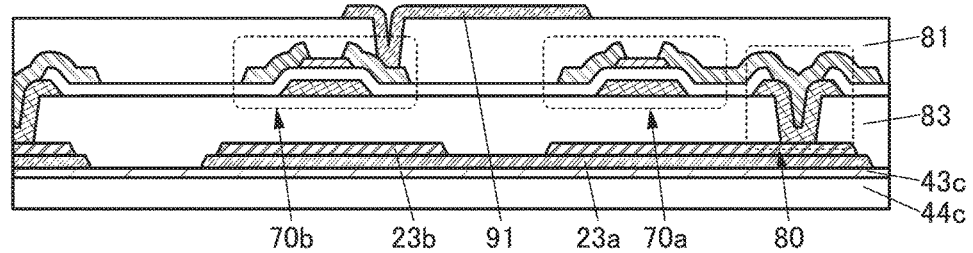

FIG. 18B illustrates a schematic cross-sectional view at this stage.

Then, the insulating layer 84 which covers the end portion of the conductive layer 91 and has an opening in a portion overlapping with the conductive layer 91 is formed. The insulating layer 84 covers the end portion of the conductive layer 91 and serves as a planarization layer. For the insulating layer 84, an organic resin is preferably used. In addition, an end portion of the insulating layer 84 preferably has a tapered shape.

Next, the EL layer 92 and the conductive layer 93a are formed in this order over the conductive layer 91 and the insulating layer 84. Then, the conductive layer 93b is formed over the conductive layer 93a.

The conductive layer 93b preferably has an opening through which the light 20 passes. For example, with a shadow mask such as a metal mask, the conductive layer 93b having the opening can be formed by a film formation method such as an evaporation method or a sputtering method.

Here, an example where the conductive layer 93b is formed after formation of the conductive layer 93a is shown; however, the conductive layer 93a may be formed after formation of the conductive layer 93b.

In addition, although not shown here, an insulating layer serving as a barrier film may be formed to cover the conductive layers 93a and 93b. The insulating layer is preferably formed by a film formation method capable of forming a dense film even at a low temperature, such as a sputtering method and an ALD method. In addition, the insulating layer may have a stacked-layer structure of a film containing an inorganic insulating material and a film containing an organic insulating material.

Then, the conductive layers 93a and 93b are attached to the substrate 21 with the adhesive layer 89.

Figure 18C:
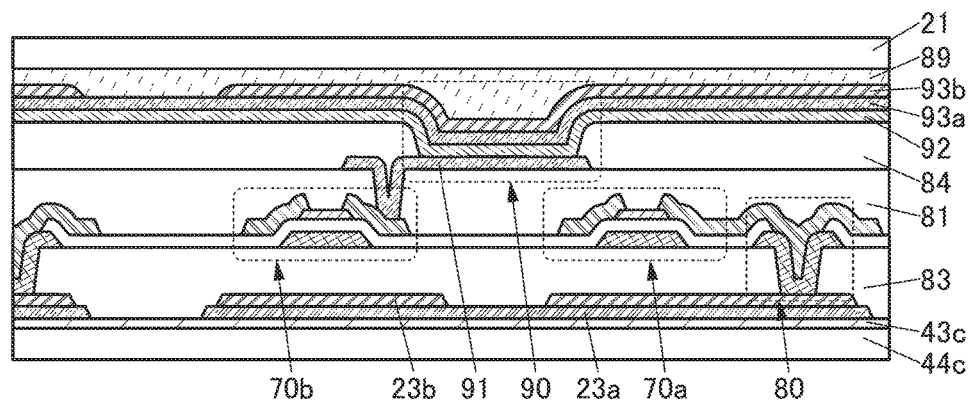

FIG. 18C illustrates a schematic cross-sectional view at this stage.

Figure 18D:
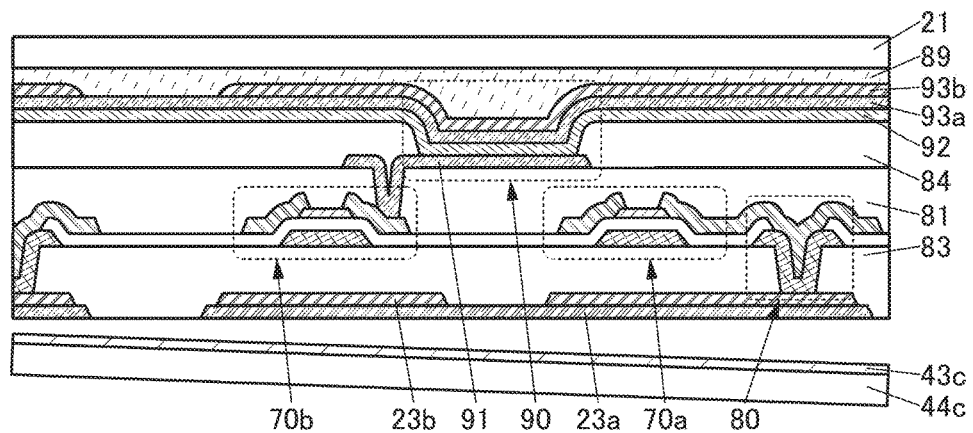

Next, separation is performed between the separation layer 43c and the insulating layer 83 and between the separation layer 43c and the conductive layer 23a, so that the support substrate 44c and the separation layer 43c are removed (FIG. 18D).

After the separation, part of the separation layer 43c remains on the surface of the conductive layer 23a and the surface of the insulating layer 83 and a thin film is formed in some cases. For example, when the remaining film has conductivity, the two conductive layers 23a between adjacent pixels, terminals formed by processing the same conductive film as the conductive layer 23a, or the like might be electrically short-circuited. In contrast, when the thin film has an insulating property, the surfaces of the conductive layer 23a, the above-described terminal, and the like are not exposed and their functions as the electrode and the terminal are lost in some cases. Thus, washing, etching, wiping, or the like is preferably performed after the separation. For the etching, either wet etching or dry etching can be used.

Then, part of the insulating layer 83 is etched using the conductive layer 23a as a hard mask, whereby the depression portion 50 is formed.

After that, the alignment film 53a is formed over the conductive layer 23a and the insulating layer 83.

Figure 19A:
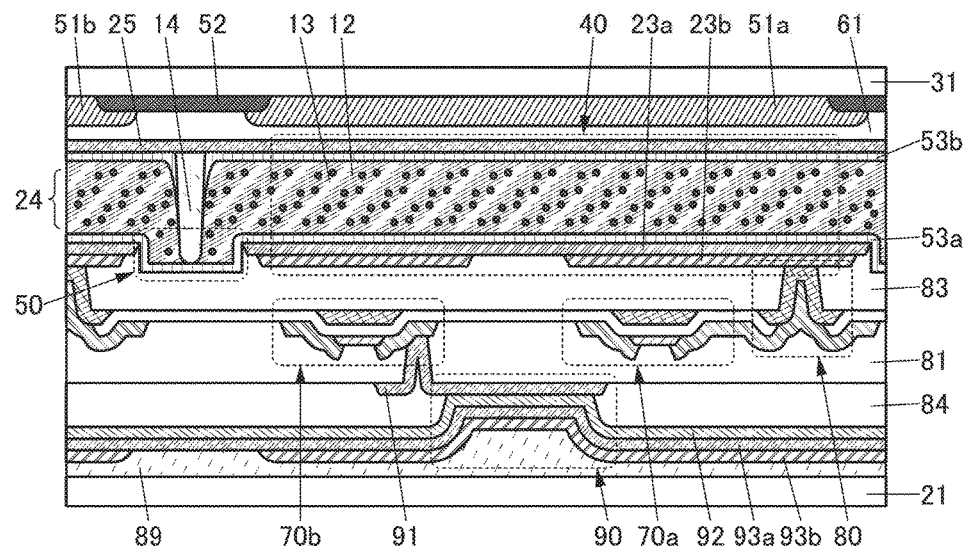
FIGS. 19A and 19B illustrate a method for manufacturing a display device of one embodiment.

Next, the substrate 31 over which the coloring layer 51a, the coloring layer 51b, the light-blocking layer 52, the insulating layer 61, the conductive layer 25, the structure body 14, and the alignment film 53b are formed in advance is prepared. Then, the substrate 31 and the substrate 21 are attached to each other with the liquid crystal layer 24 provided therebetween (FIG. 19A).

At that time, the opening in the conductive layer 93b can be positioned to overlap with a region between the adjacent two conductive layers 23b. In addition, the opening in the conductive layer 93b preferably overlaps with the light-blocking layer 52.

Note that the substrate 31 and the substrate 21 are preferably attached to each other so that the structure body 14 overlaps with the depression portion 50. When the attachment is performed so that the structure body 14 fits the depression portion 50, misalignment at the attachment can be suppressed.

Figure 19B:
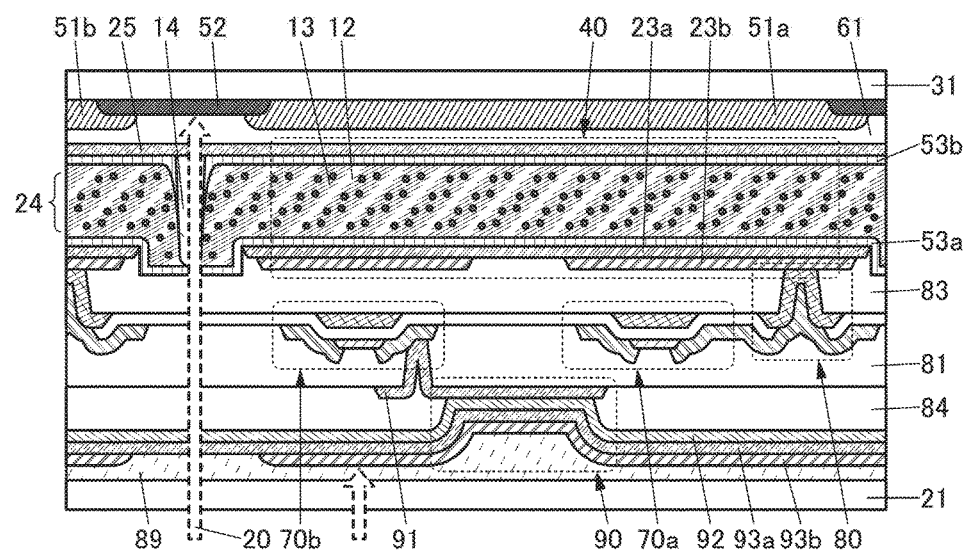

Then, the light 20 is emitted from the substrate 21 side (FIG. 19B). Here, the light 20 can be emitted to a portion of the liquid crystal layer 24 that overlaps with the opening in the conductive layer 93b in a self-aligned manner. In addition, the conductive layer 93b is provided on the substrate 21 side of the light-emitting element 90; thus, even when the light 20 is emitted from the substrate 21 side, the EL layer 92 and the like in the light-emitting element 90 can be inhibited from being irradiated with the light 20, and the light-emitting element 90 can be prevented from deteriorating.

Although not illustrated here, when the conductive layer 23b, the wiring, and the like are provided in a region overlapping with the opening in the conductive layer 93b, the light 20 is partly blocked by the conductive layer 23b and the wiring. That is, the partition wall 11 is formed in a region not overlapping with the conductive layer 23b, the conductive layer 93b, the wiring, or the like.

Through the above steps, the display device in FIG. 7A can be manufactured.

[Modification Example 1]

A manufacturing method example of the display device in FIG. 7B is described. For example, in the step of attaching the substrate 21 with the adhesive layer 89 in above-described Manufacturing method example 2-1, the substrate 41a is attached instead of the substrate 21. In addition, a substrate formed by stacking a separation layer and the insulating layer 62 over a support substrate is used instead of the substrate 31, the support substrate and the separation layer are removed after the formation of the partition wall 11, and the substrate 41b is attached to the insulating layer 62 with the adhesive layer 42b.

Note that in FIG. 7A, the substrate 21 is used as it is, and only the substrate 31 may be replaced with a stack of the insulating layer 62, the adhesive layer 42b, and the substrate 41b.

The above is the description of Modification example 1.

[Manufacturing Method Example 2-2]

A manufacturing method example of the display device illustrated in FIG. 8A is described below with reference to FIGS. 20A to 20C and FIGS. 21A and 21B.

First, the separation layer 43c is formed over the support substrate 44c, and the conductive layer 91 is formed over the separation layer 43c. The conductive layer 91 can be formed using a material and a method which are similar to those of the conductive layer 23a.

Next, the insulating layer 83 is formed to cover the conductive layer 91 and the separation layer 43c. Then, an opening reaching the conductive layer 91 is formed in the insulating layer 83.

Next, the transistors 70a and 70b are formed over the insulating layer 83. In the step of forming the gates of the transistors 70a and 70b, the conductive layer electrically connected to the conductive layer 91 is formed at the same time, so that the connection portion 80 is formed.

Then, after the insulating layer 81 is formed, the conductive layer 23 is formed over the insulating layer 81. Here, part of the insulating layer 81 is removed by etching at the same time as processing of the conductive layer 23, whereby the depression portion 50 is formed. After that, the alignment film 53a is formed to cover the conductive layer 23 and the insulating layer 81.

Figure 20A:
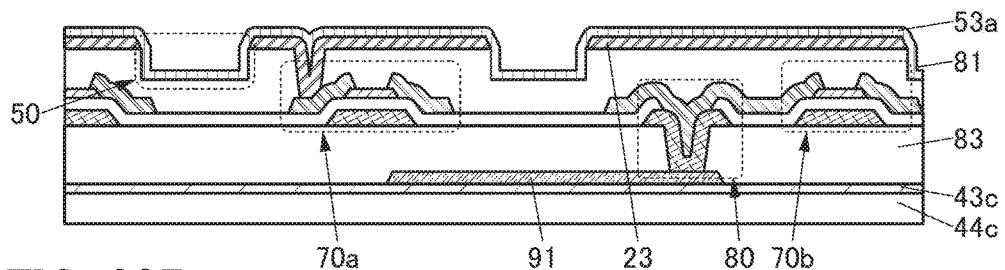
FIGS. 20A to 20C illustrate a method for manufacturing a display device of one embodiment.

FIG. 20A illustrates a schematic cross-sectional view at this stage.

Figure 20B:
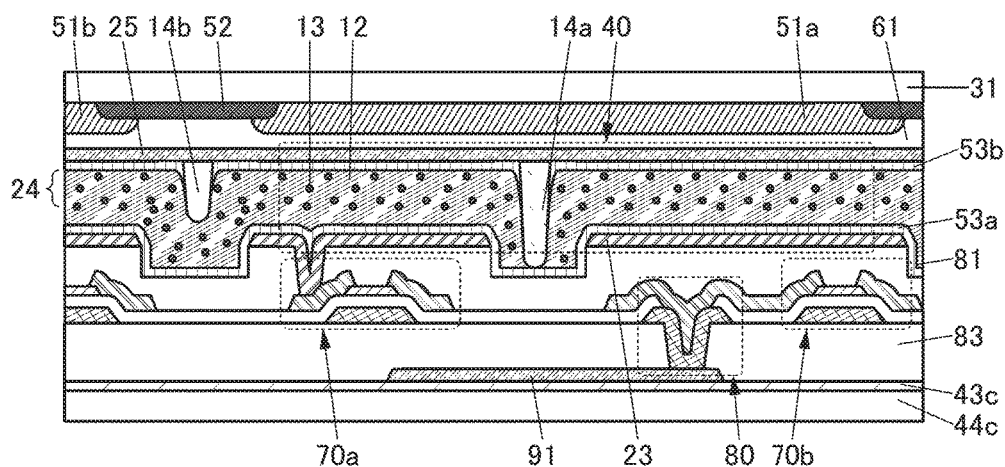

Next, by a method similar to that described above, the support substrate 44c and the substrate 31 are attached to each other with the liquid crystal layer 24 provided therebetween (FIG. 20B).

Figure 20C:
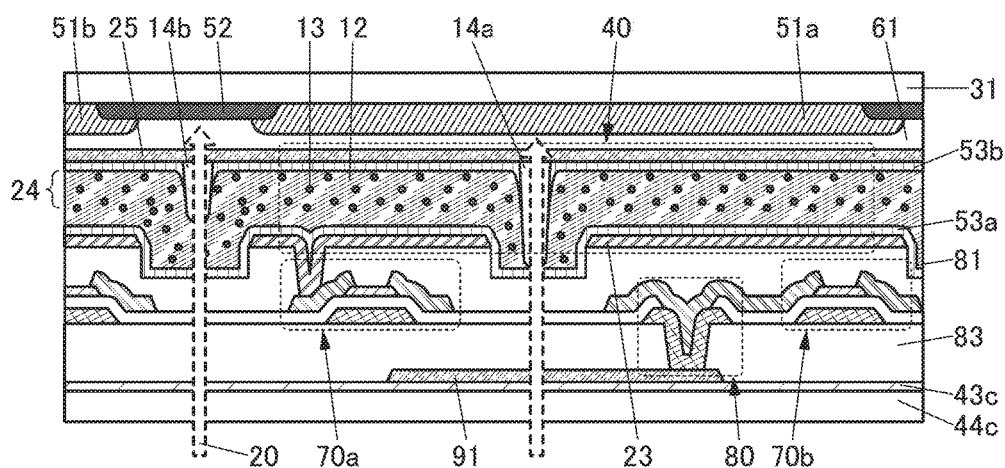

Then, the light 20 is emitted from the support substrate 44c side to form the partition wall 11 in the liquid crystal layer 24 (FIG. 20C).

At that time, in a region overlapping with the opening in the conductive layer 23, there is no member that blocks the light 20 between the support substrate 44c and the liquid crystal layer 24; thus, as illustrated in FIG. 20C, the light 20 is also emitted to part of the liquid crystal layer 24 overlapping with the region. As a result, the partition wall 11 overlapping with the opening in the conductive layer 23 is formed.

Figure 21A:
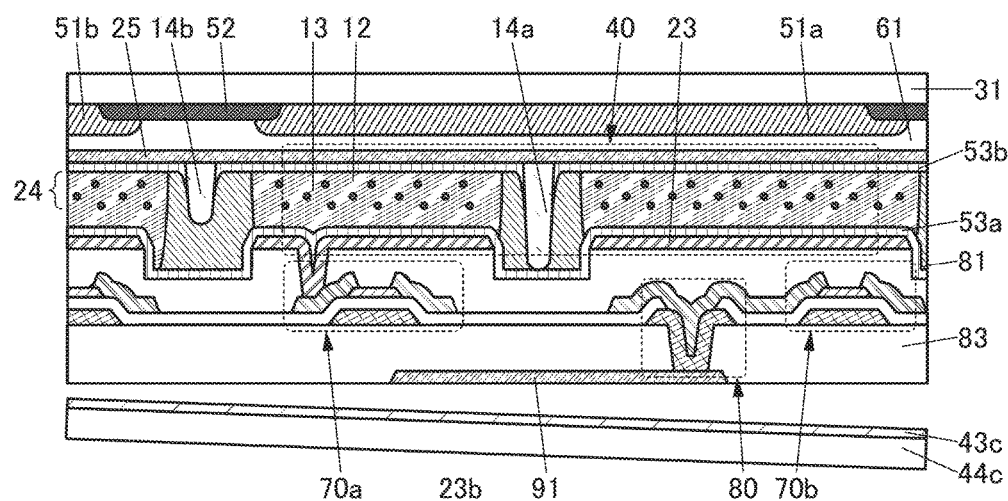
FIGS. 21A and 21B illustrate a method for manufacturing a display device of one embodiment.

Next, separation is performed between the separation layer 43c and the insulating layer 83 and between the separation layer 43c and the conductive layer 91, so that the support substrate 44c and the separation layer 43c are removed (FIG. 21A). Directly after that, treatment such as washing may be performed on the surface on which separation is performed.

Figure 21B:
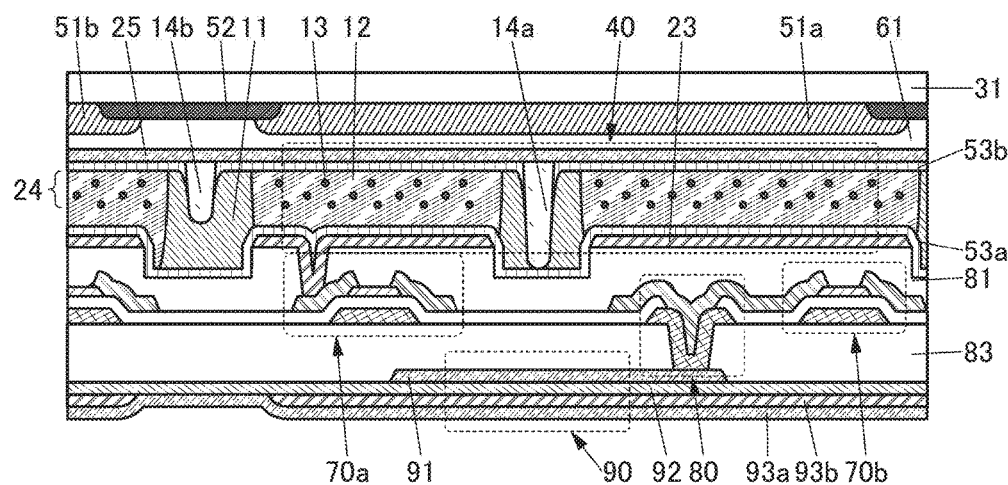

Next, the EL layer 92, the conductive layer 93b, and the conductive layer 93a are formed to cover the conductive layer 91 and the insulating layer 83 (FIG. 21B).

Note that the conductive layer 93b may be formed after the conductive layer 93a. In addition, after the formation of the conductive layers 93a and 93b, an insulating layer serving as a barrier film may be formed.

Then, the conductive layer 93a and the substrate 21 are attached to each other with the adhesive layer 89.

Through the above steps, the display device in FIG. 8A can be manufactured.

[Modification Example 2]

A manufacturing method example of the display device in FIG. 8B is described. For example, in the step of attaching the substrate 21 with the adhesive layer 89 in above-described Manufacturing method example 2-2, the substrate 41a is attached instead of the substrate 21. In addition, a substrate formed by stacking a separation layer and the insulating layer 62 over a support substrate is used instead of the substrate 31, the support substrate and the separation layer are removed after the formation of the partition wall 11, and the substrate 41b is attached to the insulating layer 62 with the adhesive layer 42b.

Note that in FIG. 8A, the substrate 21 is used as it is, and only the substrate 31 may be replaced with a stack of the insulating layer 62, the adhesive layer 42b, and the substrate 41b.

The above is the description of Modification example 2.

[Manufacturing Method Example 2-3]

A manufacturing method example of the display device shown in Cross-sectional structural example 2-3 is described below with reference to FIGS. 22A to 22E, FIGS. 23A and 23B, and FIGS. 24A to 24C.

Figure 22A:
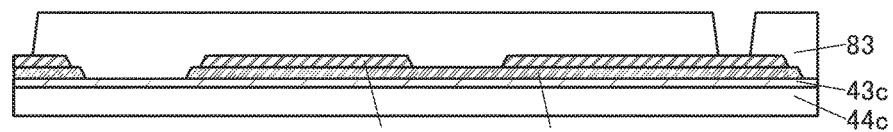
FIGS. 22A to 22E illustrate a method for manufacturing a display device of one embodiment.

First, the separation layer 43c, the conductive layer 23a, the conductive layer 23b, and the insulating layer 83 having an opening are formed over the support substrate 44c in a manner similar to that in above-described Manufacturing method example 2-1 (FIG. 22A).

Figure 22B:
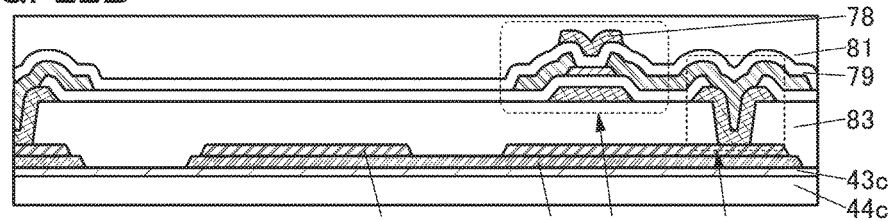

Next, the transistor 70a is formed over the insulating layer 83 and the insulating layer 81 is formed to cover the transistor 70a (FIG. 22B).

Figure 22C:
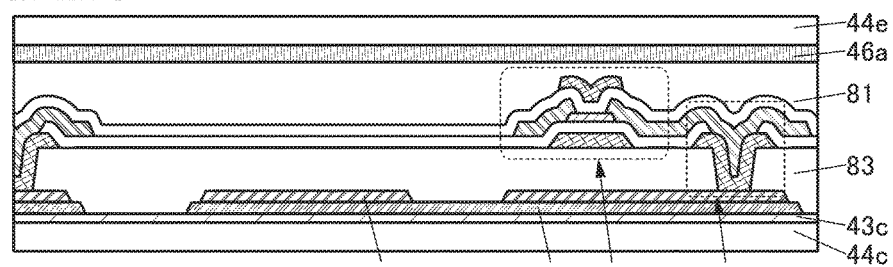

Then, a support substrate 44e and the insulating layer 81 are attached to each other with an adhesive layer 46a (FIG. 22C). For the support substrate 44e, a material similar to that used for the above-described support substrates 44a or the like can be used. For the adhesive layer 46a, a material which can be easily peeled in a later step is preferably used. For example, a viscous material, a double-sided tape, a silicone sheet, a water-soluble adhesive, or the like can be used for the adhesive layer 46a.

Figure 22D:
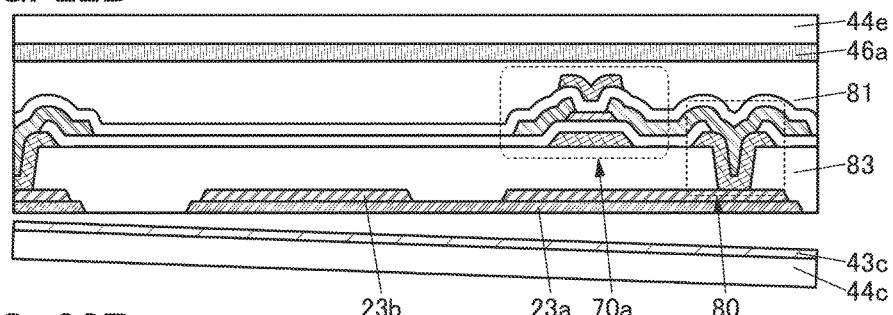

Next, separation is performed between the separation layer 43c and the insulating layer 83 and between the separation layer 43c and the conductive layer 23a, so that the support substrate 44c and the separation layer 43c are removed (FIG. 22D).

Then, part of the insulating layer 83 is etched using the conductive layer 23a as a hard mask, whereby the depression portion 50 is formed.

Figure 22E:
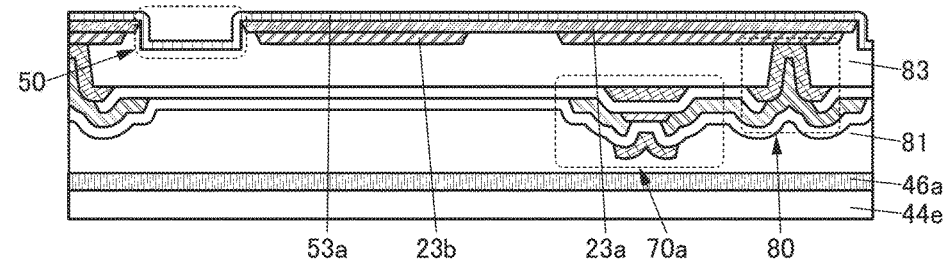

After that, the alignment film 53a is formed over the conductive layer 23a and the insulating layer 83 (FIG. 22E).

Next, the substrate 31 over which the coloring layer 51a, the coloring layer 51b, the light-blocking layer 52, the insulating layer 61, the conductive layer 25, the structure body 14, and the alignment film 53b are formed in advance is prepared. Then, the substrate 31 and the substrate 21 are attached to each other with the liquid crystal layer 24 provided therebetween.

Figure 23A:
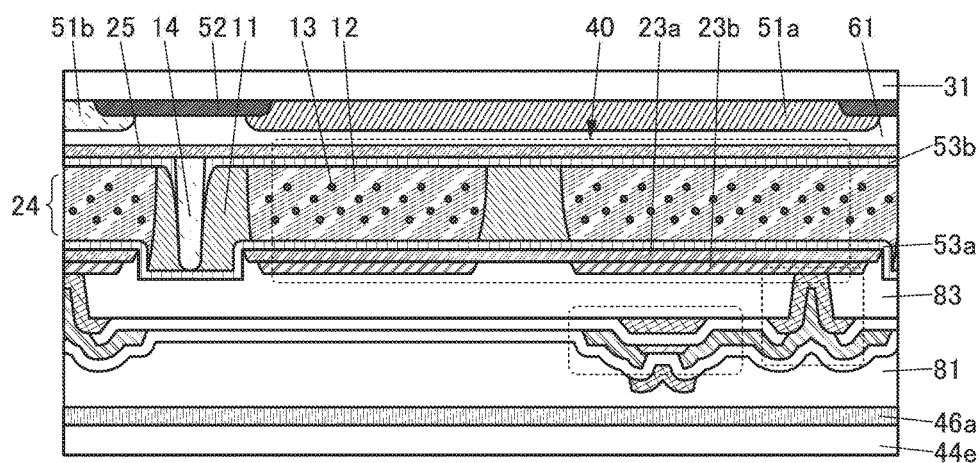
FIGS. 23A and 23B illustrate a method for manufacturing a display device of one embodiment.

Next, the light 20 (not illustrated) is emitted from the support substrate 44e side to form the partition wall 11 (FIG. 23A).

Figure 23B:
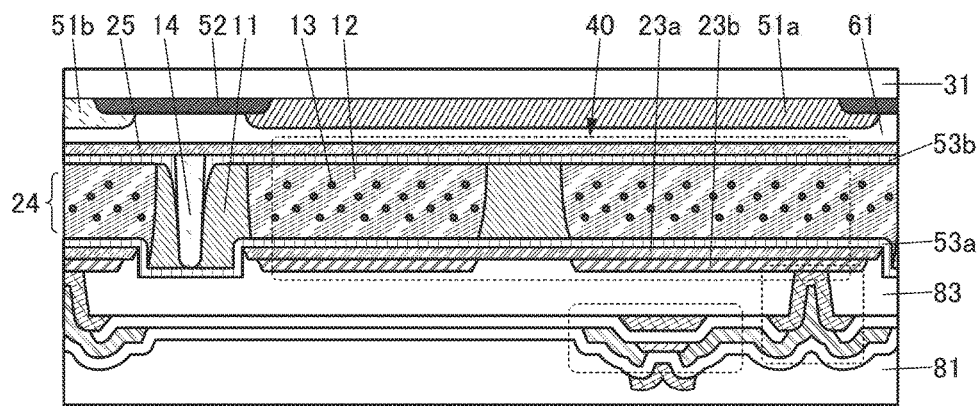

Subsequently, the adhesive layer 46a and the support substrate 44e are removed (FIG. 23B).

Figure 24A:
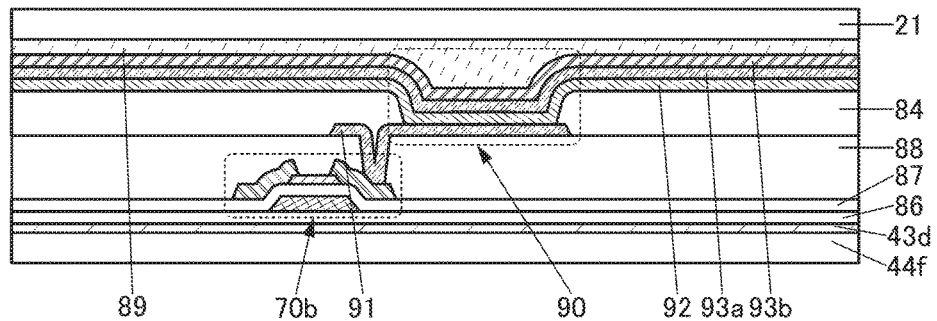
FIGS. 24A to 24C illustrate a method for manufacturing a display device of one embodiment.

In addition to the above, a support substrate 44f is prepared. A separation layer 43d, the insulating layer 86, the transistor 70b (including the insulating layer 87), the insulating layer 88, the conductive layer 91, the insulating layer 84, and the light-emitting element 90 are formed in this order over the support substrate 44f. After that, the substrate 21 covering the light-emitting element 90 is attached with the adhesive layer 89 (FIG. 24A).

Figure 24B:
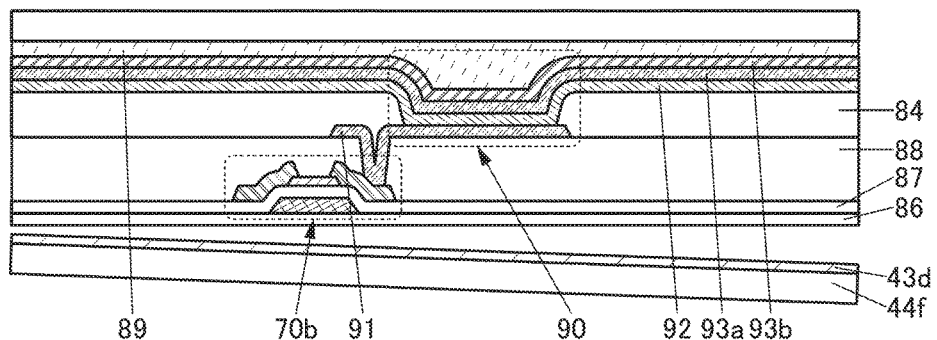

Next, the separation layer 43d and the support substrate 44f are removed (FIG. 24B).

Figure 24C:
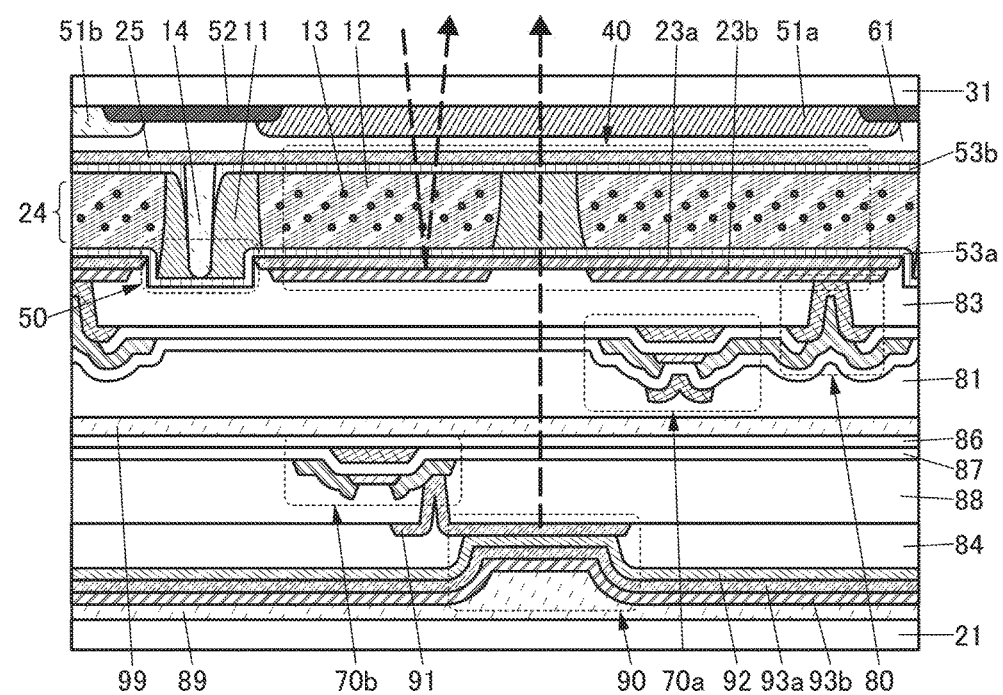

Then, the substrate 21 and the substrate 31 are attached to each other with the adhesive layer 99 (FIG. 24C).

Through the above-described steps, the display device can be manufactured. FIG. 24C and FIG. 9A are the same.

With the use of such a manufacturing method, the alignment film 53a can be formed at a high temperature (e.g., higher than or equal to 100° C.) because the light-emitting element 90 is not included when the alignment film 53a is formed. Therefore, the high-quality alignment film 53a can be formed.

[Manufacturing Method Example 2-4]

A manufacturing method example of the display device shown in Cross-sectional structural example 2-4 is described below with reference to FIGS. 25A and 25B. Here, different portions from those in Manufacturing method example 2-3 are described.

Figure 25A:
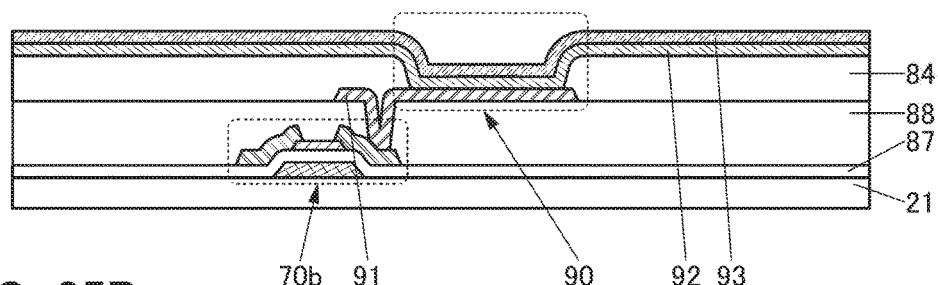
FIGS. 25A and 25B illustrate a method for manufacturing a display device of one embodiment.

As illustrated in FIG. 25A, the transistor 70b (including the insulating layer 87), the insulating layer 88, the conductive layer 91, the insulating layer 84, the EL layer 92, and a conductive layer 93 are formed in this order over the substrate 21.

Figure 25B:
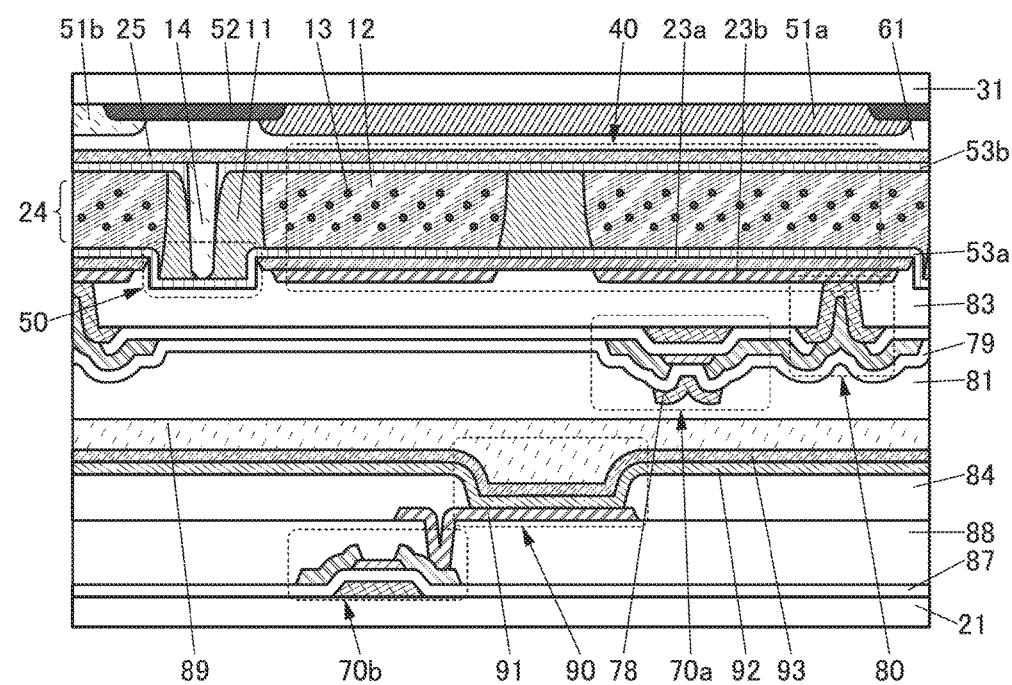

Next, the substrate 21 and the substrate 31 are attached to each other with the adhesive layer 89, whereby the display device can be manufactured (FIG. 25B). FIG. 25B and FIG. 9B are the same.

The above is the description of Manufacturing method example 2.

[Components]

The above components will be described below.

A material having a flat surface can be used as the substrate included in the display device. The substrate on the side from which light from the display element is extracted is formed using a material transmitting the light. For example, a material such as glass, quartz, ceramics, sapphire, or an organic resin can be used.

The weight and thickness of the display device can be decreased by using a thin substrate. A flexible display device can be obtained by using a substrate that is thin enough to have flexibility.

Since the substrate through which light emission is not extracted does not need to have a light-transmitting property, a metal substrate or the like can be used in addition to the above-mentioned substrates. A metal material, which has high thermal conductivity, is preferable because it can easily conduct heat to the whole substrate and accordingly can prevent a local temperature rise in the display device. To obtain flexibility and bendability, the thickness of a metal substrate is preferably greater than or equal to 10 µm and less than or equal to 200 µm, further preferably greater than or equal to 20 µm and less than or equal to 50 µm.

Although there is no particular limitation on a material of a metal substrate, it is favorable to use, for example, a metal such as aluminum, copper, and nickel, an aluminum alloy, or an alloy such as stainless steel.

It is preferable to use a substrate subjected to insulation treatment, e.g., a metal substrate whose surface is oxidized or provided with an insulating film. An insulating film may be formed by, for example, a coating method such as a spin-coating method and a dipping method, an electrodeposition method, an evaporation method, or a sputtering method. An oxide film may be formed over the substrate surface by a method such as an anodic oxidation method, exposing to or heating in an oxygen atmosphere, or the like.

Examples of the material that has flexibility and transmits visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE). It is particularly preferable to use a material with a low thermal expansion coefficient, for example, a material with a thermal expansion coefficient lower than or equal to $30 \times 10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display device using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are attached to each other with an adhesive layer may be used.

A hard coat layer (e.g., a silicon nitride layer and an aluminum oxide layer) by which a surface of a display device is protected from damage, a layer (e.g., an aramid resin layer) that can disperse pressure, or the like may be stacked over the flexible substrate. Furthermore, to suppress a decrease in the lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is used, a barrier property against water and oxygen can be improved and thus a highly reliable display device can be provided.

[Transistor]

The transistor includes a conductive layer serving as the gate electrode, the semiconductor layer, a conductive layer serving as the source electrode, a conductive layer serving as the drain electrode, and an insulating layer serving as the gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material used for the transistor, an element of Group 14 (e.g., silicon or germanium), a compound semiconductor, or an oxide semiconductor can be used, for example. Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because the off-state leakage current of the transistor can be reduced.

For the semiconductor layer, it is particularly preferable to use an oxide semiconductor including a plurality of crystal parts whose c-axes are aligned substantially perpendicular to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display panel is bent is prevented. Therefore, such an oxide semiconductor can be preferably used for a flexible display device which is used in a bent state, or the like.

Moreover, the use of such an oxide semiconductor with crystallinity for the semiconductor layer makes it possible to provide a highly reliable transistor with a small change in electrical characteristics.

A transistor with an oxide semiconductor whose band gap is larger than the band gap of silicon has a low off-state current; accordingly, charges stored in a capacitor that is series-connected to the transistor can be held for a long time. When such a transistor is used for a pixel, operation of a driver circuit can be stopped while a gray scale of each pixel is maintained. As a result, a display device with extremely low power consumption can be obtained.

The semiconductor layer and the conductive layer may include the same metal elements contained in the above oxides. The use of the same metal elements for the semiconductor layer and the conductive layer can reduce the manufacturing cost. For example, when metal oxide targets with the same metal composition are used, the manufacturing cost can be reduced, and the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the oxide semiconductor contained in the semiconductor layer is preferably 2 eV or more, further preferably 2.5 eV or more, and still further preferably 3 eV or more. With the use of an oxide semiconductor having such a wide energy gap, the off-state current of the transistor can be reduced.

In the case where the oxide semiconductor contained in the semiconductor layer contains an In—M—Zn oxide, it is preferable that the atomic ratio of metal elements of a sputtering target used for forming a film of the In—M—Zn oxide satisfy In≥M and Zn≥M. As the atomic ratio of metal elements of such a sputtering target, In:M:Zn=1:1:1, In:M:Zn=1:1:1.2, In:M:Zn=3:1:2, In:M:Zn=4:2:4.1 and the like are preferable. Note that the atomic ratio of the formed semiconductor layer varies from the above atomic ratio of metal elements of the sputtering target within a range of ±40% as an error.

An oxide semiconductor film with low carrier density is used as the semiconductor layer. For example, the semiconductor layer is an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the oxide semiconductor contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. Thus, a transistor including an oxide semiconductor which contains nitrogen is likely to be normally on. Hence, the concentration of nitrogen which is measured by secondary ion mass spectrometry is preferably set to lower than or equal to $5\times10^{18}$ atoms/cm$^3$.

The semiconductor layer may have a non-single-crystal structure, for example. The non-single-crystal structure includes CAAC-OS (c-axis aligned crystalline oxide semiconductor, c-axis aligned crystalline oxide semi-conductor, or c-axis aligned a-b-plane-anchored crystalline oxide semiconductor), a polycrystalline structure, a microcrystalline structure, or an amorphous structure, for example. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film has, for example, a single-layer structure or a stacked-layer structure including two or more of the above-described regions in some cases.

<Composition of CAC-OS>

Described below is the composition of a cloud-aligned composite oxide semiconductor (CAC-OS) applicable to a transistor disclosed in one embodiment of the present invention.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0), gallium zinc oxide (Ga$_{X4}$Zn$_{Y4}$O$_{Z4}$, where X4, Y4, and Z4 are real numbers greater than 0), or the like, and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite metal oxide with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including GaO$_3$ as a main component and the region including In$_{X2}$Zn$_{Y2}$O$_{Z2}$ or InO$_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that the CAC-OS of the In—Ga—Zn oxide has a composition in which a region including GaO as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_3$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{X2}Zn_{Y2}O_{Z2}$ or $InO_{X1}$ as a main component are distributed in a metal oxide like a cloud, high field-effect mobility (μ) can be achieved.

In contrast, the insulating property of a region including $GaO_3$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single-crystal silicon, or the like is preferably used. In particular, polycrystalline silicon can be formed at a lower temperature than single-crystal silicon and has higher field effect mobility and higher reliability than amorphous silicon. When such a polycrystalline semiconductor is used for a pixel, the aperture ratio of the pixel can be improved. Even in the case where the display portion with extremely high definition is provided, a gate driver circuit and a source driver circuit can be formed over a substrate over which the pixels are formed, and the number of components of an electronic device can be reduced.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In that case, the use of polycrystalline silicon, single-crystal silicon, or the like is particularly preferable.

[Conductive Layer]

As materials for a gate, a source, and a drain of a transistor, and a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. They can also be used for conductive layers such as a variety of wirings and electrodes included in a display device, and a conductive layer (e.g., a conductive layer functioning as a pixel electrode or a common electrode) included in a display element.

[Insulating Layer]

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element. Thus, a decrease in device reliability can be prevented.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], and still further preferably lower than or equal to $1\times10^{-8}$ [g/m$^2$·day].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, or a guest-host mode can be used.

The liquid crystal element controls transmission or non-transmission of light utilizing an optical modulation action of liquid crystal. Note that optical modulation action of liquid crystal is controlled by an electric field applied to the liquid crystal (including a horizontal electric field, a vertical electric field, or an oblique electric field). As the liquid crystal used for the liquid crystal element, thermotropic liquid crystal, low-molecular liquid crystal, high-molecular liquid crystal, polymer dispersed liquid crystal (PDLC), polymer network liquid crystal (PNLC), ferroelectric liquid crystal, anti-ferroelectric liquid crystal, or the like can be used. These liquid crystal materials exhibit a cholesteric phase, a sematic phase, a cubic phase, a chiral nematic phase, an isotropic phase, or the like depending on conditions.

As the liquid crystal material, either of a positive liquid crystal and a negative liquid crystal may be used, and an appropriate liquid crystal material can be used depending on the mode or design to be used.

In addition, to control the alignment of the liquid crystal, an alignment film can be provided. Alternatively, when a horizontal electric field mode is employed, a liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy. In addition, the liquid crystal composition which includes liquid crystal exhibiting a blue phase and a chiral material does not need alignment treatment and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

As the liquid crystal element, a transmissive liquid crystal element, a reflective liquid crystal element, a semi-transmissive liquid crystal element, or the like can be used.

In one embodiment of the present invention, in particular, the reflective liquid crystal element can be used.

In the case where the transmissive or semi-transmissive liquid crystal element is used, two polarizing plates are provided so that a pair of substrates is sandwiched therebetween. A backlight is provided outside one of the polarizing plates. As the backlight, a direct-below backlight or an edge-light backlight may be used. The direct-below backlight including an LED is preferably used because local dimming is easily performed to improve contrast. The edge-light type backlight is preferably used because the thickness of a module including the backlight can be reduced.

In the case where the reflective liquid crystal element is used, the polarizing plate is provided on the display surface side. Separately, a light diffusion plate is preferably provided on the display surface to improve visibility.

[Light-emitting Element]

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element has a top emission structure, a bottom emission structure, a dual emission structure, or the like. A conductive film that transmits visible light is used as the electrode through which light is extracted. A conductive film that reflects visible light is preferably used as the electrode through which light is not extracted.

In one embodiment of the present invention, in particular, a bottom-emission light-emitting element can be used.

The EL layer includes at least a light-emitting layer. The light-emitting layer includes at least a light-emitting substance. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer, and an inorganic compound may also be used. The layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between the anode and the cathode, holes are injected to the EL layer from the anode side and electrons are injected to the EL layer from the cathode side. The injected electrons and holes are recombined in the EL layer, so that a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more light-emitting substances emit complementary colors to obtain white light emission. For example, it is preferable to contain two or more light-emitting substances selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in the wavelength range of a yellow light preferably includes spectral components also in the wavelength range of a green light and a red light.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin so as to have a light-transmitting property. Alternatively, a stack of any of the above materials can be used as the conductive layer. For example, a stacked film of indium tin oxide and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy of silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the conductive film having a property of transmitting visible light and a film containing any of the above metal materials may be stacked. For example, a stack of silver and indium tin oxide, a stack of an alloy of silver and magnesium and indium tin oxide, or the like can be used.

The electrodes may be formed separately by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property, and the like may include an inorganic compound such as a quantum dot or a high molecular compound (e.g., an oligomer, a dendrimer, and a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of the components.

[Manufacturing Method Example]

A manufacturing method example of a display device using a flexible substrate is described.

Here, layers each including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 µm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which the element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to a support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. With the method, it is preferable that a material having high heat resistance be used for the support substrate or the separation layer, in which case the upper limit of the temperature applied when the element layer is formed can be increased, and an element layer including a higher reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer be used as the insulating layer over the separation layer. Note that in this specification, oxynitride contains more oxygen than nitrogen, and nitride oxide contains more nitrogen than oxygen.

As the method for separating the support substrate from the element layer, applying mechanical force, etching the separation layer, and making a liquid permeate the separation interface are given as examples. Alternatively, separation may be performed by heating or cooling the support substrate by utilizing a difference in thermal expansion coefficient of two layers which form the separation interface.

The separation layer is not necessarily provided in the case where the separation can be performed at an interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, so that separation may be performed at an interface between the glass and the organic resin.

Alternatively, a heat generation layer may be provided between the support substrate and the insulating layer formed of an organic resin, and separation may be performed at an interface between the heat generation layer and the insulating layer by heating the heat generation layer. As the heat generation layer, any of a variety of materials such as a material which generates heat by feeding current, a material which generates heat by absorbing light, and a material which generates heat by applying a magnetic field can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a flexible display device.

[Structural Example 3]

A more specific structural example of the display device of one embodiment of the present invention is described below with reference to drawings.

[Cross-Sectional Structural Example 3-1]

Figure 26:
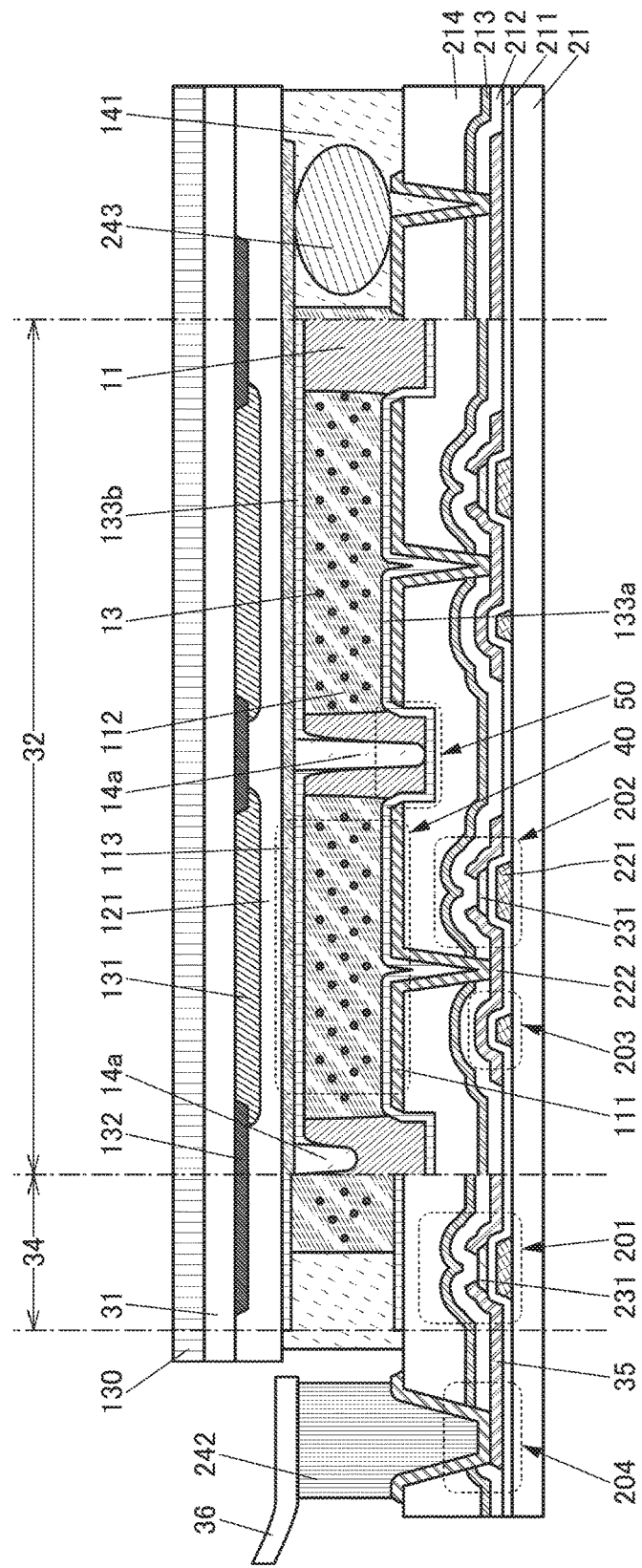
FIG. 26 illustrates a structural example of a display device of one embodiment.

FIG. 26 is a schematic cross-sectional view of a display device described below as an example. FIG. 26 illustrates an example of cross sections of a region including the FPC 36, a region including the circuit 34, a region including the display portion 32, and the like in FIG. 1A.

The substrate 21 and the substrate 31 are attached to each other with an adhesive layer 141. A region surrounded by the substrate 21, the substrate 31, and the adhesive layer 141 is filled with liquid crystal 112. A polarizing plate 130 is provided on an outer surface of the substrate 31.

In FIG. 26, the liquid crystal element 40 includes a conductive layer 111, part of a conductive layer 113, and the liquid crystal 112 sandwiched therebetween. In addition, an alignment film 133a is provided between the liquid crystal 112 and the conductive layer 111 and an alignment film 133b is provided between the liquid crystal 112 and the conductive layer 113.

In addition, between the substrate 21 and the substrate 31, the monomers 13 are dispersed in the liquid crystal 112. Moreover, the partition wall 11 is provided between the substrate 21 and the substrate 31.

Although not illustrated, a front light can be provided outside the polarizing plate 130. As the front light, an edge-light front light is preferably used. A front light including an LED is preferably used because power consumption can be reduced.

The substrate 31 is provided with a coloring layer 131, a light-blocking layer 132, an insulating layer 121, the conductive layer 113 serving as a common electrode of the liquid crystal element 40, the alignment film 133b, and the like.

The conductive layer 111 serving as a pixel electrode of the liquid crystal element 40, the alignment film 133a, a transistor 201, a transistor 202, a capacitor 203, a connection portion 204, the wiring 35, and the like are provided over the substrate 21. For example, the transistor 201 corresponds to the transistor 70 described above.

Insulating layers such as an insulating layer 211, an insulating layer 212, an insulating layer 213, and an insulating layer 214 are provided over the substrate 21. A portion of the insulating layer 211 functions as a gate insulating layer of each transistor, and another portion thereof functions as a dielectric of the capacitor 203. The insulating layer 212, the insulating layer 213, and the insulating layer 214 are provided to cover each transistor and the capacitor 203. The insulating layer 214 functions as a planarization layer. Note that an example where the three insulating layers, the insulating layers 212, 213, and 214, are provided to cover the transistors and the like is described here; however, one embodiment of the present invention is not limited to this example, and four or more insulating layers, a single insulating layer, or two insulating layers may be provided. The insulating layer 214 functioning as a planarization layer is not necessarily provided when not needed.

The transistor 201 and the transistor 202 each include a conductive layer 221 part of which functions as a gate, conductive layers 222 part of which functions as a source and a drain, and a semiconductor layer 231. Here, a plurality of layers obtained by processing the same conductive film are shown with the same hatching pattern.

In the transistor 202, one of the pair of conductive layers 222 which is not electrically connected to the conductive layer 111 may function as part of a signal line. The conductive layer 221 functioning as a gate of the transistor 202 may also function as part of a scan line.

FIG. 26 illustrates a cross section of two pixels (sub-pixels) as an example of the display portion 32. One sub-pixel includes, for example, the transistor 202, the capacitor 203, the liquid crystal element 40, and the coloring layer 131. For example, the coloring layers 131 are selectively formed so that a sub-pixel exhibiting a red color, a sub-pixel exhibiting a green color, and a sub-pixel exhibiting a blue color are arranged; thus, full-color display can be achieved.

FIG. 26 illustrates an example of the circuit 34 in which the transistor 201 is provided.

Although the transistors 201 and 202 each include one gate in FIG. 26, the semiconductor layer 231 where a channel is formed may be provided between two gates. Such a structure enables control of threshold voltages of transistors. In that case, the two gate electrodes may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Note that the transistor included in the circuit 34 and the transistor included in the display portion 32 may have the same structure. A plurality of transistors included in the circuit 34 may have the same structure or different structures. A plurality of transistors included in the display portion 32 may have the same structure or different structures.

A material through which impurities such as water or hydrogen do not easily diffuse is preferably used for at least one of the insulating layers 212 and 213 which cover the transistors. That is, the insulating layer 212 or the insulating layer 213 can function as a barrier film. Such a structure can effectively suppress diffusion of the impurities into the transistors from the outside, and a highly reliable display device can be provided.

The conductive layer 111 is provided over the insulating layer 214. The conductive layer 111 is electrically connected to one of a source and a drain of the transistor 202 through an opening formed in the insulating layer 214, the insulating layer 213, the insulating layer 212, and the like. The conductive layer 111 is also electrically connected to one electrode of the capacitor 203.

The insulating layer 121 is provided on the substrate 31 side to cover the coloring layer 131 and the light-blocking layer 132. The insulating layer 121 may have a function of a planarization layer. The insulating layer 121 enables the conductive layer 113 to have an almost flat surface, resulting in a uniform alignment state of the liquid crystal 112.

In FIG. 26, the partition wall 11 is positioned in a region overlapping with a region between the two adjacent conductive layers 111. In addition, the partition wall 11 is positioned to overlap with the alignment film 133a, the alignment film 133b, the conductive layer 113, and the like. Moreover, the partition wall 11 is positioned not to overlap with the conductive layer 221 or the conductive layer 222.

The depression portion 50 is formed in the insulating layer 214. The partition wall 11 has a region overlapping with the depression portion 50. In addition, the structure body 14a and the structure body 14b having different heights are provided in contact with the conductive layer 113. Each of the structure body 14a and the structure body 14b is provided to overlap with the depression portion 50 and to be covered with the partition wall 11.

In the liquid crystal element 40, the conductive layer 111 has a function of reflecting visible light, and the conductive layer 113 has a function of transmitting visible light. Light incident from the substrate 31 side is polarized by the polarizing plate 130, passes through the conductive layer 113 and the liquid crystal 112, and is reflected by the conductive layer 111. Then, the light passes through the liquid crystal 112 and the conductive layer 113 again and reaches the polarizing plate 130. In this case, alignment of the liquid crystal 112 is controlled with a voltage that is applied between the conductive layer 111 and the conductive layer 113, and thus optical modulation of light can be controlled. That is, the intensity of light emitted through the polarizing plate 130 can be controlled. Light other than one in a particular wavelength region of the light is absorbed by the coloring layer 131, and thus, emitted light is red light, for example.

As the polarizing plate 130, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, driving voltage, and the like of the liquid crystal element used as the liquid crystal element 40 are controlled depending on the kind of the polarizing plate 130 so that desirable contrast is obtained.

The conductive layer 113 is electrically connected to a conductive layer provided on the substrate 21 side through a connector 243 in a portion close to an end portion of the substrate 31. Thus, a potential or a signal can be supplied from an FPC, an IC, or the like provided on the substrate 21 side to the conductive layer 113.

As the connector 243, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 243, a material capable of elastic deformation or plastic deformation is preferably used. As illustrated in FIG. 26, the connector 243 which is the conductive particle has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the adhesive layer 141. For example, the connectors 243 are dispersed in the adhesive layer 141 before curing of the adhesive layer 141.

The connection portion 204 is provided in a region near an end portion of the substrate 21. The connection portion 204 is electrically connected to the FPC 36 through a connection layer 242. In the structure in FIG. 26, the connection portion 204 is formed by stacking part of the wiring 35 and a conductive layer obtained by processing the same conductive film as the conductive layer 111.

The above is the description of Cross-sectional structural example 3-1.

[Cross-Sectional Structural Example 3-2]

A structural example of a touch panel that includes a touch sensor is described below as an example of the display device of one embodiment of the present invention.

Figure 27:
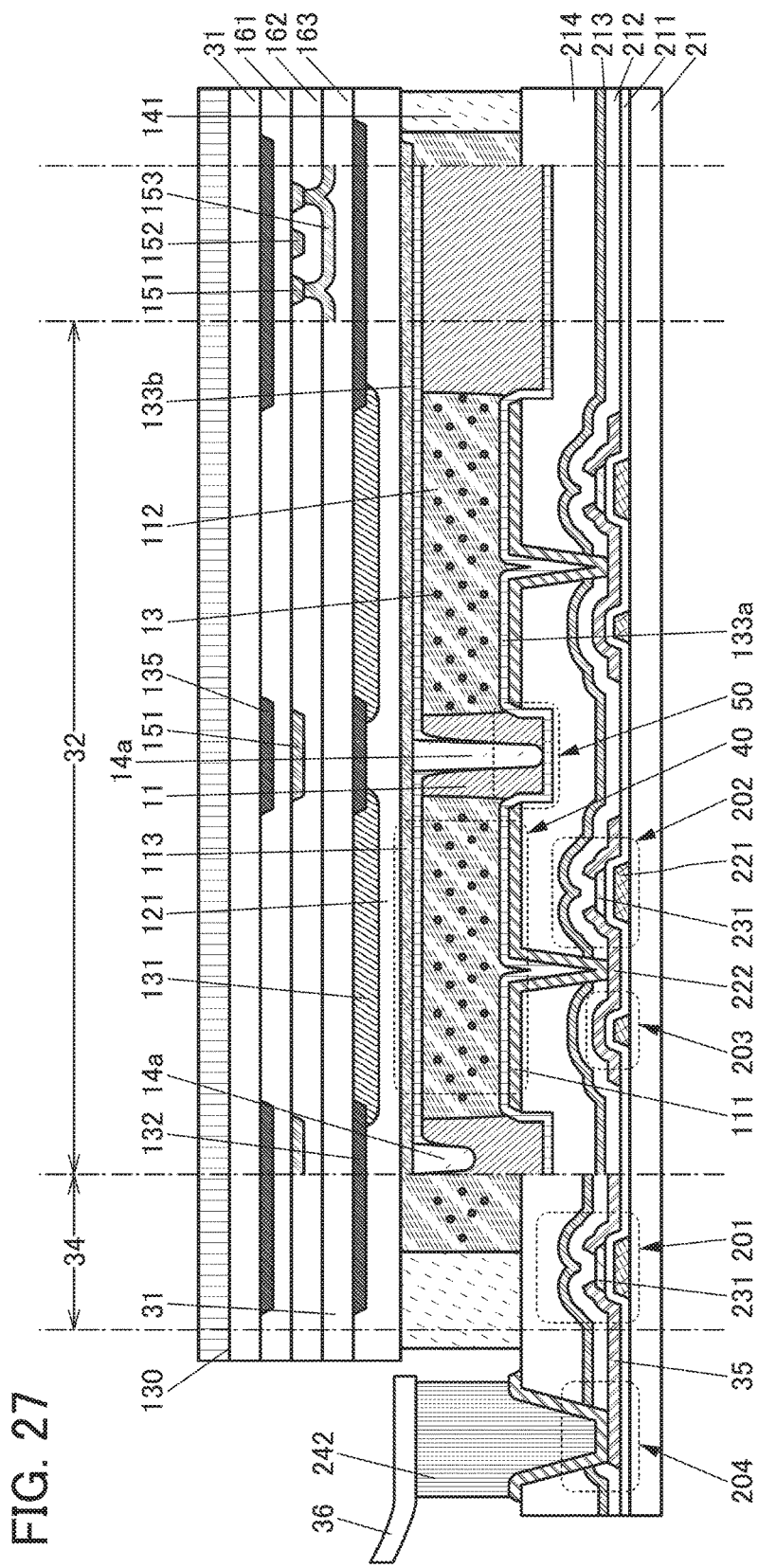
FIG. 27 illustrates a structural example of a display device of one embodiment.

FIG. 27 is a schematic cross-sectional view of a display device described below as an example.

Insulating layers 161, 162, and 163 are stacked in this order over the surface of the substrate 31 that is on the substrate 21 side. Conductive layers 151 and 152 are provided between the insulating layer 161 and the insulating layer 162 and a conductive layer 153 is provided between the insulating layer 162 and the insulating layer 163. The light-blocking layer 132, the coloring layer 131, and the like are provided on the substrate 21 side of the insulating layer 163.

The conductive layers 151 and 152 each serve as a wiring included in a capacitive touch sensor.

FIG. 27 clearly shows an intersection of the conductive layers 151 and 152. Through openings in the insulating layer 162, the conductive layer 153 is electrically connected to the two conductive layers 151 between which the conductive layer 152 is positioned.

The conductive layers 151 and 152 overlap with the light-blocking layer 132 in the display portion. Also in FIG. 27, the conductive layer 151 does not overlap with the liquid crystal element 40. In other words, the conductive layer 151 has a mesh shape with an opening overlapping with the liquid crystal element 40. In such a structure where the conductive layers 151 are not arranged on the path of light emitted from the outside and reflected by the liquid crystal element 40 to be emitted to the outside again, the conductive layers 151 do not cause a decrease in luminance substantially; thus, a display device with high visibility and low power consumption can be fabricated. Note that the conductive layers 152 and 153 can each have a similar structure.

In addition, not overlapping with the liquid crystal element 40, the conductive layers 151, 152, and 153 can be formed using a metal material with a relatively low resistance. This increases the sensitivity of the touch sensor as compared with the case where a light-transmitting conductive material is used for the conductive layers 151, 152, and 153.

FIG. 27 illustrates an example in which a light-blocking layer 135 is provided closer to the substrate 31 than the conductive layers 151 and 152 (and the conductive layer 153) and so as to overlap with the conductive layers 151 and 152. Even in the case where a metal material is used for the conductive layer 151 and the like, external light reflection on the conductive layer 151 and the like can be hindered by the light-blocking layer 135, achieving a touch panel with higher visibility. Although the two light-blocking layers 132 and 135 are provided in this example, either one light-blocking layer may be provided.

The polarizing plate 130 is not necessarily provided over the substrate 31, and an object to be sensed, such as a finger or a stylus, may be in direct contact with the substrate 31. In that case, a protective layer (such as a ceramic coat) is preferably provided over the substrate 31. The protective layer can be formed using an inorganic insulating material such as silicon oxide, aluminum oxide, yttrium oxide, or yttria-stabilized zirconia (YSZ). Alternatively, tempered glass may be used for the substrate 31. Physical or chemical processing by an ion exchange method, a wind tempering method, or the like may be performed on the tempered glass, so that compressive stress is applied on the surface. In the case where the touch sensor is provided on one side of the tempered glass and the opposite side of the tempered glass is provided on, for example, the outermost surface of an electronic device for use as a touch surface, the thickness of the whole device can be decreased.

When the liquid crystal element 40, the plurality of transistors, the conductive layers of the touch sensor, and the like are arranged between the substrates 21 and 31 as illustrated in FIG. 27, a touch panel with a reduced number of components can be fabricated. This structure can be referred to as an in-cell touch panel.

Note that the structure of the display device serving as a touch panel is not limited to the above, and for example, the touch panel may be fabricated by overlapping the substrate provided with the conductive layer and the like included in a touch sensor with the display device illustrated in FIG. 26 and the like.

The above is the description of Cross-sectional structural example 3-2.

[Cross-Sectional Structural Example 3-3]

Figure 28:
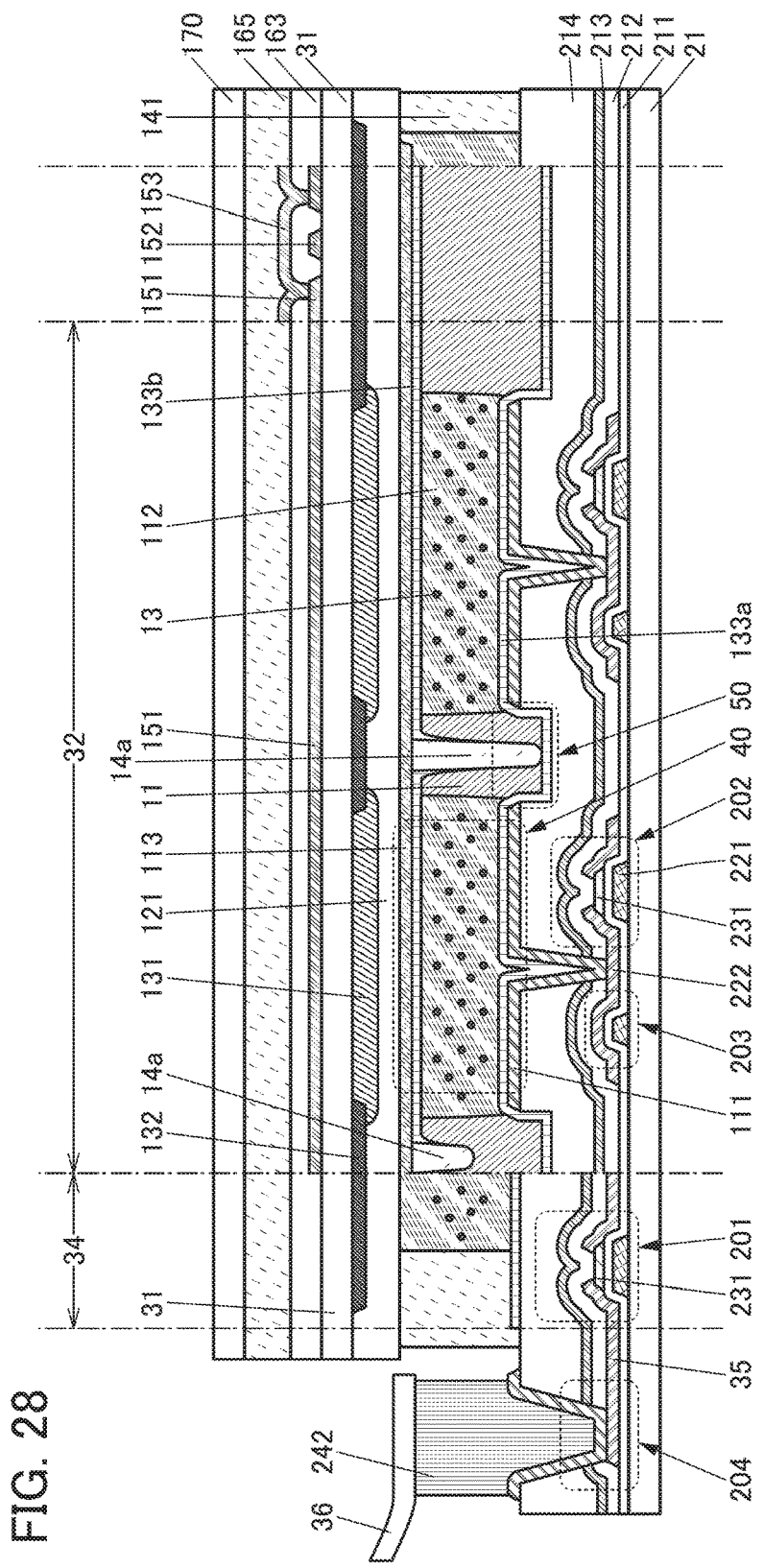
FIG. 28 illustrates a structural example of a display device of one embodiment.

FIG. 28 illustrates an example in which the conductive layers 151 and 152 and the like included in the touch sensor are formed on the surface of the substrate 31 that is opposite to the surface facing the substrate 21. This structure can be referred to as an on-cell touch panel.

The conductive layers 151 and 152 and the like are formed over the substrate 31 and covered with the insulating layer 163. The conductive layer 153 is provided over the insulating layer 163.

A substrate 170 is a substrate serving as a touch surface, and for example, serves as part of a housing, protective glass, or the like of an electronic device in which the display device is incorporated. The substrates 170 and 31 are bonded with an adhesive layer 165.

FIG. 28 illustrates an example in which the conductive layer 151 is provided not only in a region overlapping with the light-blocking layer 132 but also in a region overlapping with the liquid crystal element 40, the coloring layer 131, and the like. In that case, the conductive layer 151 can be formed using a material transmitting visible light. A film containing a metal oxide, a film containing graphene, a film that contains a metal or an alloy and is thin enough to transmit visible light, or the like can be used for the conductive layer 151. The same applies to the conductive layer 152. The conductive layer 153 may also be formed using a material transmitting visible light; however, a material blocking visible light, such as a metal or an alloy, may also be used in the case where the conductive layer 153 overlaps with the light-blocking layer 132 or the area of the conductive layer 153 is extremely small.

The above is the description of Cross-sectional structural example 3-3.

[Structural Example 4]

More specific cross-sectional structural examples of the display device shown in Structural example 2 that includes both a reflective liquid crystal element and a light-emitting element and can display an image both in a transmissive mode and in a reflective mode are described below.

[Cross-Sectional Structural Example 4-1]

Figure 29:
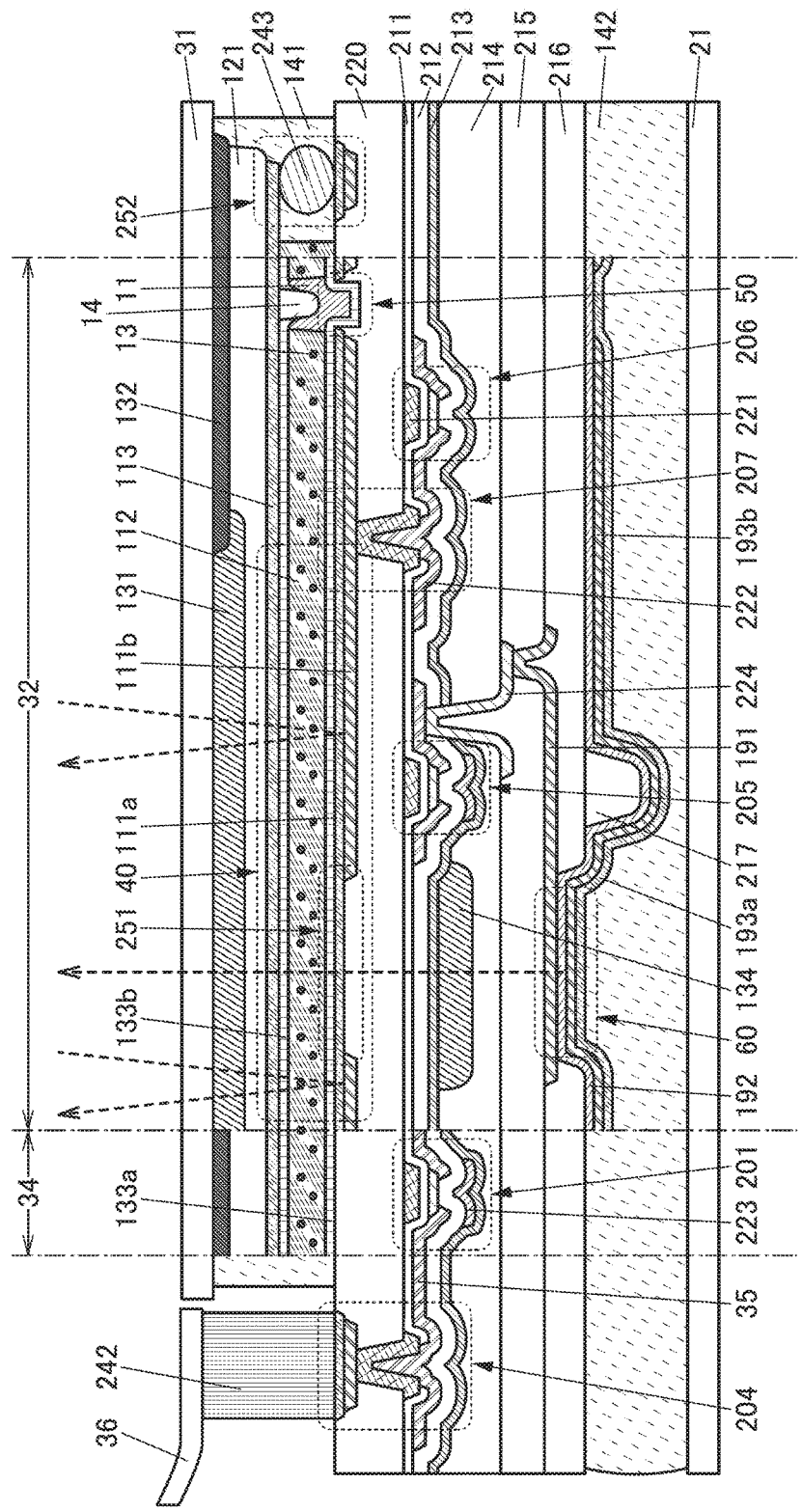
FIG. 29 illustrates a structural example of a display device of one embodiment.

FIG. 29 is a schematic cross-sectional view of a display device described below as an example. The display device illustrated in FIG. 29 corresponds to the display device illustrated in FIG. 7A.

The display device includes an insulating layer 220 between the substrates 21 and 31. The display device also includes a light-emitting element 60, a transistor 205, a transistor 206, a coloring layer 134, and the like between the substrate 21 and the insulating layer 220. Furthermore, the display device includes the liquid crystal element 40, the coloring layer 131, the partition wall 11, the structure body 14, and the like between the insulating layer 220 and the substrate 31. The substrate 31 and the insulating layer 220 are bonded with the adhesive layer 141. The substrate 21 and the insulating layer 220 are bonded with an adhesive layer 142. The insulating layer 220 includes the depression portion 50.

The liquid crystal element 40 is a reflective liquid crystal element. The liquid crystal element 40 has a stacked structure of a conductive layer 111a, liquid crystal 112, and the conductive layer 113. A conductive layer 111b which reflects visible light is provided in contact with the surface of the conductive layer 111a that faces the substrate 21. The conductive layer 111b includes an opening 251. The conductive layers 111a and 113 contain a material transmitting visible light.

The light-emitting element 60 is a bottom-emission light-emitting element. The light-emitting element 60 has a structure in which a conductive layer 191, an EL layer 192, and a conductive layer 193b are stacked in this order from the insulating layer 220 side. In addition, a conductive layer 193a is provided to cover the conductive layer 193b. The conductive layer 193b contains a material reflecting visible light, and the conductive layers 191 and 193a contain a material transmitting visible light. Light is emitted from the light-emitting element 60 to the substrate 31 side through the coloring layer 134, the insulating layer 220, the opening 251, the conductive layer 113, and the like.

An insulating layer 217 is provided on an insulating layer 216 covering an end portion of the conductive layer 191. The insulating layer 217 has a function as a spacer for preventing the insulating layer 220 and the substrate 21 from getting closer more than necessary. In addition, in the case where the EL layer 192 or the conductive layer 193a is formed using a blocking mask (metal mask), the insulating layer 217 may have a function of preventing the blocking mask from being in contact with a surface on which the EL layer 192 or the conductive layer 193a is formed. Note that the insulating layer 217 is not necessarily provided.

One of a source and a drain of the transistor 205 is electrically connected to the conductive layer 191 of the light-emitting element 60 through a conductive layer 224.

One of a source and a drain of the transistor 206 is electrically connected to the conductive layer 111b through a connection portion 207. The conductive layers 111b and 111a are in contact with and electrically connected to each other. Here, in the connection portion 207, the conductive layers provided on both surfaces of the insulating layer 220 are connected to each other through openings in the insulating layer 220.

The connection portion 204 is provided in a region where the substrates 21 and 31 do not overlap with each other. The connection portion 204 has a structure similar to that of the connection portion 207. On the top surface of the connection portion 204, a conductive layer obtained by processing the same conductive film as the conductive layer 111a is exposed. Thus, the connection portion 204 and the FPC 36 can be electrically connected to each other through the connection layer 242.

A connection portion 252 is provided in part of a region where the adhesive layer 141 is provided. In the connection portion 252, the conductive layer obtained by processing the same conductive film as the conductive layer 111a is electrically connected to part of the conductive layer 113 with the connector 243. Accordingly, a signal or a potential input from the FPC 36 connected to the substrate 21 side can be supplied to the conductive layer 113 formed on the substrate 31 side through the connection portion 252.

The above is the description of Cross-sectional structural example 4-1.

[Cross-Sectional Structural Example 4-2]

Figure 30:
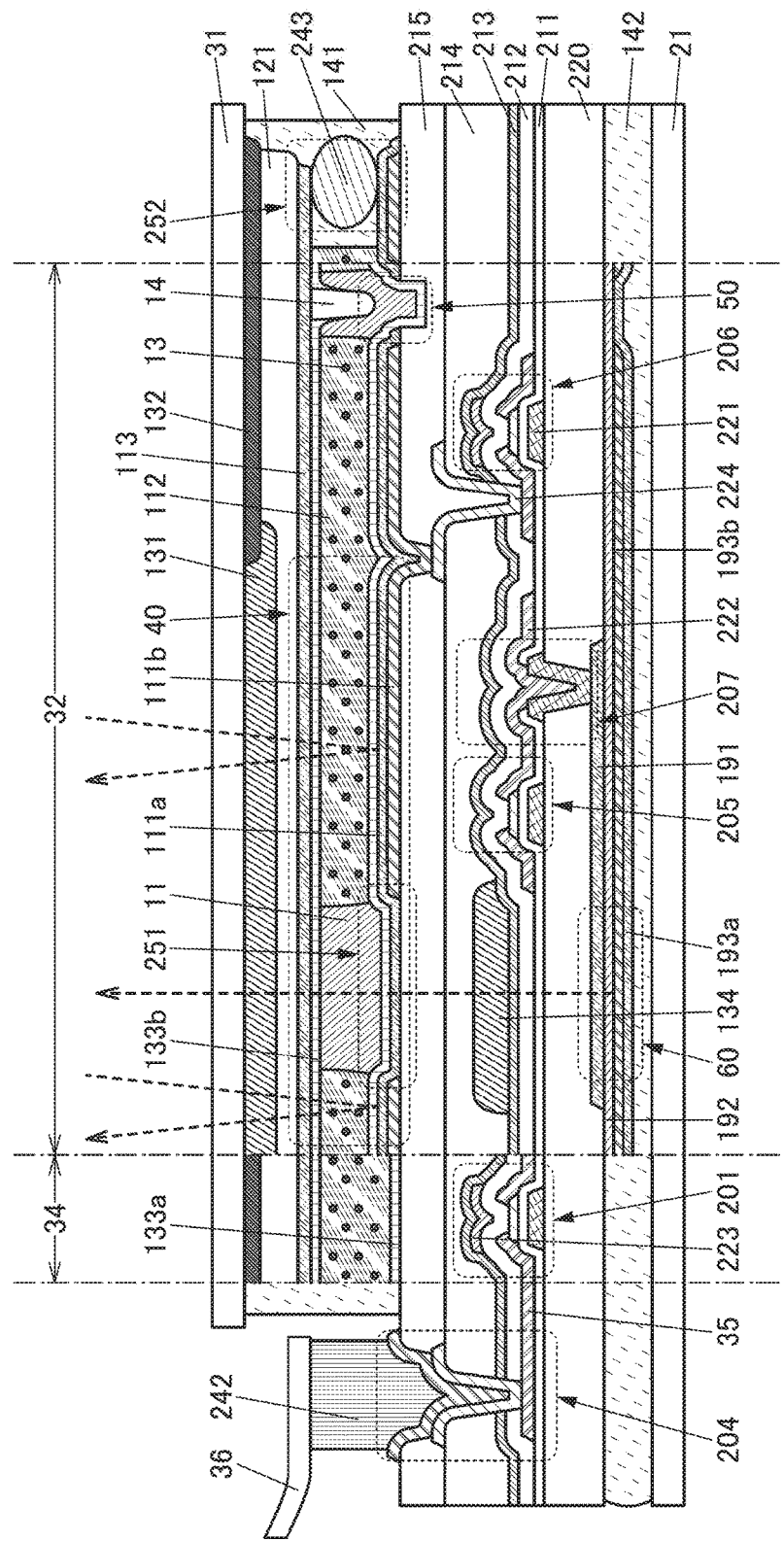
FIG. 30 illustrates a structural example of a display device of one embodiment.

FIG. 30 is a schematic cross-sectional view of a display device described below as an example. The display device illustrated in FIG. 30 corresponds to the display device illustrated in FIG. 8A.

The display device includes the insulating layer 220 between the substrates 21 and 31. The display device also includes the light-emitting element 60 between the substrate 21 and the insulating layer 220. Furthermore, the display device includes the liquid crystal element 40, the transistor 205, the transistor 206, the coloring layer 134, the coloring layer 131, the light-blocking layer 132, the partition wall 11, and the like between the insulating layer 220 and the substrate 31.

FIG. 30 shows an example where the liquid crystal element 40 includes the conductive layer 111b electrically connected to the transistor 206 through the conductive layer 224 and the conductive layer 111a covering the conductive layer 111b.

Here, the partition wall 11 is provided to overlap with the light-emitting element 60. In addition, the partition wall 11 overlaps with the coloring layer 134, the coloring layer 131, the conductive layer 191, and the like. Light is emitted from the light-emitting element 60 to the substrate 31 side through the coloring layer 134, the insulating layer 220, the opening 251, the partition wall 11, the conductive layer 113, and the like.

The above is the description of Cross-sectional structural example 4-2.

[Cross-Sectional Structural Example 4-3]

Figure 31:
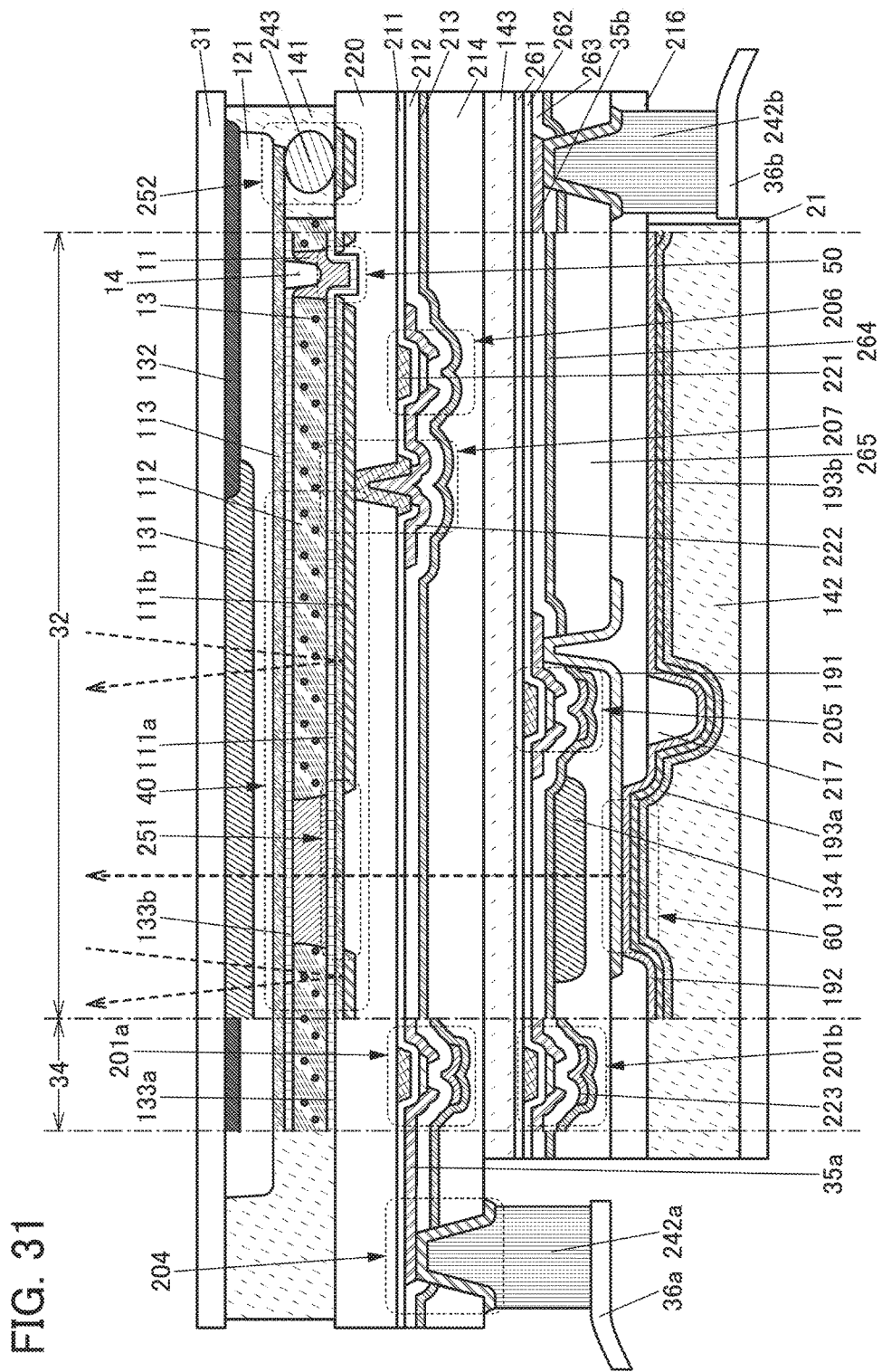
FIG. 31 illustrates a structural example of a display device of one embodiment.

FIG. 31 is a schematic cross-sectional view of a display device described below as an example. The display device illustrated in FIG. 31 corresponds to the display device illustrated in FIG. 3A.

The display device illustrated in FIG. 31 is different from that in FIG. 29 mainly in that the display device includes a transistor 201a and a transistor 201b instead of the transistor 201, an FPC 36a and an FPC 36b instead of the FPC 36, a connection layer 242a and a connection layer 242b instead of the connection layer 242, an adhesive layer 143, a wiring 35a and a wiring 35b instead of the wiring 35, an insulating layer 261, an insulating layer 262, an insulating layer 263, an insulating layer 264, and an insulating layer 265.

The transistor 201a is a transistor driving a pixel circuit including the transistor 206 and the like. The transistor 201b is a transistor driving a pixel circuit including the transistor 205 and the like.

The FPC 36a is electrically connected to the wiring 35a through the connection layer 242a. The FPC 36b is electrically connected to the wiring 35b through the connection layer 242b.

The insulating layer 214 and the insulating layer 261 are bonded with the adhesive layer 143. The insulating layer 262, the insulating layer 263, the insulating layer 264, the insulating layer 265, and the like are stacked over a surface of the insulating layer 261 which is opposite to the surface provided with the adhesive layer 143. Part of the insulating layer 262 serves as a gate insulating layer of the transistor 201b and the transistor 205. The insulating layer 263, the insulating layer 264, and the insulating layer 265 are provided to cover the transistor 201b and the transistor 205.

The above is the description of Cross-sectional structural example 4-3.

[Transistor]

Hereinafter, an example of a structure of a transistor that can be used in the display device will be described.

A transistor 310 illustrated in FIG. 32A is an example of a bottom-gate transistor.

The transistor 310 includes a conductive layer 311 serving as a gate electrode, part of an insulating layer 332 serving as a gate insulating layer, a semiconductor layer 312, a conductive layer 313a serving as one of a source electrode and a drain electrode, and a conductive layer 313b serving as the other of the source electrode and the drain electrode.

In FIG. 32A, the transistor 310 is provided over an insulating layer 331. An insulating layer 334 is provided to cover the transistor 310 and a conductive layer 321 is provided over the insulating layer 334. The conductive layer 321 is electrically connected to the conductive layer 313b through an opening formed in the insulating layer 334 and serves as a pixel electrode. In an example in FIG. 32A, an insulating layer 335 is provided to cover an end portion of the conductive layer 321.

In the transistor 310, the conductive layer 311 functioning as a gate electrode is located closer to the formation surface (the insulating layer 331 side) than the semiconductor layer 312. The insulating layer 332 is provided to cover the conductive layer 311. The semiconductor layer 312 is provided to cover the conductive layer 311. A region of the semiconductor layer 312 that overlaps with the conductive layer 311 corresponds to a channel formation region. The conductive layers 313a and 313b are provided in contact with the top surface and side end portions of the semiconductor layer 312.

Note that in the transistor 310 shown as an example, the width of the semiconductor layer 312 is wider than that of the conductive layer 311. In such a structure, the semiconductor layer 312 is located between the conductive layer 311 and each of the conductive layers 313a and 313b. Thus, the parasitic capacitance between the conductive layer 311 and each of the conductive layers 313a and 313b can be reduced.

The transistor 310 is a channel-etched transistor and can be suitably used for a high-resolution display device because the occupation area of the transistor can be reduced comparatively easily.

A transistor 310a illustrated in FIG. 32B is different from the transistor 310 in that the transistor 310a includes a conductive layer 314 and an insulating layer 336. The conductive layer 314 is provided over an insulating layer 333 and includes a region overlapping with the semiconductor layer 312. The insulating layer 336 is provided to cover the conductive layer 314 and the insulating layer 333.

The conductive layer 314 is positioned to face the conductive layer 311 with the semiconductor layer 312 therebetween. In the case where the conductive layer 311 is used as a first gate electrode, the conductive layer 314 can serve as a second gate electrode. By supplying the same potential to the conductive layer 311 and the conductive layer 314, the on-state current of the transistor 310a can be increased. By supplying a potential for controlling the threshold voltage to one of the conductive layer 311 and the conductive layer 314 and a potential for driving to the other, the threshold voltage of the transistor 310a can be controlled.

A conductive material including an oxide is preferably used for the conductive layer 314. In that case, a conductive film to be the conductive layer 314 is formed in an atmosphere containing oxygen, whereby oxygen can be supplied to the insulating layer 333. The proportion of an oxygen gas in a film formation gas is preferably higher than or equal to 90% and lower than or equal to 100%. Oxygen supplied to the insulating layer 333 is then supplied to the semiconductor layer 312 by later heat treatment; as a result, oxygen vacancies in the semiconductor layer 312 can be reduced.

It is particularly preferable to use a low-resistance oxide semiconductor for the conductive layer 314. In this case, the insulating layer 336 is preferably formed using an insulating film that releases hydrogen, e.g., a silicon nitride film. Hydrogen is supplied to the conductive layer 314 during the formation of the insulating layer 336 or by heat treatment to be performed after that, whereby the electrical resistance of the conductive layer 314 can be reduced effectively.

A transistor 310b illustrated in FIG. 32C is a top-gate transistor.

In the transistor 310b, the conductive layer 311 functioning as a gate electrode is provided over the semiconductor layer 312 (provided on the side opposite to the formation surface side). The semiconductor layer 312 is formed over the insulating layer 331. The insulating layer 332 and the conductive layer 311 are stacked over the semiconductor layer 312. The insulating layer 333 is provided to cover the top surface and the side end portions of the semiconductor layer 312, side surfaces of the insulating layer 333, and the conductive layer 311. The conductive layers 313a and 313b are provided over the insulating layer 333. The conductive layers 313a and 313b are electrically connected to the top surface of the semiconductor layer 312 through openings provided in the insulating layer 333.

Note that although the insulating layer 332 is not present in a portion that does not overlap with the conductive layer 311 in the example, the insulating layer 332 may be provided to cover the top surface and the side end portion of the semiconductor layer 312.

In the transistor 310b, the conductive layer 311 can be physically distanced from the conductive layer 313a or 313b easily; thus, the parasitic capacitance between the conductive layer 311 and the conductive layer 313a or 313b can be reduced.

A transistor 310c illustrated in FIG. 32D is different from the transistor 310b in that the transistor 310c includes a conductive layer 315 and an insulating layer 337. The conductive layer 315 is provided over the insulating layer 331 and includes a region overlapping with the semiconductor layer 312. The insulating layer 337 is provided to cover the conductive layer 315 and the insulating layer 331.

The conductive layer 315 serves as a second gate electrode like the conductive layer 314. Thus, the on-state current can be increased and the threshold voltage can be controlled, for example.

FIG. 32E illustrates a stacked-layer structure of the transistor 310 and a transistor 310d. The transistor 310d is a transistor including a pair of gate electrodes.

The transistor 310d includes part of the conductive layer 313b serving as a first gate electrode, part of the insulating layer 333 serving as a first gate insulating layer, a semiconductor layer 312a, a conductive layer 313c serving as one of a source electrode and a drain electrode, a conductive layer 313d serving as the other of the source electrode and the drain electrode, part of the insulating layer 336 serving as a second gate insulating layer, and a conductive layer 314a serving as a second gate electrode.

In particular, such a structure can be favorably used in a circuit electrically connected to a light-emitting element. That is, it is preferable to use the transistor 310 as a transistor (also referred to as a switching transistor or a selection transistor) for controlling whether a pixel is selected or not, and to use the transistor 310d as a transistor (also referred to as a driving transistor) for controlling current flowing to a light-emitting element 60.

In the structure illustrated in FIG. 32E, the conductive layer 314a is electrically connected to the conductive layer 313c through an opening formed in the insulating layer 336. The conductive layer 321 is electrically connected to the conductive layer 314a through an opening formed in the insulating layer 334. Here, the capacitance (also referred to as gate capacitance) between the conductive layer 314a and the semiconductor layer 312a can be utilized as a storage capacitor of a pixel.

The above is the description of the transistor.

At least part of this embodiment can be implemented in combination with any of the other embodiments described in this specification as appropriate.

(Embodiment 2)

In this embodiment, a specific example of the display device of one embodiment of the present invention will be described below. The display device described below as an example includes both a reflective liquid crystal element and a light-emitting element and can display an image both in a transmissive mode and in a reflective mode.

[Structural Example]

FIG. 33A is a block diagram illustrating an example of the structure of a display device 400. The display device 400 includes a plurality of pixels 410 that are arranged in a matrix in a display portion 362. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the display device 400 includes a plurality of wirings S1 and a plurality of wirings S2, which are electrically connected to the circuit SD and the plurality of pixels 410 arranged in a direction C.

Although the display device includes one circuit GD and one circuit SD here for simplification, the circuit GD and the circuit SD for driving a liquid crystal element and the circuit GD and the circuit SD for driving a light-emitting element may be provided separately.

The pixel 410 includes a reflective liquid crystal element and a light-emitting element. In the pixel 410, the liquid crystal element and the light-emitting element partly overlap with each other.

FIG. 33B1 illustrates a structural example of a conductive layer 311b included in the pixel 410. The conductive layer 311b serves as a reflective electrode of the liquid crystal element in the pixel 410. The conductive layer 311b has an opening 451.

In FIG. 33B1, a light-emitting element 360 in a region overlapping with the conductive layer 311b is denoted by a dashed line. The light-emitting element 360 overlaps with the opening 451 included in the conductive layer 311b. Thus, light from the light-emitting element 360 is emitted to a display surface side through the opening 451.

In FIG. 33B1, the pixels 410 adjacent in the direction R correspond to different colors. As illustrated in FIG. 33B1, the openings 451 are preferably provided in different positions in the conductive layers 311b so as not to be aligned in the two pixels adjacent to each other in the direction R. This allows the two light-emitting elements 360 to be apart from each other, thereby preventing light emitted from the light-emitting element 360 from entering a coloring layer in the adjacent pixel 410 (such a phenomenon is also referred to as crosstalk). Furthermore, since the two adjacent light-emitting elements 360 can be arranged apart from each other, a high-resolution display device can be achieved even when EL layers of the light-emitting elements 360 are separately formed with a shadow mask or the like.

Alternatively, arrangement illustrated in FIG. 33B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the conductive layer 311*b* serving as a reflective electrode is too small, light emitted from the light-emitting element 360 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be provided close to the adjacent pixel. Preferably, the opening 451 is provided close to another pixel emitting light of the same color, in which case crosstalk can be suppressed.

[Circuit Configuration Example]

Figure 34:
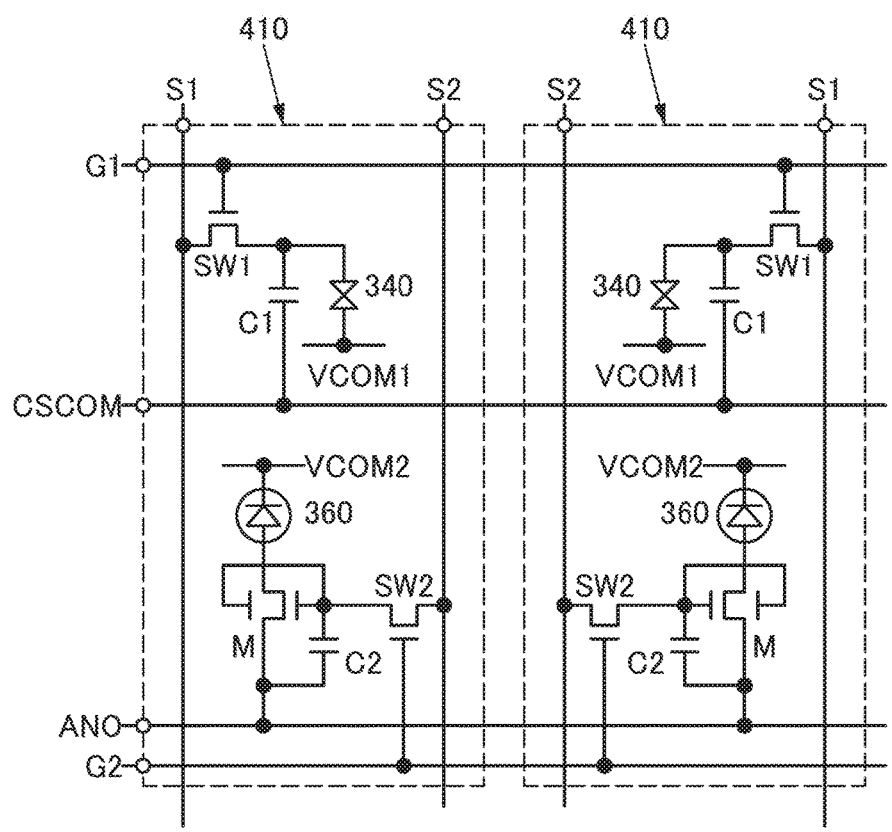
FIG. 34 illustrates a circuit diagram of a display device of one embodiment.

FIG. 34 is a circuit diagram illustrating a structural example of the pixel 410. FIG. 34 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 34 illustrates a wiring VCOM1 electrically connected to the liquid crystal element 340 and a wiring VCOM2 electrically connected to the light-emitting element 360.

FIG. 34 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 34 illustrates an example in which the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 34, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 35A:
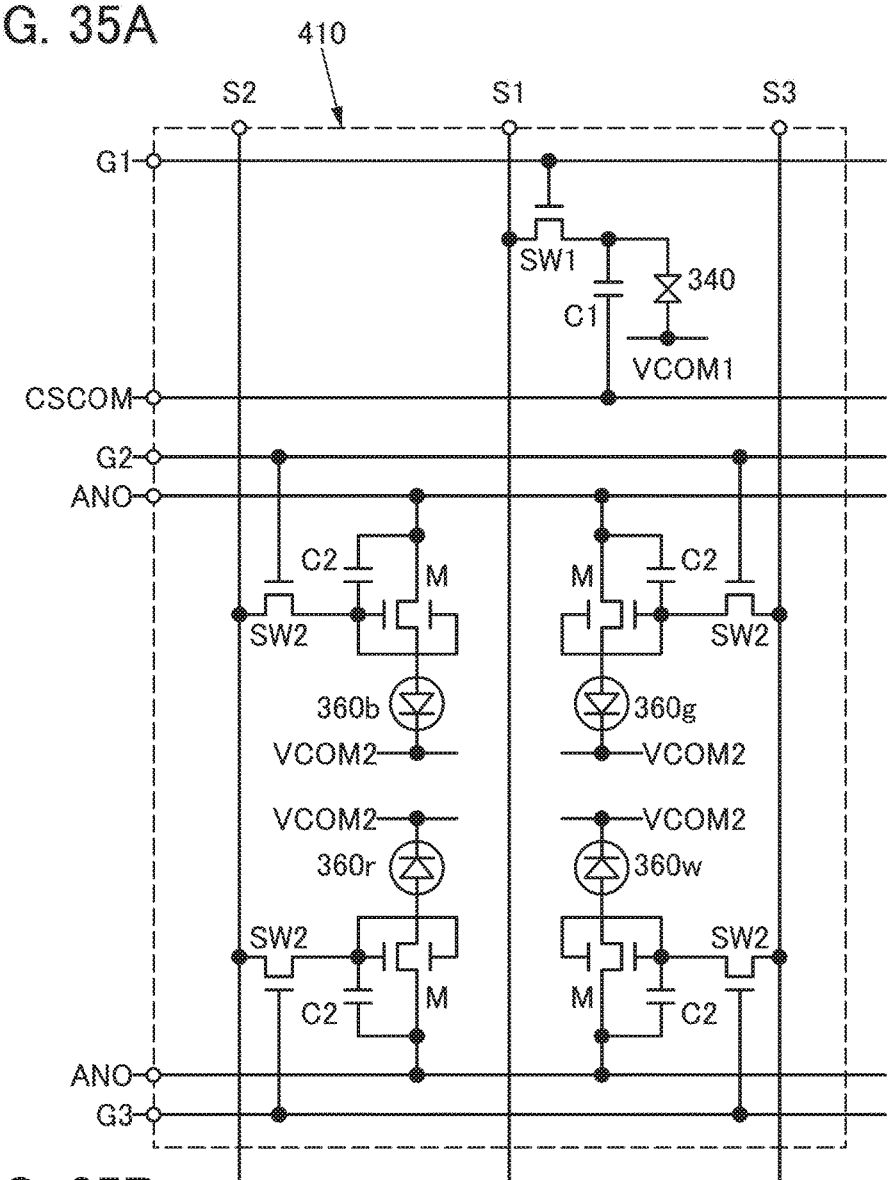
FIGS. 35A and 35B illustrate a circuit diagram of a display device of one embodiment and a structural example of a pixel of one embodiment.

Although FIG. 34 illustrates an example in which one liquid crystal element 340 and one light-emitting element 360 are provided in one pixel 410, one embodiment of the present invention is not limited thereto. FIG. 35A illustrates an example in which one liquid crystal element 340 and four light-emitting elements 360 (light-emitting elements 360*r*, 360*g*, 360*b*, and 360*w*) are provided in one pixel 410. The pixel 410 illustrated in FIG. 35A differs from that in FIG. 34 in being capable of performing full-color display by one pixel.

In FIG. 35A, in addition to the example in FIG. 34, a wiring G3 and a wiring S3 are connected to the pixel 410.

In the example in FIG. 35A, light-emitting elements emitting red light (R), green light (G), blue light (B), and white light (W) can be used for the four light-emitting elements 360, for example. Furthermore, as the liquid crystal element 340, a reflective liquid crystal element emitting white light can be used. Thus, in the case of performing display in the reflective mode, white display with high reflectivity can be performed. In the case of performing display in the transmissive mode, images can be displayed with a higher color rendering property at low power consumption.

Figure 35B:
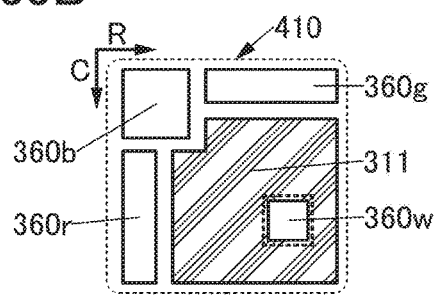

FIG. 35B illustrates a structural example of the pixel 410. The pixel 410 includes the light-emitting element 360*w* overlapping with the opening of the conductive layer 311, the light-emitting element 360*r* arranged in the periphery of the conductive layer 311, the light-emitting element 360*g*, and the light-emitting element 360*b*. It is preferable that the light-emitting elements 360*r*, 360*g*, and 360*b* have almost the same light-emitting area.

At least part of this embodiment can be implemented in combination with any of the other embodiments described in this specification as appropriate.

(Embodiment 3)

In this embodiment, a display module which can be manufactured using one embodiment of the present invention will be described.

Figure 36:
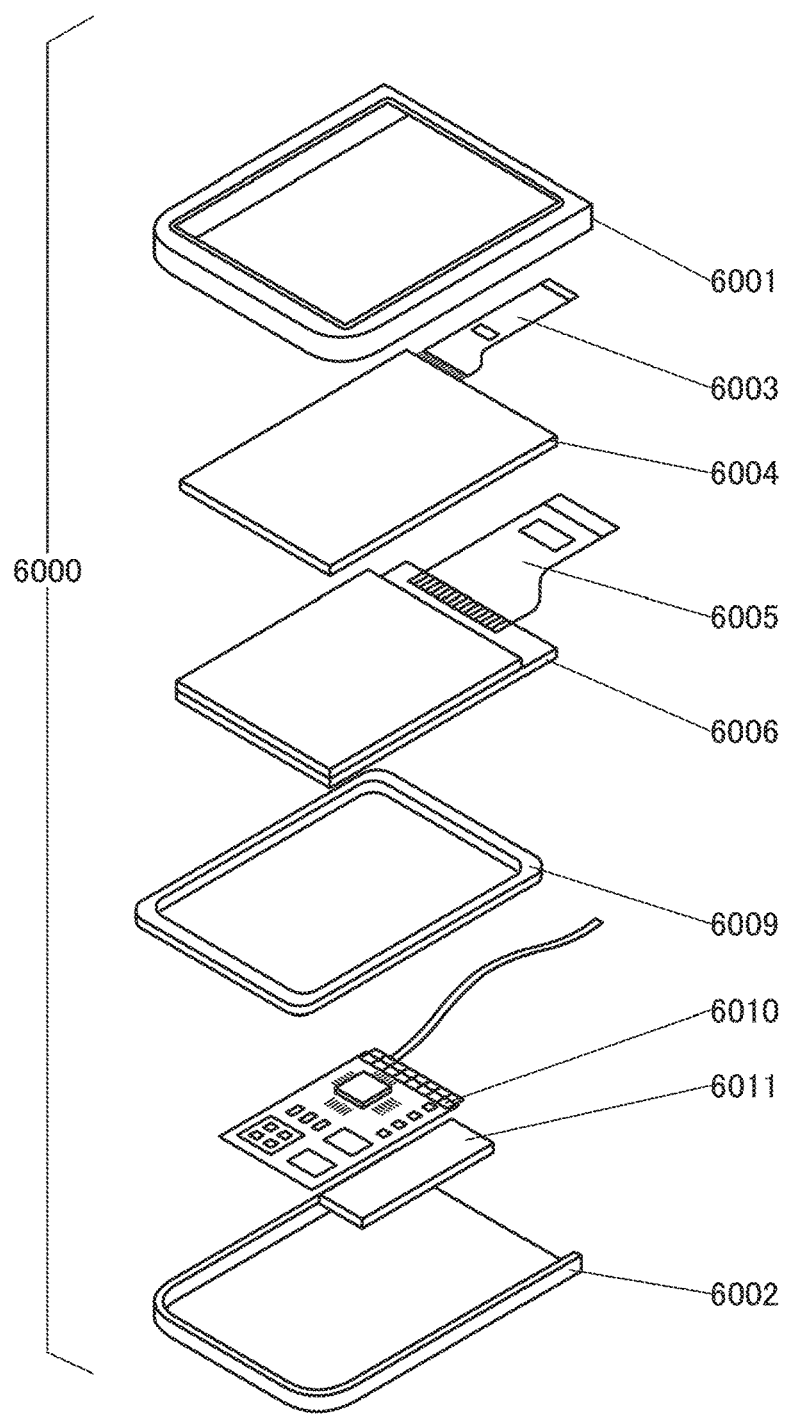
FIG. 36 illustrates a structural example of a display module of one embodiment.

In a display module 6000 in FIG. 36, a touch panel 6004 connected to an FPC 6003, a display panel 6006 connected to an FPC 6005, a frame 6009, a printed circuit board 6010, and a battery 6011 are provided between an upper cover 6001 and a lower cover 6002.

The display device manufactured using one embodiment of the present invention can be used for the display panel 6006, for example.

The shapes and sizes of the upper cover 6001 and the lower cover 6002 can be changed as appropriate in accordance with the sizes of the touch panel 6004 and the display panel 6006.

The touch panel 6004 can be a resistive touch panel or a capacitive touch panel and may be formed to overlap with the display panel 6006. Instead of providing the touch panel 6004, the display panel 6006 can have a touch panel function.

The frame 6009 protects the display panel 6006 and also serves as an electromagnetic shield for blocking electromagnetic waves generated by the operation of the printed circuit board 6010. The frame 6009 may serve as a radiator plate.

The printed circuit board 6010 has a power supply circuit and a signal processing circuit for outputting a video signal and a clock signal. As a power source for supplying power to the power supply circuit, an external commercial power source or the battery 6011 provided separately may be used. The battery 6011 can be omitted in the case of using a commercial power source.

The display module 6000 can be additionally provided with a member such as a polarizing plate, a retardation plate, or a prism sheet.

At least part of this embodiment can be implemented in combination with any of the other embodiments described in this specification as appropriate.

(Embodiment 4)

In this embodiment, electronic devices and a lighting device of one embodiment of the present invention will be described with reference to drawings.

Electronic devices and lighting devices can be manufactured by using the display device of one embodiment of the present invention. Highly reliable electronic devices and lighting devices with curved surfaces can be manufactured by using the display device of one embodiment of the present invention. In addition, flexible and highly reliable electronic devices and lighting devices can be manufactured by using the display device of one embodiment of the present invention.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device or the lighting device of one embodiment of the present invention can be incorporated along a curved inside/outside wall surface of a house or a building or a curved interior/exterior surface of a car.

The electronic device of one embodiment of the present invention may include a secondary battery. Preferably, the secondary battery is capable of being charged by contactless power transmission.

Examples of the secondary battery include a lithium ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic devices of one embodiment of the present invention are not limited thereto, and the electronic devices can have a variety of functions.

FIGS. 37A to 37E illustrate examples of an electronic device including a display portion 7000 with a curved surface. The display surface of the display portion 7000 is bent, and images can be displayed on the bent display surface. The display portion 7000 may have flexibility.

The display portion 7000 is formed using the display device or the like of one embodiment of the present invention. One embodiment of the present invention makes it possible to provide a highly reliable electronic device having a curved display portion.

Figure 37A:
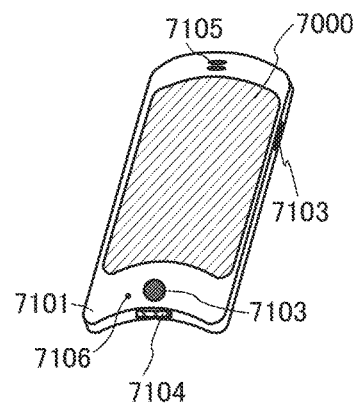
FIGS. 37A to 37F illustrate examples of electronic devices and a lighting device of one embodiment.
Figure 37B:
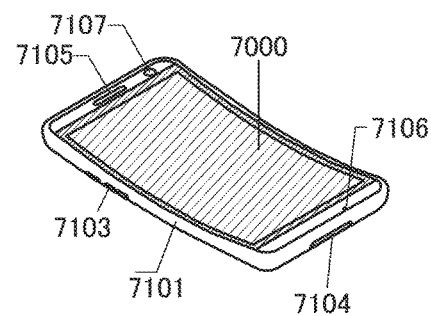

FIGS. 37A and 37B illustrate examples of mobile phones. A mobile phone 7100 illustrated in FIG. 37A and a mobile phone 7110 illustrated in FIG. 37B each include a housing 7101, the display portion 7000, operation buttons 7103, an external connection port 7104, a speaker 7105, a microphone 7106, and the like. The mobile phone 7110 illustrated in FIG. 37B also includes a camera 7107.

Each mobile phone includes a touch sensor in the display portion 7000. Operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

Figure 37C:
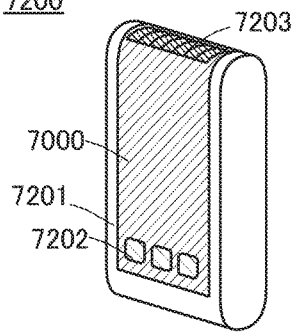
Figure 37D:
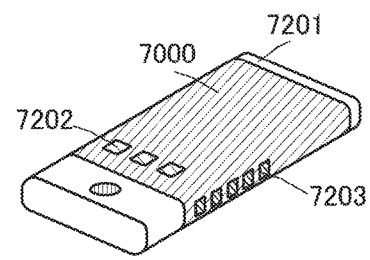

FIGS. 37C and 37D illustrate examples of portable information terminals. A portable information terminal 7200 illustrated in FIG. 37C and a portable information terminal 7210 illustrated in FIG. 37D each include a housing 7201 and the display portion 7000. Each of the portable information terminals may also include an operation button, an external connection port, a speaker, a microphone, an antenna, a camera, a battery, or the like. The display portion 7000 is provided with a touch sensor. An operation of the portable information terminal can be performed by touching the display portion 7000 with a finger, a stylus, or the like.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing, for example, a variety of applications such as mobile phone calls, e-mailing, reading and editing texts, music reproduction, Internet communication, and a computer game.

The portable information terminals 7200 and 7210 can display a letter, image information, and the like on its plurality of surfaces. For example, as illustrated in FIGS. 37C and 37D, three operation buttons 7202 can be displayed on one surface, and information 7203 indicated by a rectangle can be displayed on another surface. FIG. 37C illustrates an example in which information is displayed at the top surface of the portable information terminal. FIG. 37D illustrates an example in which information is displayed on the side surface of the portable information terminal. Information may be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7200 can see the display (here, the information 7203) on the portable information terminal 7200 put in a breast pocket of his/her clothes.

Specifically, a caller's phone number, name, or the like of an incoming call is displayed in a position that can be seen from above the portable information terminal 7200. Thus, the user can see the display without taking out the portable information terminal 7200 from the pocket and decide whether to answer the call.

Figure 37E:
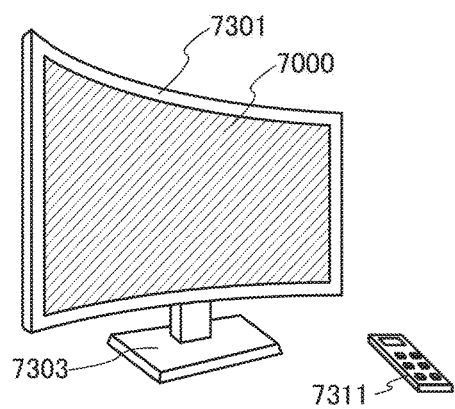

FIG. 37E illustrates an example of a television set. In a television set 7300, the display portion 7000 is incorporated into a housing 7301. Here, the housing 7301 is supported by a stand 7303.

The television set 7300 illustrated in FIG. 37E can be operated with an operation switch of the housing 7301 or a separate remote controller 7311. The display portion 7000 may include a touch sensor, and may be operated by touch on the display portion 7000 with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 37F:
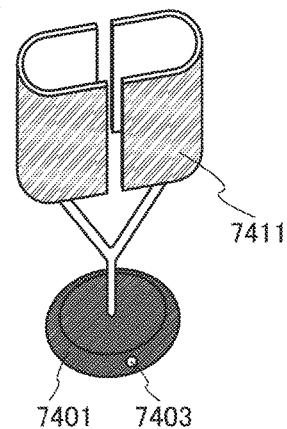

FIG. 37F illustrates an example of a lighting device having a curved light-emitting portion.

The light-emitting portion included in the lighting device illustrated in FIG. 37F is manufactured using the display device or the like of one embodiment of the present invention. According to one embodiment of the present invention, a highly reliable lighting device having a curved light-emitting portion can be provided.

A light-emitting portion 7411 included in a lighting device 7400 illustrated in FIG. 37F has two convex-curved light-emitting portions symmetrically placed. Thus, all directions can be illuminated with the lighting device 7400 as a center.

The light-emitting portion included in the lighting device 7400 may have flexibility. The light-emitting portion may be fixed on a plastic member, a movable frame, or the like so that a light-emitting surface of the light-emitting portion can be bent freely depending on the intended use.

The lighting device 7400 includes a stage 7401 provided with an operation switch 7403 and the light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 38A to 38I illustrate examples of portable information terminals each including a flexible and a bendable display portion 7001.

The display portion 7001 is manufactured using the display device or the like of one embodiment of the present invention. For example, a display device or the like that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

FIGS. 38A and 38B are perspective views illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501. The display portion 7001 can be pulled out by using the display portion tab 7502.

The portable information terminal 7500 can receive a video signal with a control portion incorporated therein and can display the received image on the display portion 7001. The portable information terminal 7500 incorporates a battery. A terminal portion for connecting a connector may be included in the housing 7501 so that a video signal and power can be directly supplied from the outside with a wiring.

By pressing the operation buttons 7503, power ON/OFF, switching of displayed images, and the like can be performed. Although FIGS. 38A and 38B show an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 38B illustrates the portable information terminal 7500 in a state where the display portion 7001 is pulled out. Images can be displayed on the display portion 7001 in this state. In addition, the portable information terminal 7500 may perform different displays in the state where part of the display portion 7001 is rolled as shown in FIG. 38A and in the state where the display portion 7001 is pulled out as shown in FIG. 38B. For example, in the state shown in FIG. 38A, the rolled portion of the display portion 7001 is put in a non-display state, reducing the power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 38C to 38E illustrate an example of a foldable portable information terminal. FIG. 38C illustrates a portable information terminal 7600 that is opened. FIG. 38D illustrates the portable information terminal 7600 that is being opened or being folded. FIG. 38E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 38F and 38G illustrate an example of a foldable portable information terminal. FIG. 38F illustrates a portable information terminal 7650 that is folded so that the display portion 7001 is on the inside. FIG. 38G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated and damaged.

FIG. 38H illustrates an example of a flexible portable information terminal. A portable information terminal 7700 includes a housing 7701 and the display portion 7001. The portable information terminal 7700 may further include buttons 7703a and 7703b which serve as input means, speakers 7704a and 7704b which serve as sound output means, an external connection port 7705, a microphone 7706, or the like. A flexible battery 7709 can be included in the portable information terminal 7700. The battery 7709 may be arranged to overlap with the display portion 7001, for example.

The housing 7701, the display portion 7001, and the battery 7709 have flexibility. Thus, it is easy to curve the portable information terminal 7700 into a desired shape and to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or unintended external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

FIG. 38I illustrates an example of a wrist-watch-type portable information terminal. A portable information terminal 7800 includes a band 7801, the display portion 7001, an input/output terminal 7802, operation buttons 7803, and the like. The band 7801 has a function as a housing. A flexible battery 7805 can be included in the portable information terminal 7800. The battery 7805 may be arranged to overlap with the display portion 7001, the band 7801, or the like, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal described as an example in this embodiment can be performed by contactless power transmission without using the input/output terminal.

Figure 39A:
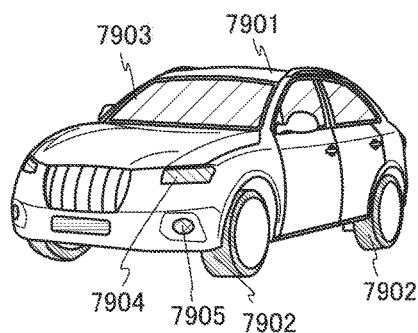
FIGS. 39A to 39F illustrate examples of electronic devices of one embodiment.
Figure 39B:
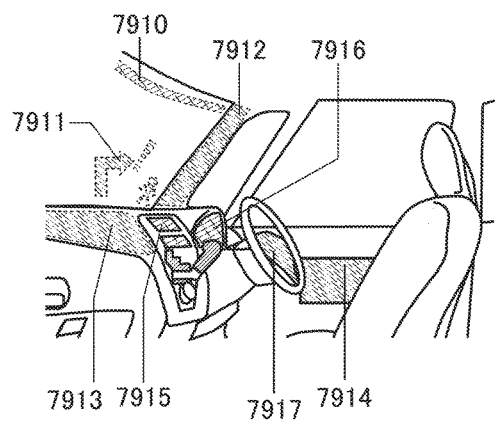

FIG. 39A is an external view of an automobile 7900. FIG. 39B illustrates a driver's seat of the automobile 7900. The automobile 7900 includes a car body 7901, wheels 7902, a windshield 7903, lights 7904, fog lamps 7905, and the like.

The display device of one embodiment of the present invention can be used in a display portion of the automobile 7900. For example, the display device of one embodiment of the present invention can be used in display portions 7910 to 7917 illustrated in FIG. 39B.

The display portion 7910 and the display portion 7911 are provided in the automobile windshield. The display device of one embodiment of the present invention can be a see-through device, through which the opposite side can be seen, by using a light-transmitting conductive material for its electrodes. Such a see-through display device does not hinder driver's vision during the driving of the automobile 7900. Therefore, the display device of one embodiment of the present invention can be provided in the windshield of the automobile 7900. Note that in the case where a transistor or the like is provided in the display device, a transistor having light-transmitting properties, such as an organic transistor using an organic semiconductor material or a transistor using an oxide semiconductor, is preferably used.

The display portion 7912 is provided on a pillar portion. The display portion 7913 is provided on a dashboard portion. For example, the display portion 7912 can compensate for the view hindered by the pillar by showing an image taken by an imaging unit provided on the car body. Similarly, the display portion 7913 can compensate for the view hindered by the dashboard and the display portion 7914 can compensate for the view hindered by the door. That is, showing an image taken by an imaging unit provided on the outside of the automobile leads to elimination of blind areas and enhancement of safety. In addition, showing an image so as to compensate for the area which a driver cannot see makes it possible for the driver to confirm safety easily and comfortably.

The display portion 7917 is provided in a steering wheel. The display portion 7915, the display portion 7916, or the display portion 7917 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 7910 to 7914.

The display portions 7910 to 7917 can also be used as lighting devices.

A display portion included in the display device of one embodiment of the present invention may have a flat surface. In that case, the display device of one embodiment of the present invention does not necessarily have a curved surface and flexibility.

Figure 39C:
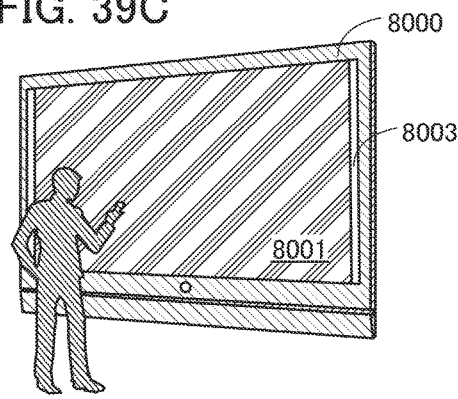
Figure 39D:
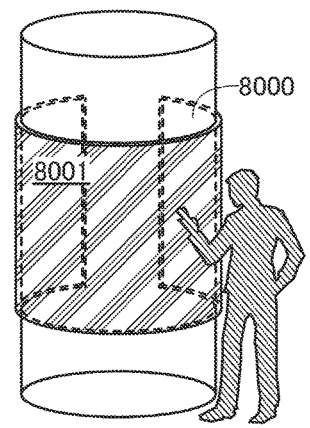

FIGS. 39C and 39D illustrate examples of digital signages. The digital signages each include a housing 8000, a display portion 8001, a speaker 8003, and the like. Also, the digital signages can each include an LED lamp, operation keys (including a power switch or an operation switch), a connection terminal, a variety of sensors, a microphone, and the like.

FIG. 39D illustrates a digital signage mounted on a cylindrical pillar.

A larger display portion 8001 can provide more information at a time. In addition, the larger display portion 8001 attracts more attention, so that the effectiveness of the advertisement is expected to be increased, for example.

It is preferable to use a touch panel in the display portion 8001 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Figure 39E:
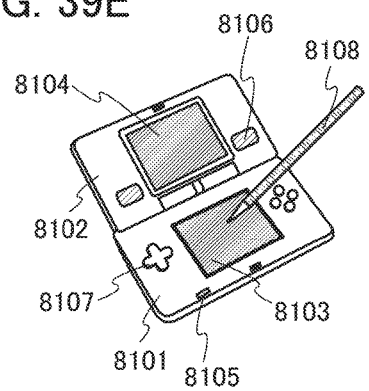

FIG. 39E illustrates a portable game console including a housing 8101, a housing 8102, a display portion 8103, a display portion 8104, a microphone 8105, a speaker 8106, an operation key 8107, a stylus 8108, and the like.

The portable game console illustrated in FIG. 39E includes two display portions 8103 and 8104. Note that the number of display portions of an electronic device of one embodiment of the present invention is not limited to two and can be one or three or more as long as at least one display portion includes the display device of one embodiment of the present invention.

Figure 39F:
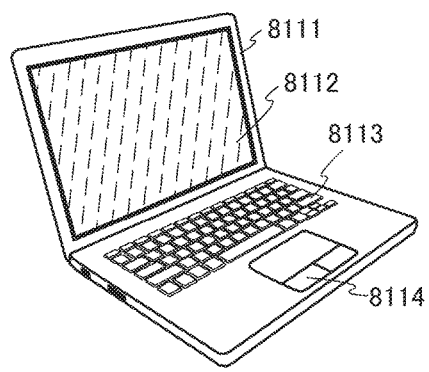

FIG. 39F illustrates a laptop personal computer, which includes a housing 8111, a display portion 8112, a keyboard 8113, a pointing device 8114, and the like.

The display device of one embodiment of the present invention can be used in the display portion 8112.

At least part of this embodiment can be implemented in combination with any of the other embodiments described in this specification as appropriate.

This application is based on Japanese Patent Application Serial No. 2016-111555 filed with Japan Patent Office on Jun. 3, 2016 and Japanese Patent Application Serial No. 2016-193718 filed with Japan Patent Office on Sep. 30, 2016, the entire contents of which are hereby incorporated by reference.

What is claimed is:

1. A display device comprising:
an insulating layer;
a first electrode over the insulating layer;
a liquid crystal layer over the first electrode, the liquid crystal layer comprising a first portion and a second portion;
a light-blocking layer over the liquid crystal layer;
a structure body in contact with the second portion; and
a first alignment film and a second alignment film which are in contact with the second portion,
wherein the first electrode is configured to reflect visible light and block ultraviolet light,
wherein the first portion overlaps with the first electrode,
wherein the second portion, the light-blocking layer, and the structure body overlap with each other,
wherein the first portion comprises a monomer and a liquid crystal,
wherein the second portion comprises a polymer, and
wherein the first portion and the second portion are horizontally adjacent to each other.

2. The display device according to claim 1, wherein the second portion is surrounded by part of the first portion.

3. The display device according to claim 1, wherein the polymer is obtained by polymerization of the monomer.

4. The display device according to claim 1,
wherein the structure body is in contact with at least one of the first alignment film and the second alignment film.

5. A display device comprising:
an insulating layer comprising a depression portion;
a first electrode and a second electrode over the insulating layer;
a liquid crystal layer over the first electrode and the second electrode, the liquid crystal layer comprising a first portion and a second portion;
a light-blocking layer over the liquid crystal layer;
a structure body in contact with the second portion; and
a first alignment film and a second alignment film which are in contact with the second portion,
wherein each of the first electrode and the second electrode is configured to reflect visible light and block ultraviolet light,
wherein the first portion overlaps with the first electrode,
wherein the second portion, the light-blocking layer, the depression portion, and the structure body overlap with each other,
wherein the first portion comprises a monomer and a liquid crystal,
wherein the second portion comprises a polymer,
wherein the first electrode and the second electrode do not overlap with the depression portion, and
wherein the first portion and the second portion are horizontally adjacent to each other.

6. The display device according to claim 5, wherein the second portion is surrounded by part of the first portion.

7. The display device according to claim 5, wherein the polymer is obtained by polymerization of the monomer.

8. The display device according to claim 5,
wherein the structure body is in contact with at least one of the first alignment film and the second alignment film.

9. A display device comprising:
an insulating layer over a first substrate, the insulating layer comprising a depression portion;
a first electrode and a second electrode over the insulating layer;
a liquid crystal layer over the first electrode and the second electrode, the liquid crystal layer comprising a first portion and a second portion;
a third electrode over the liquid crystal layer;
a light-blocking layer over the third electrode;
a second substrate over the light-blocking layer; and
a structure body in contact with the second portion; and
a first alignment film and a second alignment film which are in contact with the second portion,
wherein each of the first electrode and the second electrode is configured to reflect visible light and block ultraviolet light,
wherein the first portion overlaps with the first electrode,
wherein the second portion, the light-blocking layer, the depression portion, and the structure body overlap with each other,
wherein the first portion comprises a monomer and a liquid crystal,
wherein the second portion comprises a polymer,
wherein the first electrode and the second electrode do not overlap with the depression portion,
wherein each of the first substrate and the second substrate has flexibility, and
wherein the first portion and the second portion are horizontally adjacent to each other.

10. The display device according to claim 9, wherein the second portion is surrounded by part of the first portion.

11. The display device according to claim 9, wherein the polymer is obtained by polymerization of the monomer.

12. The display device according to claim 9,
wherein the structure body is in contact with at least one of the first alignment film and the second alignment film.

13. The display device according to claim 9, further comprising:
a light-emitting element comprising a fourth electrode transmitting visible light, a layer containing a light-emitting substance, and a fifth electrode,
wherein the insulating layer is positioned between the light-emitting element and the liquid crystal layer, and
wherein the light-emitting element is configured to emit light to the insulating layer side.

14. The display device according to claim 9, further comprising:
a light-emitting element comprising a fourth electrode transmitting visible light, a layer containing a light-emitting substance, and a fifth electrode;
a first transistor electrically connected to the first electrode; and
a second transistor electrically connected to the fourth electrode.

* * * * *